(12) United States Patent
Mikami et al.

(10) Patent No.: US 11,870,042 B2
(45) Date of Patent: Jan. 9, 2024

(54) POWER STORAGE SYSTEM, VEHICLE, ELECTRONIC DEVICE, AND SEMICONDUCTOR DEVICE

(71) Applicant: SEMICONDUCTOR ENERGY LABORATORY CO., LTD., Atsugi (JP)

(72) Inventors: Mayumi Mikami, Kanagawa (JP); Ryota Tajima, Kanagawa (JP); Hideaki Shishido, Kanagawa (JP); Kensuke Yoshizumi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 432 days.

(21) Appl. No.: 16/641,336

(22) PCT Filed: Aug. 28, 2018

(86) PCT No.: PCT/IB2018/056536
§ 371 (c)(1),
(2) Date: Feb. 24, 2020

(87) PCT Pub. No.: WO2019/048985
PCT Pub. Date: Mar. 14, 2019

(65) Prior Publication Data
US 2020/0388888 A1 Dec. 10, 2020

(30) Foreign Application Priority Data
Sep. 6, 2017 (JP) .................................. 2017-170846

(51) Int. Cl.
*H01M 10/42* (2006.01)
*B60L 50/60* (2019.01)
(Continued)

(52) U.S. Cl.
CPC ......... *H01M 10/4257* (2013.01); *B60L 50/60* (2019.02); *G06N 3/04* (2013.01);
(Continued)

(58) Field of Classification Search
CPC ........... H01M 10/4257; H01M 10/486; H01M 2010/4271; H01M 2220/20; B60L 50/60; G06N 3/04
See application file for complete search history.

(56) References Cited

U.S. PATENT DOCUMENTS

| 7,528,529 B2 | 5/2009 | Yamaguchi et al. |
| 7,583,059 B2 | 9/2009 | Cho |

(Continued)

FOREIGN PATENT DOCUMENTS

| CA | 2550072 | 6/2005 |
| CN | 001890574 A | 1/2007 |

(Continued)

OTHER PUBLICATIONS

Yang, K. et al 2013, 'Applying Artificial Neural Network to Predict Semiconductor Machine Outliers', Mathematical Problem in Engineering, vol. 203, pp. 1-10. (Year: 2013).*

(Continued)

*Primary Examiner* — Feifei Yeung Lopez
(74) *Attorney, Agent, or Firm* — NIXON PEABODY LLP; Jeffrey L. Costellia

(57) ABSTRACT

A sensor element with excellent characteristics is provided. An electronic device including a power storage system with excellent characteristics is provided. A vehicle including a power storage system with excellent characteristics is provided. A novel semiconductor device is provided. The power storage system includes a storage battery, a neural network, and a sensor element; the neural network includes an input layer, an output layer, and one or a plurality of middle layers (Continued)

provided between the input layer and the output layer; a value corresponding to a first signal output from the sensor element is supplied to the input layer; the first signal is an analog signal; the sensor element includes a region in contact with a surface of the storage battery; and the sensor element has a function of measuring one or both of strain and temperature.

19 Claims, 36 Drawing Sheets

(51) Int. Cl.
*G06N 3/04* (2023.01)
*H01M 10/48* (2006.01)
*H01L 27/12* (2006.01)
*H01L 29/24* (2006.01)
*H01L 29/786* (2006.01)
*H10B 99/00* (2023.01)

(52) U.S. Cl.
CPC ......... *H01M 10/48* (2013.01); *H01M 10/486* (2013.01); *H01L 27/1207* (2013.01); *H01L 27/1225* (2013.01); *H01L 27/1255* (2013.01); *H01L 29/24* (2013.01); *H01L 29/7869* (2013.01); *H01L 29/78648* (2013.01); *H01M 2010/4271* (2013.01); *H01M 2220/20* (2013.01); *H10B 99/00* (2023.02)

(56) References Cited

U.S. PATENT DOCUMENTS

| | | | |
|---|---|---|---|
| 8,619,003 | B2 | 12/2013 | Dairiki et al. |
| 8,822,251 | B2 | 9/2014 | Yamaguchi et al. |
| 8,902,123 | B2 | 12/2014 | Dairiki et al. |
| 9,054,227 | B2 | 6/2015 | Yamaguchi et al. |
| 9,093,844 | B2 | 7/2015 | Yonezawa et al. |
| 9,597,933 | B2 | 3/2017 | Yamaguchi et al. |
| 9,793,581 | B2 | 10/2017 | Henrici et al. |
| 10,035,388 | B2 | 7/2018 | Yamaguchi et al. |
| 10,141,069 | B2 | 11/2018 | Ikeda et al. |
| 10,679,017 | B2 | 6/2020 | Yokoi et al. |
| 2005/0194936 | A1 | 9/2005 | Cho |
| 2008/0234956 | A1 | 9/2008 | Mizuno et al. |
| 2013/0119939 | A1 | 5/2013 | Yonezawa et al. |
| 2016/0076912 | A1* | 3/2016 | Pólik ................. G01D 5/20 706/26 |
| 2016/0137091 | A1* | 5/2016 | Yamazoe ............ H02J 7/0048 320/136 |
| 2016/0328642 | A1* | 11/2016 | Himebaugh ......... G06N 3/0635 |
| 2016/0343452 | A1* | 11/2016 | Ikeda ................ G11C 27/024 |
| 2017/0351561 | A1* | 12/2017 | Yamazoe ............... H04Q 9/00 |
| 2019/0140457 | A1* | 5/2019 | Dong ............... H01M 10/486 |
| 2019/0164620 | A1 | 5/2019 | Ikeda et al. |
| 2020/0011983 | A1* | 1/2020 | Kageme ............. G01S 13/325 |
| 2020/0153264 | A1* | 5/2020 | Osada ................... B60L 50/64 |

FOREIGN PATENT DOCUMENTS

| | | |
|---|---|---|
| EP | 1988575 A | 11/2008 |
| JP | 2000-340264 A | 12/2000 |
| JP | 2007-142372 A | 6/2007 |
| JP | 2007-518973 | 7/2007 |
| JP | 2008-232758 A | 10/2008 |
| JP | 2008-237518 A | 10/2008 |
| JP | 2008-270787 A | 11/2008 |
| JP | 2010-086911 A | 4/2010 |
| JP | 2013-106476 A | 5/2013 |
| JP | 2013-122907 A | 6/2013 |
| JP | 2015-521347 | 7/2015 |
| JP | 2016-219011 A | 12/2016 |
| JP | 2017-055338 A | 3/2017 |
| JP | 2017-130195 A | 7/2017 |
| JP | 2017-150926 A | 8/2017 |
| KR | 2005-0061386 A | 6/2005 |
| WO | WO-2005/059579 | 6/2005 |
| WO | WO-2016/170444 | 10/2016 |
| WO | WO 2017/145949 | 8/2017 |

OTHER PUBLICATIONS

International Search Report (Application No. PCT/IB2018/056536) dated Dec. 4, 2018.

Written Opinion (Application No. PCT/IB2018/056536) dated Dec. 4, 2018.

* cited by examiner

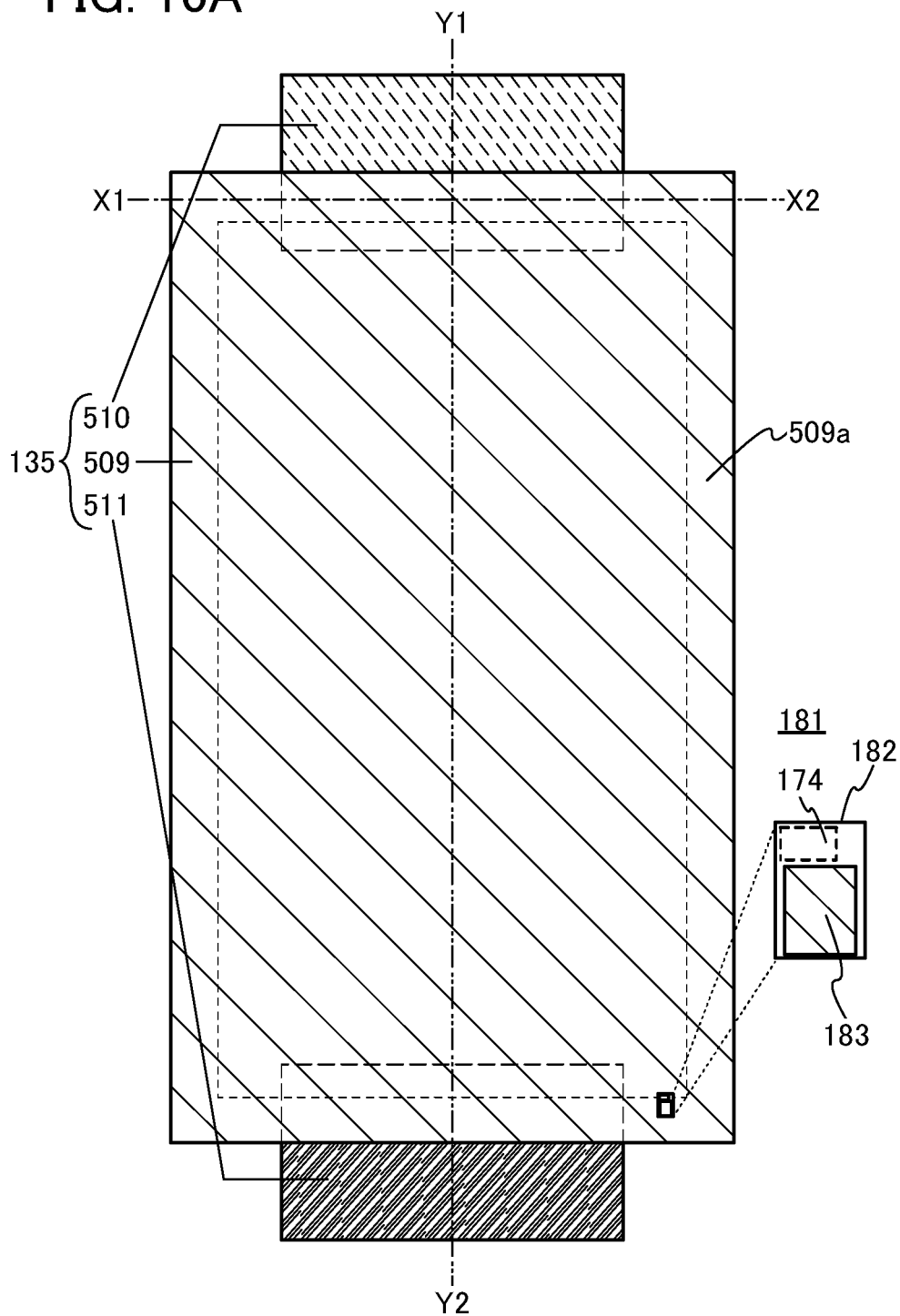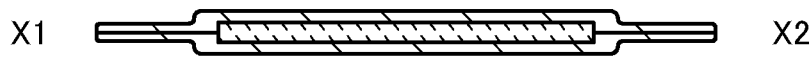

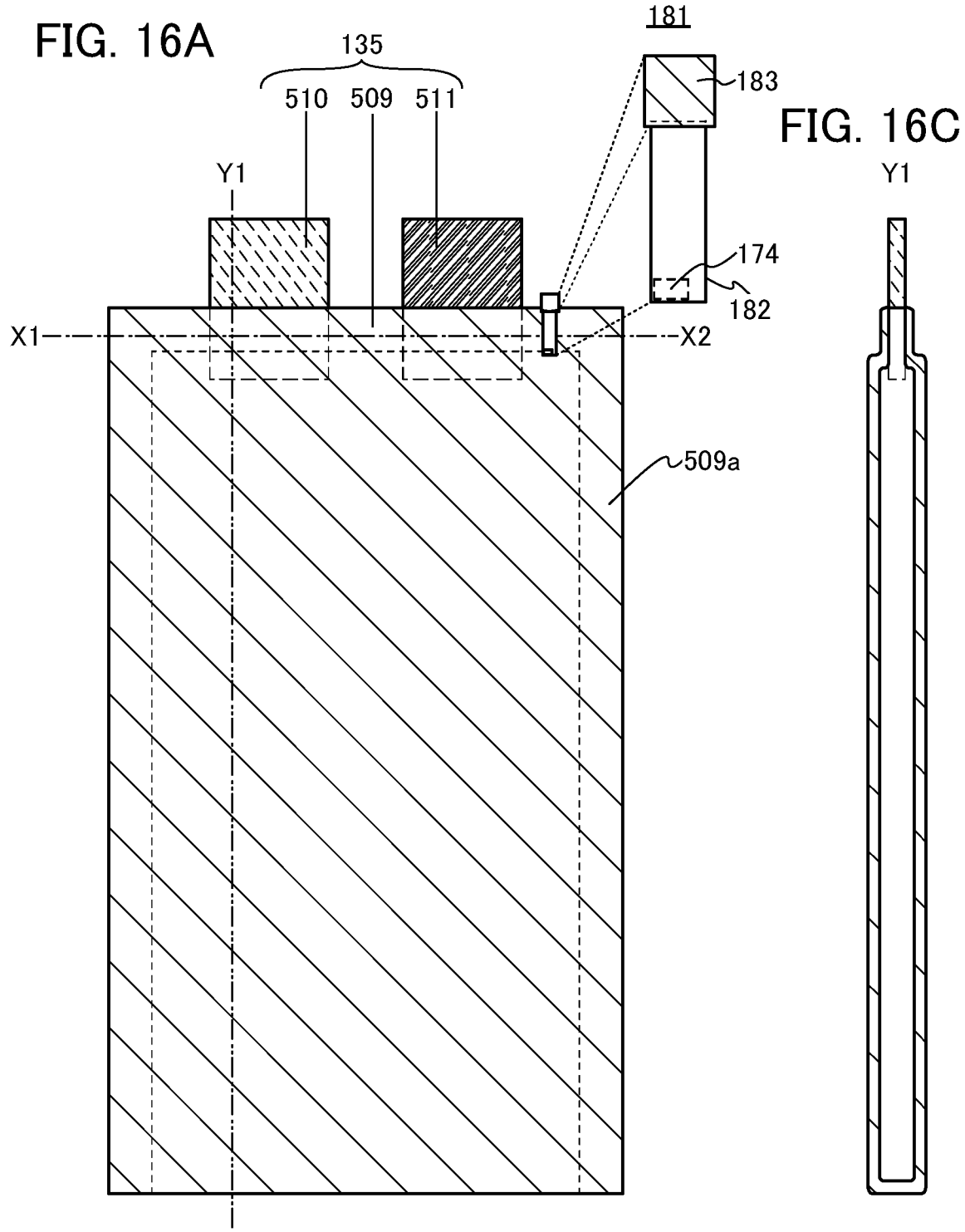
FIG. 16A
FIG. 16C
FIG. 16B $a = x_1 w_1 + x_2 w_2 + b$

POWER STORAGE SYSTEM, VEHICLE, ELECTRONIC DEVICE, AND SEMICONDUCTOR DEVICE

TECHNICAL FIELD

One embodiment of the present invention relates to a storage battery and a power storage system using the storage battery. One embodiment of the present invention relates to a vehicle using a storage battery. One embodiment of the present invention relates to an electronic device using a storage battery.

One embodiment of the present invention relates to a semiconductor device.

One embodiment of the present invention relates to a neural network and a power storage system using the neural network. One embodiment of the present invention relates to a vehicle using a neural network. One embodiment of the present invention relates to an electronic device using a neural network.

In this specification and the like, a semiconductor device generally means a device that can function by utilizing semiconductor characteristics. A display device, a light-emitting device, a memory device, an electro-optical device, a power storage device, a semiconductor circuit, and an electronic device include a semiconductor device in some cases.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Background Art

A sensor using a MEMS (micro electro mechanical system) technology is used for an electronic component, a sensor, an actuator, and the like. Patent Document 1 and Patent Document 2 each disclose an example of a MEMS sensor that senses strain.

In recent years, transistors using oxide semiconductors or metal oxides in their channel formation regions (Oxide Semiconductor transistors, hereinafter, referred to as OS transistors) have attracted attention. The off-state current of an OS transistor is extremely low. Applications that employ OS transistors to utilize their extremely low off-state currents have been proposed. For example, Patent Document 3 discloses an example in which an OS transistor is used for learning in a neural network.

REFERENCES

Patent Documents

[Patent Document 1] Japanese Published Patent Application No. 2007-142372
[Patent Document 2] Japanese Published Patent Application No. 2008-270787
[Patent Document 3] Japanese Published Patent Application No. 2016-219011

SUMMARY OF THE INVENTION

Problems to be Solved by the Invention

An object of one embodiment of the present invention is to provide a sensor element with excellent characteristics. Another object of one embodiment of the present invention is to improve the characteristics of a system including a sensor element.

Another object of one embodiment of the present invention is to provide a power storage system with excellent characteristics. Another object of one embodiment of the present invention is to provide a highly safe power storage system. Another object of one embodiment of the present invention is to provide a power storage system with little degradation.

Another object of one embodiment of the present invention is to provide an electronic device including a power storage system with excellent characteristics. Another object of one embodiment of the present invention is to provide a vehicle including a power storage system with excellent characteristics. Another object of one embodiment of the present invention is to provide a novel semiconductor device. Another object of one embodiment of the present invention is to provide a novel system.

Note that the description of a plurality of objects does not preclude the existence of each object. One embodiment of the present invention does not necessarily achieve all the objects. Objects other than those listed above will be apparent from the description of the specification, the drawings, the claims, and the like, and such objects could be objects of one embodiment of the present invention.

Means for Solving the Problems

One embodiment of the present invention is a power storage system including a storage battery, a neural network, and a sensor element, the neural network includes an input layer, an output layer, and one or a plurality of middle layers provided between the input layer and the output layer, a value corresponding to a first signal output from the sensor element is supplied to the input layer, the first signal is an analog signal, the sensor element includes a region in contact with a surface of the storage battery, and the sensor element has a function of measuring one or both of strain and temperature.

Another embodiment of the present invention is a power storage system including a storage battery, a neural network, a first circuit, and a sensor element, the neural network includes an input layer, an output layer, and one or a plurality of middle layers provided between the input layer and the output layer, a first signal output from the sensor element is supplied to the first circuit, the first signal is an analog signal, the first circuit has a function of converting the first signal into a digital signal and supplying the converted digital signal to the input layer, the sensor element includes a region in contact with a surface of the storage battery, and the sensor element has a function of measuring one or both of strain and temperature.

Another embodiment of the present invention is a power storage system including a storage battery, a neural network, a first circuit, a second circuit, and a sensor element, the neural network includes an input layer, an output layer, and one or a plurality of middle layers provided between the input layer and the output layer, a first signal output from the sensor element is supplied to the first circuit, the first signal is an analog signal, the first circuit has a function of converting the first signal into a second signal that is a digital signal, the first circuit has a function of modulating the second signal and supplying the modulated signal to the second circuit through wireless communication, the second circuit has a function of demodulating the signal supplied from the first circuit through wireless communication and supplying the signal to the input layer, the sensor element includes a region in contact with a surface of the storage battery, and the sensor element has a function of measuring one or both of strain and temperature.

In the above structure, the sensor element preferably starts sensing in response to the charging voltage of the storage battery.

In the above structure, the sensor element preferably starts sensing in response to the analysis results of a change in the current value of the storage battery over time by the neural network.

In the above structure, it is preferable that the neural network include a first transistor, a capacitor, and a second transistor; one of a source and a drain of the first transistor be electrically connected to one electrode of the capacitor and a gate of the second transistor; a channel formation region of the first transistor include a metal oxide; the metal oxide contain indium and an element M; the element M is one or more elements selected from aluminum, gallium, tin, boron, silicon, titanium, iron, nickel, germanium, yttrium, zirconium, molybdenum, lanthanum, cerium, neodymium, hafnium, tantalum, and tungsten; and a potential corresponding to an analog signal be held in the one of the source and the drain of the first transistor.

Another embodiment of the present invention is a vehicle including the power storage system described in any of the above structures.

Another embodiment of the present invention is an electronic device including the power storage system described in any of the above structures.

Another embodiment of the present invention is a semiconductor device including a neural network, a first circuit, and a second circuit, the neural network includes an input layer, an output layer, and one or a plurality of middle layers provided between the input layer and the output layer, a measurement value of one or both of strain and temperature is supplied to the first circuit as a first signal, the first signal is an analog signal, the first circuit has a function of converting the first signal into a second signal that is a digital signal, the first circuit has a function of modulating the second signal and supplying the modulated signal to the second circuit through wireless communication, and the second circuit has a function of demodulating the signal supplied from the first circuit through wireless communication and supplying the signal to the input layer.

Effect of the Invention

According to one embodiment of the present invention, a sensor element with excellent characteristics can be provided. According to another embodiment of the present invention, the characteristics of a system including a sensor element can be improved.

According to another embodiment of the present invention, a power storage system with excellent characteristics can be provided. According to another embodiment of the present invention, a highly safe power storage system can be provided. According to another embodiment of the present invention, a power storage system with little degradation can be provided.

According to another embodiment of the present invention, an electronic device including a power storage system with excellent characteristics can be provided. According to another embodiment of the present invention, a vehicle including a power storage system with excellent characteristics can be provided. According to another embodiment of the present invention, a novel semiconductor device can be provided. According to another embodiment of the present invention, a novel system can be provided.

Note that the description of these effects does not preclude the existence of other effects. One embodiment of the present invention does not necessarily achieve all the effects. Other effects will be apparent from the description of the specification, the drawings, the claims, and the like and other effects can be derived from the description of the specification, the drawings, the claims, and the like.

BRIEF DESCRIPTION OF THE DRAWINGS

FIG. 10 A top view of a storage battery and a sensor chip and cross-sectional views of a storage battery.
FIG. 16 A top view of a storage battery and a sensor chip and cross-sectional views of a storage battery.

MODE FOR CARRYING OUT THE INVENTION

Figure 1A:
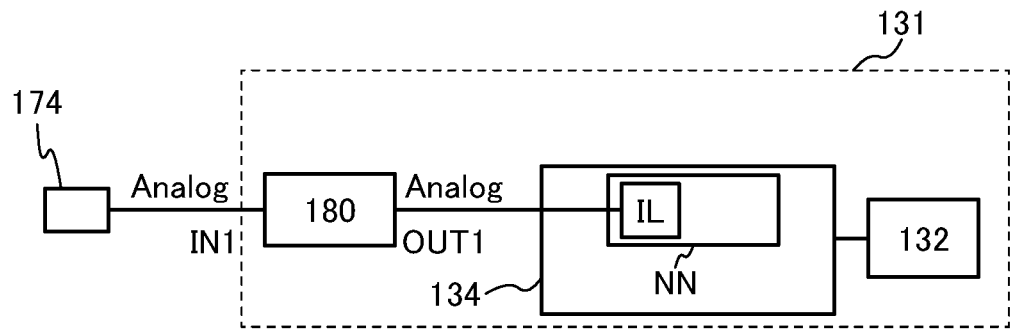
FIG. 1 Examples of a system including a sensor element.

Hereinafter, embodiments will be described with reference to the drawings. Note that the embodiments can be implemented with many different modes, and it will be readily appreciated by those skilled in the art that modes and the details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes or values shown in the drawings.

In this specification, the embodiments described below can be combined as appropriate. In addition, in the case where a plurality of structure examples are described in one embodiment, the structure examples can be combined with each other as appropriate.

In this specification, a neural network refers to a general model that is modeled on a biological neural network, determines the connection strength of neurons by learning, and has the capability of solving problems. A neural network includes an input layer, a middle layer (also referred to as a hidden layer), and an output layer.

In the description of a neural network in this specification, to determine a connection strength of neurons (also referred to as a weight coefficient) from the existing information is sometimes referred to as "learning".

Moreover, in this specification, to draw a new conclusion from a neural network formed using the connection strength obtained by learning is sometimes referred to as "inference".

In this specification and the like, a transistor including an oxide semiconductor or a metal oxide in its channel formation region is referred to as an Oxide Semiconductor transistor or an OS transistor.

Embodiment 1

In this embodiment, a system including a sensor is described as one embodiment of the present invention. As a more specific example, a power storage system including a sensor and a storage battery is described.

<System Including Sensor>

Figure 1B:
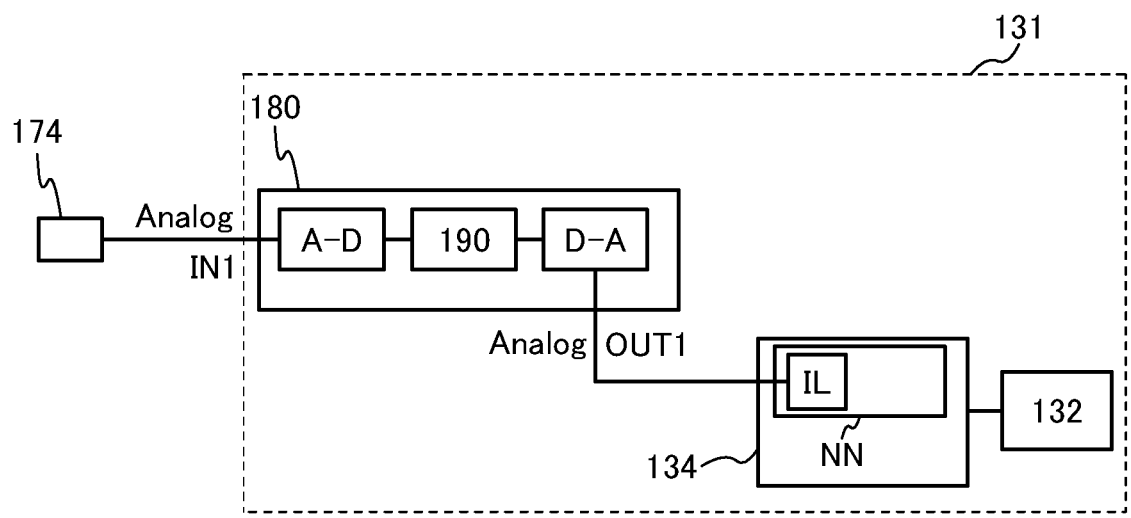
Figure 1C:
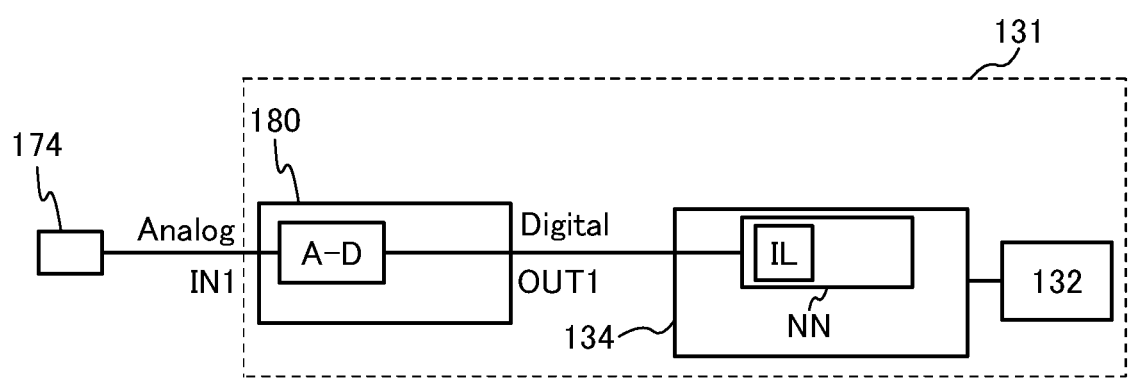

FIG. 1(A), FIG. 1(B), and FIG. 1(C) each show an example of a system including a sensor element 174 and a control system 131 to which output from the sensor element 174 is supplied.

The sensor element 174 preferably includes one or more of a pressure sensor, a temperature sensor, an acceleration sensor, and a strain sensor.

As the strain sensor, for example, a strain gage that includes a wiring pattern formed over a thin insulator and detects a resistance change due to strain can be used. With the use of a Wheatstone bridge, a resistance change due to strain can be converted into a voltage change.

As the pressure sensor, for example, a piezoelectric element can be used. Examples of the piezoelectric element include a capacitive displacement pressure sensor provided with a parallel-plate capacitor and a strain gage pressure sensor that detects a resistance change due to strain.

An example of the strain gage pressure sensor is a sensor in which a p-type silicon crystal is doped with an n-type impurity by thermal diffusion and a compensated intrinsic semiconductor region with high resistance is used as a strain gage. Alternatively, a piezoelectric element formed of a polymer film may be used.

As the acceleration sensor, for example, a capacitance detecting acceleration sensor that detects a change in capacitance between a movable portion and a fixed portion or a piezo resistance acceleration sensor that detects strain in a region that connects a movable portion to a fixed portion can be used. In addition, a heat sensing acceleration sensor can be used as the acceleration sensor.

As the acceleration sensor, a gyroscope sensor can be used. Examples of a vibration gyroscope sensor include a capacitive gyroscope sensor and a piezo resistance gyroscope sensor.

As the temperature sensor, for example, a thermistor (a resistor whose resistance value changes with temperature) and a sensor including a bimetallic strip can be used.

In addition, for example, a semiconductor temperature sensor in the form of an IC can be used as the temperature sensor. For example, a temperature sensor that utilizes the temperature characteristics of base-emitter voltage of an NPN transistor or the like can be used.

Alternatively, the temperature sensor may include two or more kinds of semiconductor elements with different temperature characteristics. A semiconductor element including an oxide semiconductor and a semiconductor element including a silicon semiconductor may be provided in the temperature sensor. The temperature dependence of a semiconductor element including an oxide semiconductor is smaller than that of a conventional semiconductor element including silicon, germanium, or a compound thereof. With the use of a semiconductor element including an oxide semiconductor, the temperature sensor or the like can have excellent characteristics.

A MEMS sensor may be used as a sensor element provided in a semiconductor device of one embodiment of the present invention. For example, a MEMS technology can be used for fabrication of a movable portion of a strain sensor. A MEMS technology can also be used for fabrication of a piezoelectric element of a pressure sensor. A vibration gyroscope sensor using a MEMS technology can be used as the acceleration sensor. A fine structure body can be formed using a MEMS technology, which enables fabrication of a low-power small-sized sensor. For example, a low-power small-sized gas sensor can be fabricated.

An example of a movable portion of a strain sensor using a MEMS technology is described. The strain sensor using a MEMS technology is, for example, a sensor that includes a first layer including a transistor over a first film, a functional layer provided over the first layer, a second film over the functional layer, and a space between the first layer and the functional layer. The functional layer includes, for example, a strain resistor, a piezoelectric element, or an oscillator.

The control system 131 includes a circuit 180, a control circuit 134, and a memory 132. The control circuit 134 includes a neural network NN. The neural network NN includes an input layer, an output layer, and one or a plurality of middle layers provided between the input layer and the output layer.

For example, the input/output characteristics of the sensor element 174 may be supplied as learning data to the neural network NN. The input/output characteristics of the sensor element 174 sometimes change with an environment such as temperature, for example. Correction of a value output from the sensor element 174 with the use of the neural network NN sometimes allows more accurate sensing to be performed.

The circuit 180 processes a signal IN1 supplied from the sensor element 174, and then, outputs the processed signal as a signal OUT1 to the control circuit 134, for example.

The memory 132 preferably includes a volatile memory and a nonvolatile memory, for example. As the volatile memory, a DRAM, an SRAM, or the like can be used.

The memory 132 functions as an external memory of a CPU included in the control circuit 134, for example.

A memory including an OS transistor described later can be used as the memory 132. The use of a memory including an OS transistor can sometimes reduce the power consumption of the control system of one embodiment of the present invention.

In FIG. 1(A), FIG. 1(B), and FIG. 1(C), the signal OUT1 is supplied to an input layer IL of the neural network NN. The neural network of one embodiment of the present invention preferably has a function of performing an analog operation. For example, it is preferable that the neural network NN include a product-sum operation circuit and the product-sum operation circuit have a function of performing an analog operation. In the case where the neural network NN has a function of performing an analog operation, the area of a circuit included in the neural network NN can be reduced in some cases.

FIG. 1(A) shows an example in which a signal output from the sensor element 174 is an analog signal and the signal IN1 and the signal OUT1 are each an analog signal. Since the neural network NN has a function of performing an analog operation, the operation may be performed by supplying the signal from the sensor element 174 to the neural network NN without conversion into a digital signal. In such a case, for example, an analog-digital converter circuit is not necessary, thereby reducing the circuit area of the control system 131 in some cases. For example, a value corresponding to a signal supplied to the sensor element 174 is supplied to the neural network NN. Here, a value corresponding to a supplied signal refers to a value obtained by amplifying the supplied signal, for example. For another example, the value refers to a value obtained by removing noise from the supplied signal and amplifying the resulting signal. The signal supplied to the sensor element 174 refers to a signal sensed by the sensor element 174, for example.

FIG. 1(B) shows an example in which the signal IN1 and the signal OUT1 are each an analog signal and the circuit 180 includes a circuit 190. The circuit 190 has a function of amplifying a signal, for example. FIG. 1(B) shows an example in which the signal IN1 is converted from the analog signal into a digital signal by a circuit A-D and then supplied to the circuit 190, and the digital signal output from the circuit 190 is converted into an analog signal by a circuit D-A and then supplied to the input layer IL of the neural network NN as the signal OUT1.

A digital signal may be supplied to the input layer IL of the neural network NN. FIG. 1(C) shows an example in which the signal IN1 is an analog signal and the signal OUT1 is a digital signal. In the case where the signal OUT1 is a digital signal, for example, a digital signal is supplied to the input layer IL of the neural network NN.

Figure 2A:
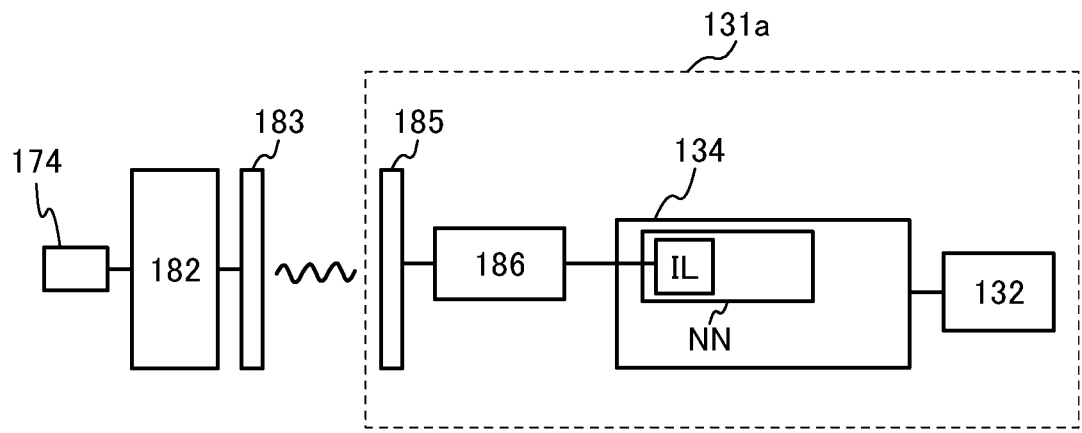
FIG. 2 Examples of a system including a sensor element.

FIG. 2(A) shows an example of a system including the sensor element 174, a circuit 182 to which output from the sensor element 174 is supplied, an antenna 183 having a function of converting an electrical signal output from the circuit 182 into a wireless signal and transmitting and receiving a signal wirelessly, and a control system 131*a* that receives the wireless signal from the antenna 183. The electrical signal may be converted into the wireless signal in the circuit 182.

In FIG. 2(A), the control system 131*a* includes a circuit 186, the control circuit 134, the memory 132, and an antenna 185 that receives the wireless signal from the antenna 183, converts the wireless signal into an electrical signal, and supplies the electrical signal to the circuit 186. The wireless signal may be converted in the circuit 186.

A signal corresponding to the signal output from the circuit 182 is supplied to the circuit 186 through wireless communication. A signal corresponding to the signal output from the circuit 186 is supplied to the circuit 182 through wireless communication. For example, an electrical signal output from the circuit 186 is converted into a wireless signal by the antenna 185 and then supplied to the antenna 183 through wireless communication. The signal supplied to the antenna 183 is converted into an electrical signal and then supplied to the circuit 182. Electric power supplied to the control circuit 134 can be supplied to the sensor element 174 and the circuit 182 through the antenna 185 and the antenna 183 by wireless power feeding.

Figure 2B:
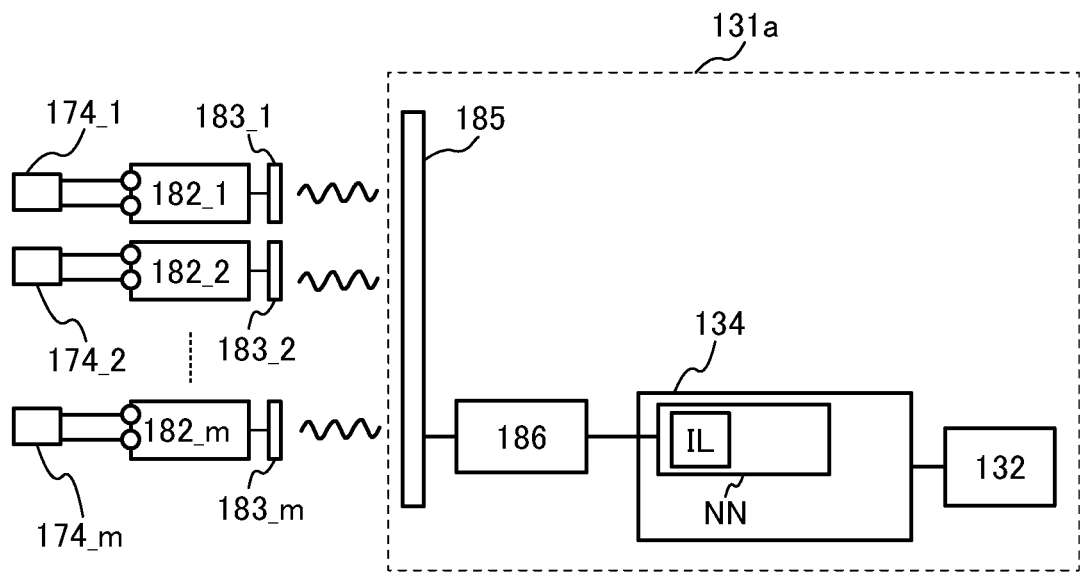

FIG. 2(B) includes a plurality of sensor elements 174 (a sensor element 174_1 to a sensor element **174_*m*, m is an integer of 2 or more), a plurality of circuits 182 (a circuit 182_1 to a circuit 182_*m*) electrically connected to the respective sensor elements 174, a plurality of antennas 183 (an antenna 183_1 to an antenna 183_*m*) electrically connected to the respective circuits 182, and the control system 131***a*.

As shown in FIG. 2(B), the antenna 183_1 to the antenna **183_*m* have a function of wirelessly communicating with the antenna 185**.

In the case where the signal received by the antenna 185 is a digital signal in FIG. 2(A) and FIG. 2(B), for example, it is preferable that the signal be converted into an analog signal in the circuit 186 and then the converted signal be supplied to the input layer IL of the neural network NN.

The circuit 182 and the circuit 186 each include a rectifier circuit, a demodulation circuit, a modulation circuit, a constant voltage circuit, and the like.

[Sample-and-Hold Circuit]

The circuit 180 and the circuit 182 each preferably include a circuit having a function of holding a signal supplied from the sensor element 174 (hereinafter, referred to as a sample-and-hold circuit).

Figure 3:
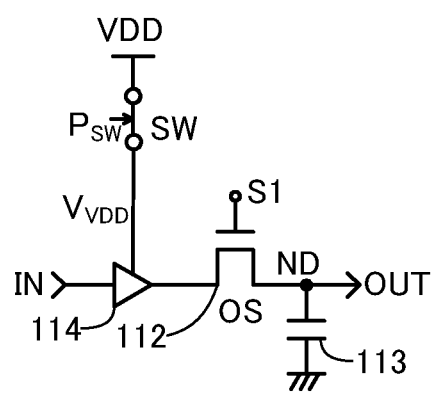
FIG. 3 An example of a sample-and-hold circuit.

FIG. 3 shows an example of a sample-and-hold circuit. An analog data potential (an analog potential Vin) is supplied to an input terminal IN of a sample-and-hold circuit 101 shown in FIG. 3, and the sample-and-hold circuit 101 is a circuit having a function of holding charge corresponding to the analog potential Vin in accordance with control by a control signal S1. The control signal S1 is a signal supplied from a timing controller.

The sample-and-hold circuit 101 includes, for example, a buffer circuit 114, a transistor 112, and a capacitor 113. The input terminal IN of the sample-and-hold circuit 101 is provided in one of a source and a drain of the transistor 112. In FIG. 3, the input terminal IN is provided in the one of the source and the drain of the transistor 112 with the buffer circuit 114 positioned therebetween. An output terminal OUT of the sample-and-hold circuit 101 is provided in the other of the source and the drain of the transistor 112. Note that anode at the other of the source and the drain of the transistor 112 is referred to as a node ND for description.

The buffer circuit 114 has a function of amplifying a signal such as analog data supplied to the sample-and-hold circuit 101 and outputting the amplified signal. Although the buffer circuit 114 is provided between the input terminal IN of the sample-and-hold circuit 101 and the one of the source and the drain of the transistor 112 in FIG. 3, the structure is not limited thereto, and a structure may be employed in which the buffer circuit 114 is connected to a gate of the transistor 112.

The transistor 112 is a transistor having a feature of an extremely low off-state current flowing between its source and drain. A transistor including an oxide semiconductor in its channel formation region (OS transistor) is suitable as the transistor having such a feature. An OS transistor will be described in detail in an embodiment below. In the drawing, "OS" is sometimes written beside a circuit symbol of an OS transistor in order to clearly show that the transistor is an OS transistor. The one of the source and the drain of the transistor 112 is connected to the input terminal IN of the sample-and-hold circuit 101. The gate of the transistor 112 is connected to a wiring that supplies the control signal S1. The other of the source and the drain of the transistor 112 is connected to the output terminal OUT of the sample-and-hold circuit 101 or the node ND.

The capacitor 113 has a function of holding charge corresponding to the analog potential Vin when the transistor 112 is turned off. FIG. 3 shows a structure in which the capacitor 113 is provided in the other of the source and the drain of the transistor 112, that is, on the node ND side; however, the capacitor 113 is not necessarily provided and can be omitted when gate capacitance or the like of an input terminal of a comparator included in the analog-digital converter circuit is utilized.

For example, one analog potential is supplied to one sample-and-hold circuit.

The circuit 180 and the circuit 182 may include a plurality of sample-and-hold circuits. The sample-and-hold circuits for the respective sensors, e.g., a strain sensor and a temperature sensor, included in the sensor element 174 may be included. Alternatively, a plurality of sample-and-hold circuits may be provided for one sensor.

Operation Example of System

An operation example of the system shown in FIG. 2(A) is described with reference to a flowchart shown in FIG. 4.

First, the processing starts in Step S200.

Next, an ON signal is supplied to the sensor element 174 in Step S201. Supply of the ON signal refers to, for example, supply of a high-potential signal as a power supply signal.

Next, a signal is supplied to the sensor element 174 in Step S202. Specifically, a signal sensed by the sensor included in the sensor element 174 is supplied to a circuit or the like included in the sensor element 174.

Next, the ON signal is supplied to the sample-and-hold circuit included in the circuit 182 in Step S203. Here, supply of the ON signal in the sample-and-hold circuit shown in FIG. 3 refers to, for example, supply of a high-potential signal as a control signal $P_{SW}$. When a high-potential signal is supplied as the control signal $P_{SW}$, a high potential $V_{VDD}$ is supplied to the buffer circuit 114.

Next, the signal supplied to the sensor element 174 is accumulated in the sample-and-hold circuit included in the circuit 182 in Step S204. Here, the accumulated signal is referred to as a first signal.

Next, an OFF signal is supplied to the sample-and-hold circuit in Step S205. Here, supply of the OFF signal in the sample-and-hold circuit shown in FIG. 3 refers to, for example, supply of a low-potential signal or a ground potential as the control signal $P_{SW}$.

Next, the OFF signal is supplied to the sensor element 174 in Step S206.

Next, the signal accumulated in the sample-and-hold circuit (the first signal) is converted in the circuit 182 in Step S207. For example, the first signal is converted into a digital signal by the analog-digital converter circuit and then modulated by the modulation circuit.

Next, the converted signal is supplied to the circuit 186 through the antenna 183 and the antenna 185 in Step S208.

Next, the signal supplied to the circuit 186 is converted in the circuit 186 in Step S209. For example, the signal is rectified by the rectifier circuit and then demodulated by the demodulation circuit. After that, the signal may be converted into an analog signal by a digital-analog converter circuit. The converted signal is supplied to the control circuit 134.

Finally, the processing ends in Step S299.

<Power Storage System>

Application examples of the systems shown in FIG. 1(A), FIG. 1(B), FIG. 1(C), FIG. 2(A), and FIG. 2(B) to a storage battery are described below.

Figure 5A:
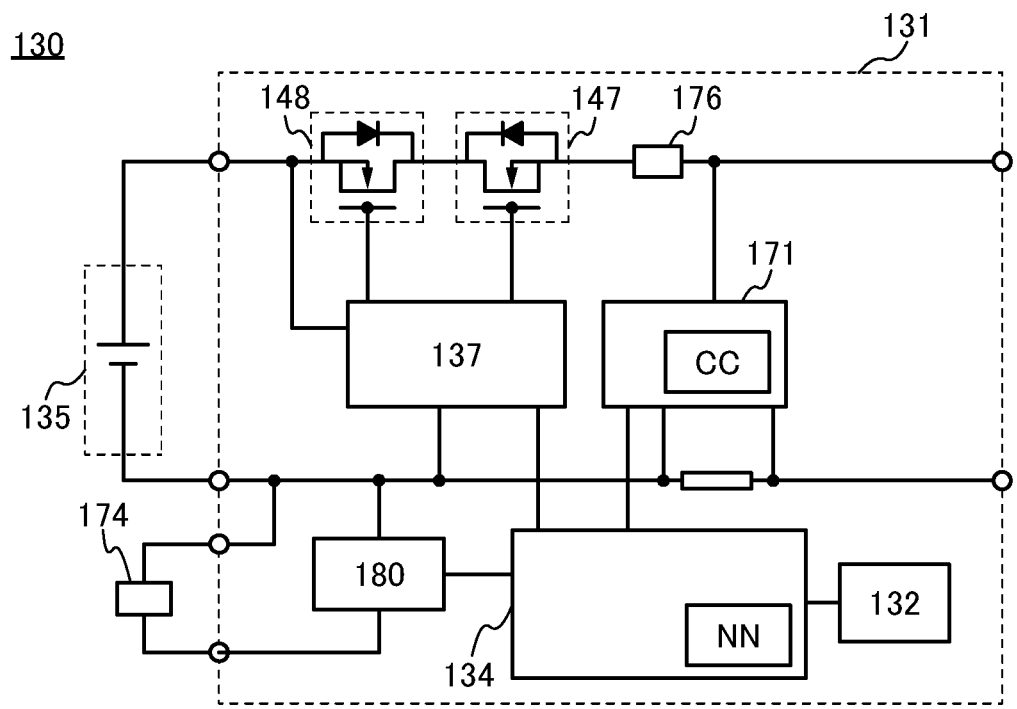
FIG. 5 Examples of a power storage system.

A power storage system 130 shown in FIG. 5(A) includes the control system 131, a storage battery 135, and the sensor element 174.

A primary battery or a secondary battery can be used as the storage battery, for example. A lithium-ion secondary battery (sometimes referred to as a lithium-ion battery), a sodium-ion secondary battery, a nickel-hydride battery, a lead storage battery, or the like can be used as a secondary battery, for example, and a lithium-ion secondary battery is preferably used. Alternatively, an air battery, a fuel battery, or the like may be used. Alternatively, an electrochemical capacitor such as an electric double-layer capacitor, a lithium-ion capacitor, or a redox capacitor may be used, for example.

The control system 131 shown in FIG. 5(A) includes a protective circuit 137 and a circuit 171 in addition to the control circuit 134, the circuit 180, and the memory 132.

The protective circuit 137 has a function of stopping the operation of the storage battery 135 when the storage battery 135 satisfies a certain predetermined condition. For example, the operation is stopped when the current of the storage battery 135 exceeds a certain value. For another example, the operation is stopped when the voltage of the storage battery 135 becomes higher than or equal to a certain value or lower than or equal to a certain value.

The protective circuit 137 preferably has a function of measuring the voltage and the current of the storage battery 135. Alternatively, the protective circuit 137 may control the storage battery 135 with the use of the current and the voltage of the storage battery 135 that are measured by the circuit 171 described later, for example.

When stopping the operation of the storage battery 135, the protective circuit 137 may have a route to connect a positive electrode and a negative electrode of the storage battery 135 to cause a short circuit between the positive electrode and the negative electrode. A resistor or a capacitor may be provided in the route.

The circuit 171 is electrically connected to the positive electrode and the negative electrode of the storage battery 135. The circuit 171 has a function of measuring the current and the voltage of the storage battery 135. The circuit 171 is electrically connected to the control circuit 134 and supplied with a signal from the control circuit 134.

The circuit 171 preferably includes a coulomb counter CC. The coulomb counter CC has a function of calculating the amount of accumulated charge with the use of time characteristics of the current of the storage battery 135. An ammeter included in the coulomb counter may also serve as an ammeter included in the circuit 171.

The control system 131 may include a transistor 147 and a transistor 148. The transistor 147 and the transistor 148 function as switches that block current, and the switches are operated when the protective circuit 137 determines that the storage battery 135 is stopped. Although MOSFETs including parasitic diodes are shown as the transistor 147 and the transistor 148 in the examples shown in FIG. 5(A) and FIG. 5(B), OS transistors may be used as the transistor 147 and the transistor 148. The details of an OS transistor are described later. The control system 131 may have a structure without one of the transistor 147 and the transistor 148.

As shown in FIG. 5(A), the control system 131 may include a fuse 176.

Figure 5B:
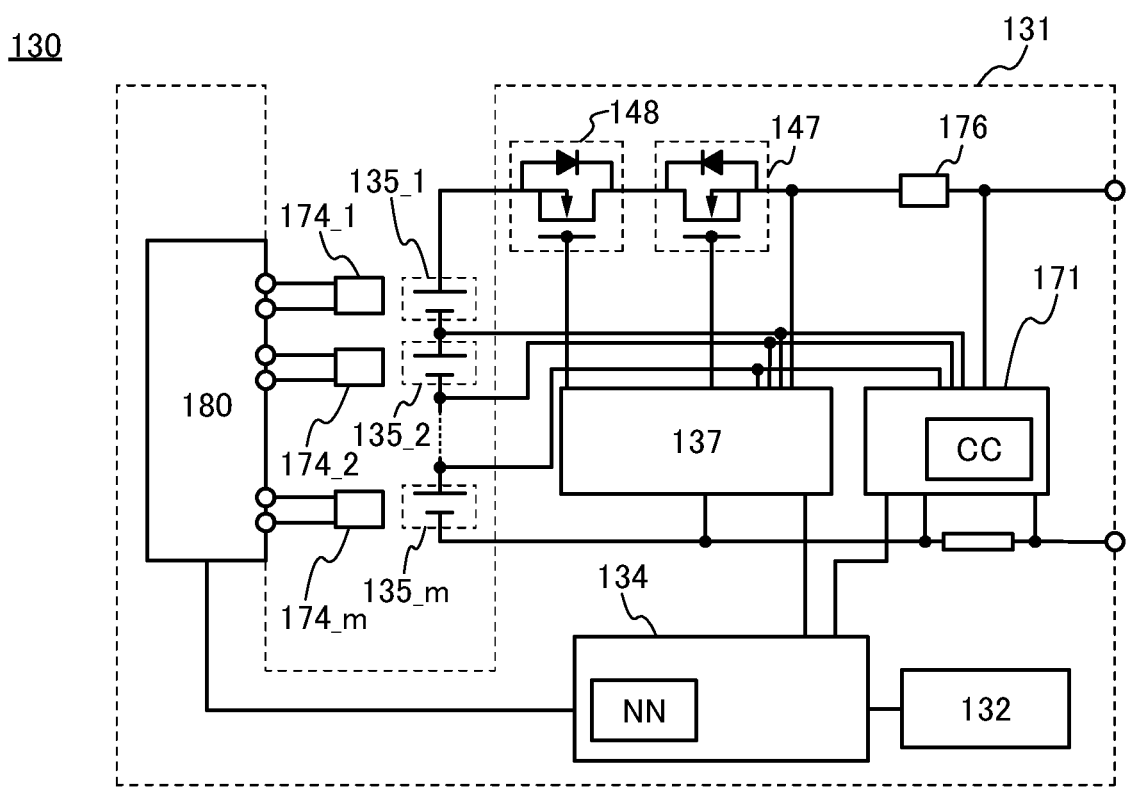

The power storage system 130 shown in FIG. 5(B) includes a plurality of storage batteries 135 (a storage battery 135_1 to a storage battery 135_m). The power storage system 130 also includes a plurality of sensor elements 174 (the sensor element 174_1 to the sensor element 174_m) for the respective storage batteries 135.

Output signals from the sensor element 174_1 to the sensor element 174_m are supplied to the circuit 180.

<Power Storage System 2>

Figure 6A:
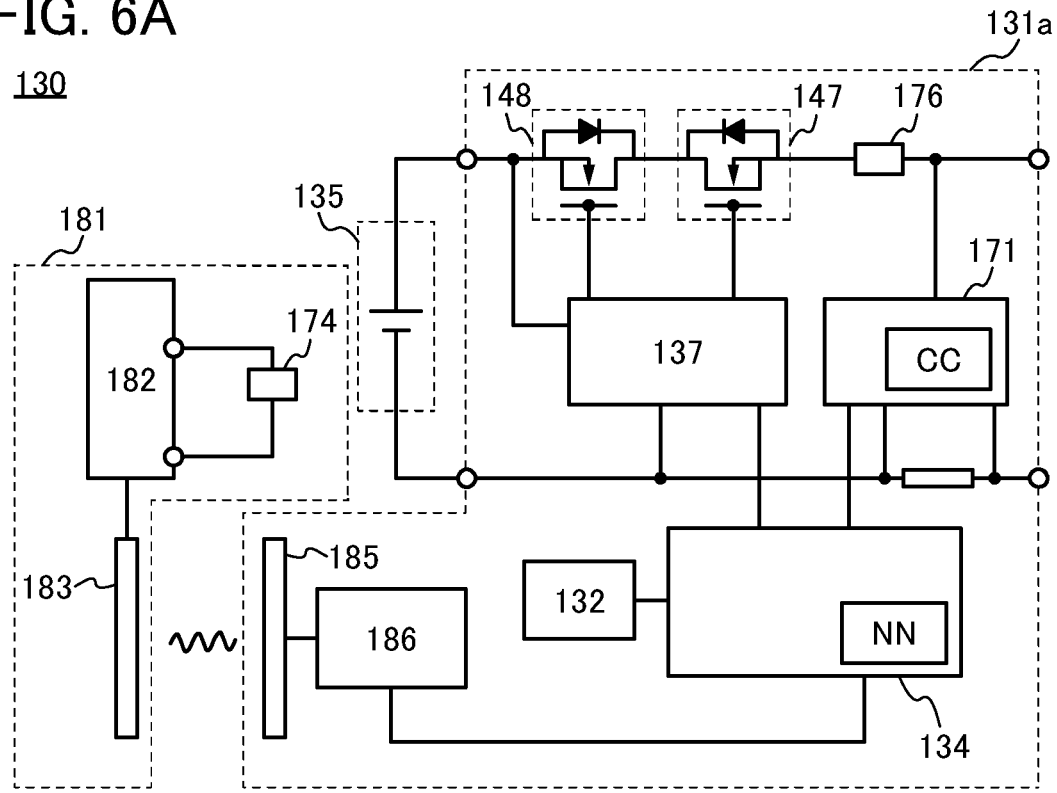
FIG. 6 Examples of a power storage system.

FIG. 6(A) shows an example in which the system shown in FIG. 2(A) is used for a storage battery. The power storage system 130 shown in FIG. 6(A) includes the control system 131a, the storage battery 135, the sensor element 174, the circuit 182, and the antenna 183. Here, a chip including the sensor element 174, the circuit 182, and the antenna 183 is sometimes referred to as a sensor chip 181. In the sensor chip 181, for example, a sensing portion of the sensor element 174 is preferably positioned over a surface of the storage battery 135. In addition, the sensing portion of the sensor element 174 is preferably on and in contact with the surface of the storage battery 135.

The control system 131a shown in FIG. 6(A) includes the protective circuit 137 and the circuit 171 in addition to the control circuit 134, the memory 132, the circuit 186, and the antenna 185 described with reference to FIG. 2(A).

Figure 6B:
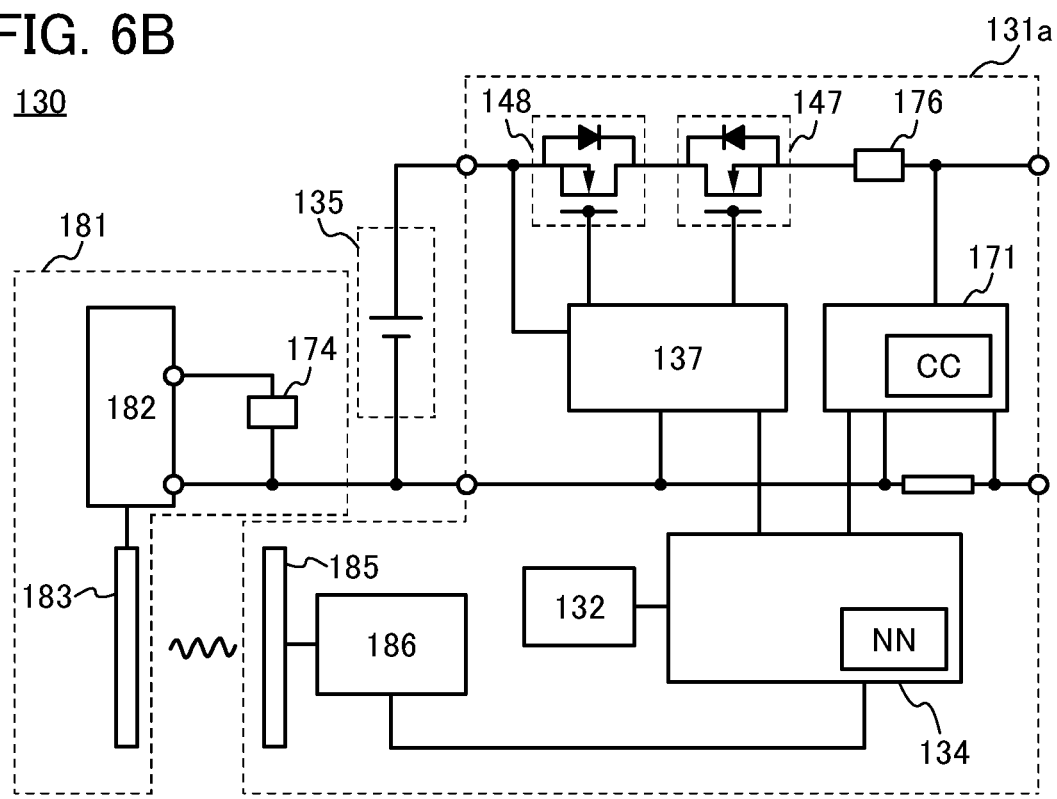

As shown in FIG. 6(B), a terminal included in the sensor element 174 may be electrically connected to a terminal included in the storage battery 135. In the example shown in FIG. 6(B), a negative electrode terminal of the storage battery 135 is electrically connected to the terminal included in the sensor element 174.

Operation Example of Power Storage System

Figure 7:
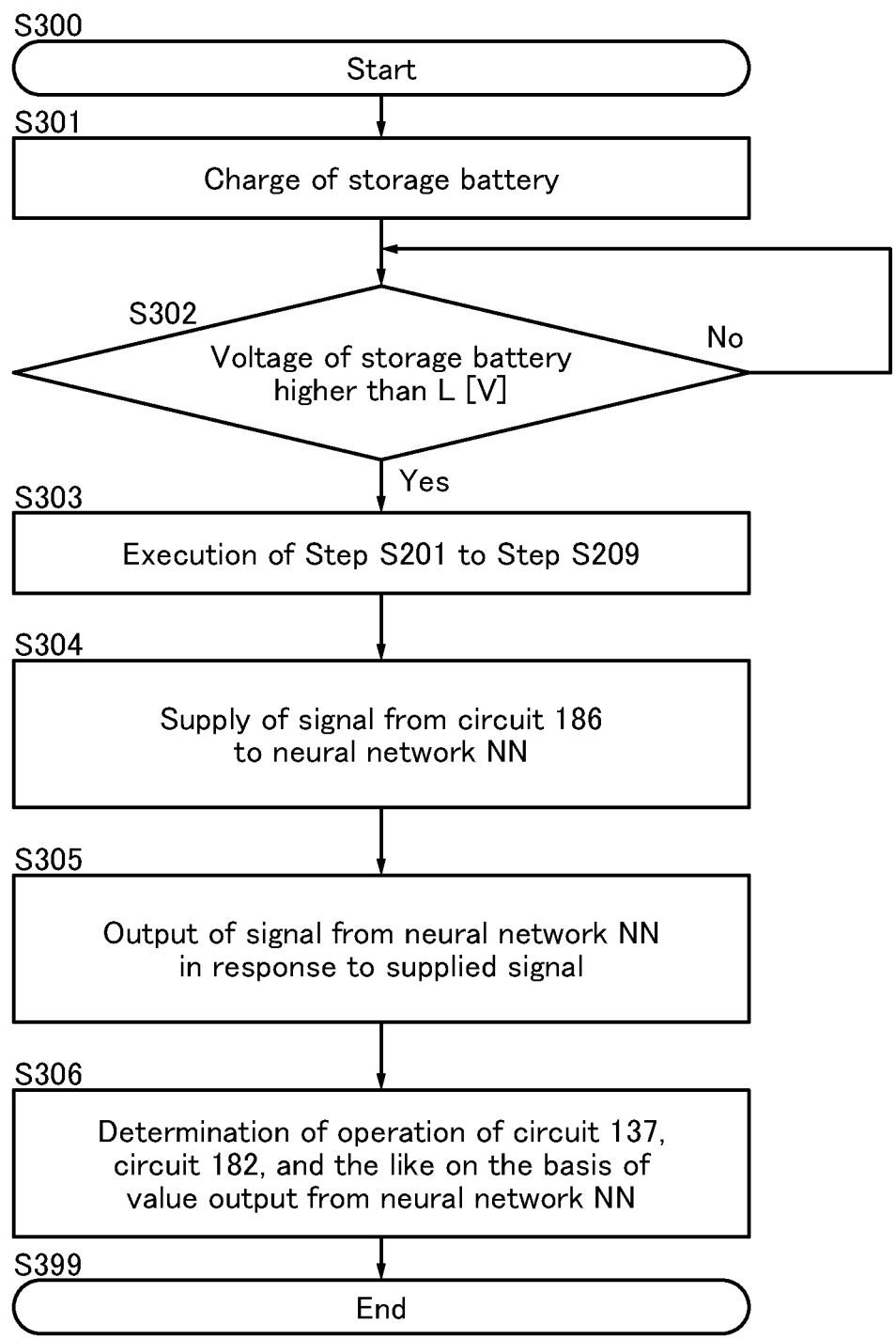
FIG. 7 A flowchart showing an operation of a system.

An operation example of the power storage system of one embodiment of the present invention is described with reference to a flowchart shown in FIG. 7. Although the flowchart shown in FIG. 7 shows an example in which a system including a sensor is driven in charging a storage battery, the system may be driven in accordance with various states of the storage battery, the value of the parameter of the storage battery, or the like. For example, the power storage system of one embodiment of the present invention may be driven in accordance with the operation of the protective circuit included in the storage battery. Specifically, for example, the power storage system is driven in accordance with overcharge, overdischarge, an increase or decrease in the voltage of the storage battery, an increase in the impedance of the storage battery, or the like.

First, the processing starts in Step S300.

Next, the storage battery is charged in Step S301.

Next, in Step S302, the processing goes to Step S303 when the voltage of the storage battery is higher than L [V], whereas the processing remains in Step S302 when the voltage is lower than or equal to L [V].

Figure 4:
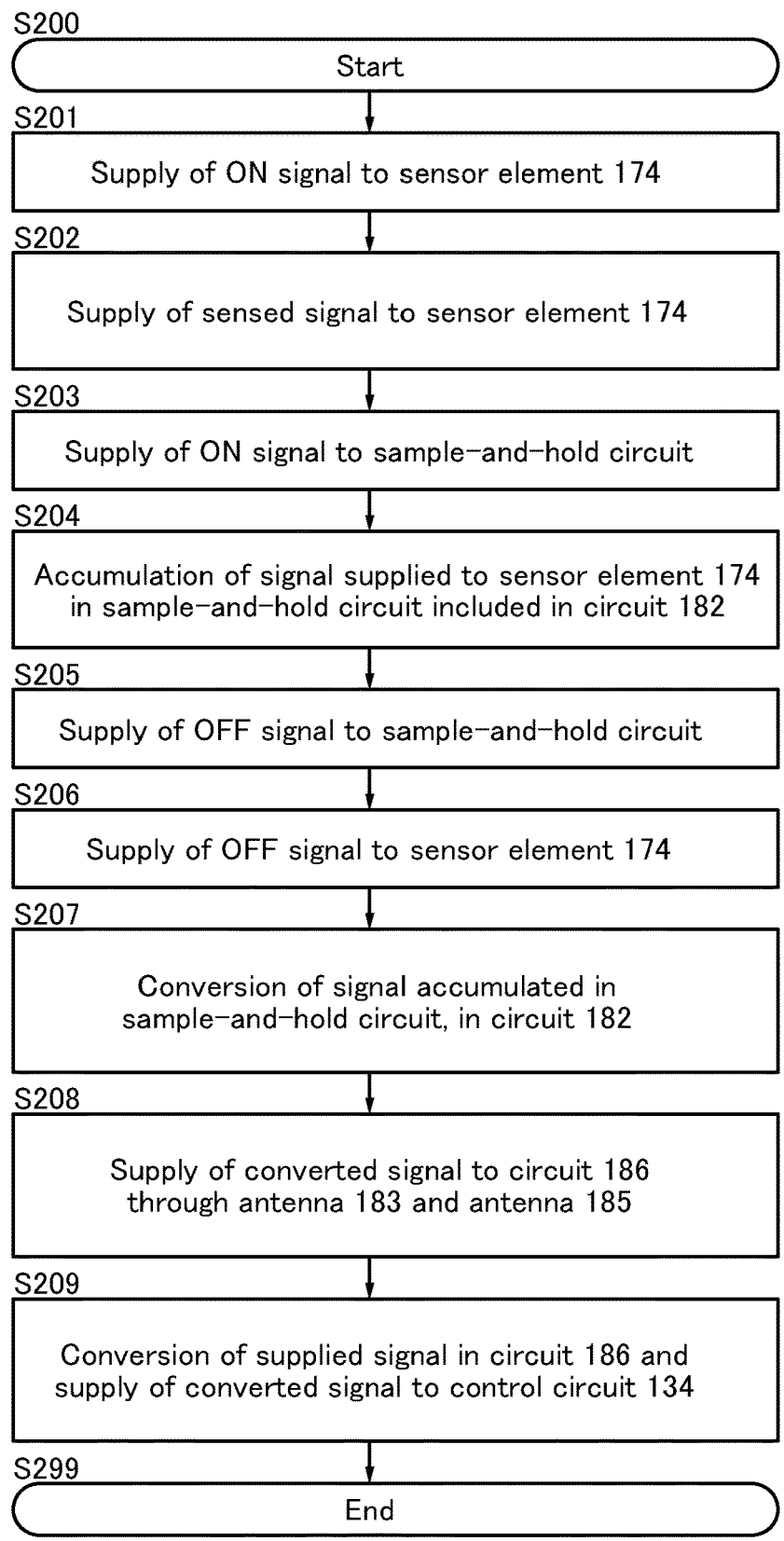
FIG. 4 A flowchart showing an operation of a system.

Next, Step S201 to Step S209 described with reference to FIG. 4 are executed in Step S303.

Next, a signal is supplied from the circuit 186 to the neural network NN in Step S304.

Next, a result corresponding to the signal supplied to the neural network NN is output from the neural network NN in Step S305.

Note that not only the signal from the sensor element 174 that is converted by the circuit 182, the circuit 186, and the like, but also the signals of the voltage, current, impedance, and the like of the storage battery measured by the protective circuit 137, the circuit 171, and the like are preferably supplied to the neural network NN, for example. When a displacement sensor is provided over an exterior body of the storage battery and the displacement sensor determines that the exterior body is abnormally expanded, for example, the current-voltage characteristics of the storage battery are analyzed and the operation of the storage battery is determined on the basis of the analysis results. For example, charging of the storage battery is stopped. The analysis can be performed by, for example, the neural network NN.

Next, the operations of the protective circuit 137, the circuit 182, and the like are determined on the basis of the value output from the neural network NN in Step S306.

Finally, the processing ends in Step S399.

<Power Storage System 3>

Figure 8:
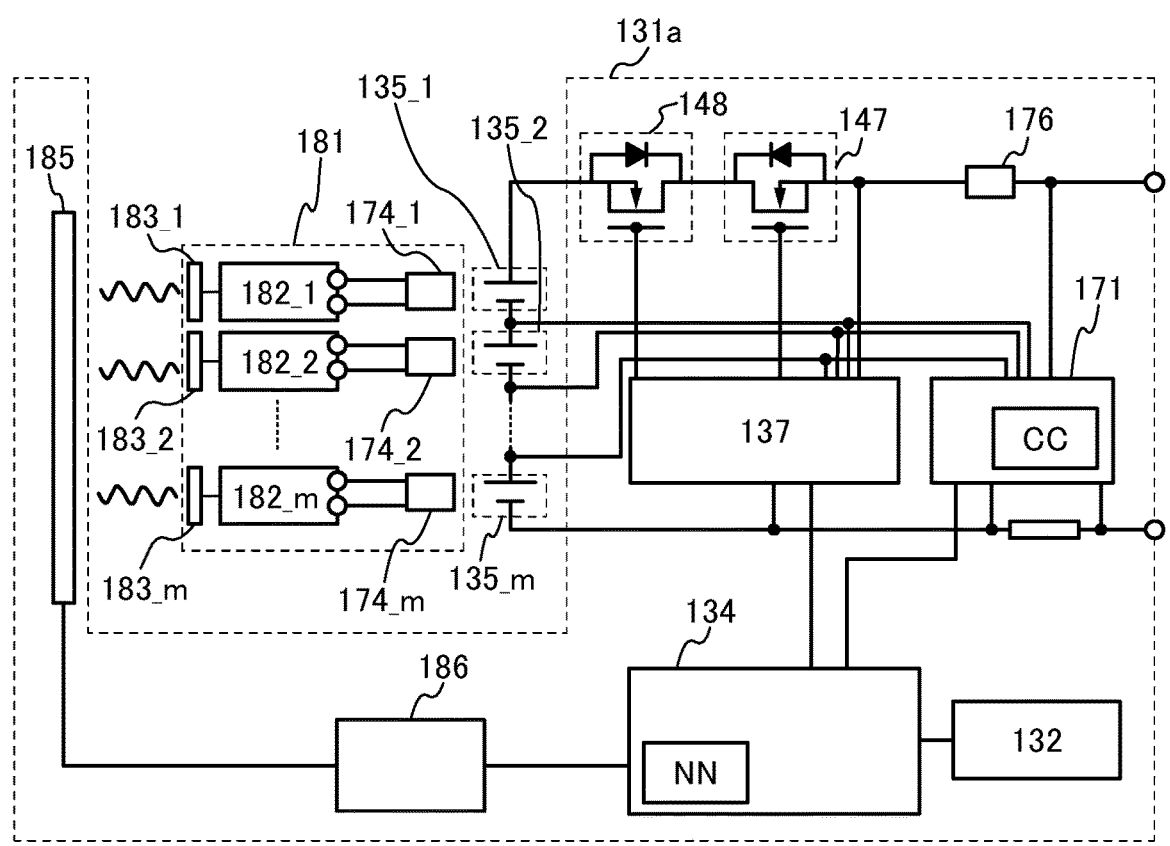
FIG. 8 An example of a power storage system.

FIG. 8 shows an example in which the system shown in FIG. 2(B) is used for a storage battery. The power storage system 130 shown in FIG. 8 includes the control system 131a, the plurality of storage batteries 135 (the storage battery 135_1 to the storage battery 135_m), the plurality of sensor elements 174 (the sensor element 174_1 to the sensor element 174_m) for the respective storage batteries 135, the plurality of circuits 182 (the circuit 182_1 to the circuit 182_m) electrically connected to the respective sensor elements 174, and the plurality of antennas 183 (the antenna 183_1 to the antenna 183_m) electrically connected to the respective circuits 182. In FIG. 8, the plurality of storage batteries 135 are electrically connected to each other in series. Note that the expression "for the respective storage batteries 135" refers to, for example, sensing of parameters such as distortion and temperature of portions of the storage batteries 135.

The control system 131a shown in FIG. 8 includes the protective circuit 137 and the circuit 171 in addition to the control circuit 134, the memory 132, the circuit 186, and the antenna 185 described with reference to FIG. 2(B).

Figure 9:
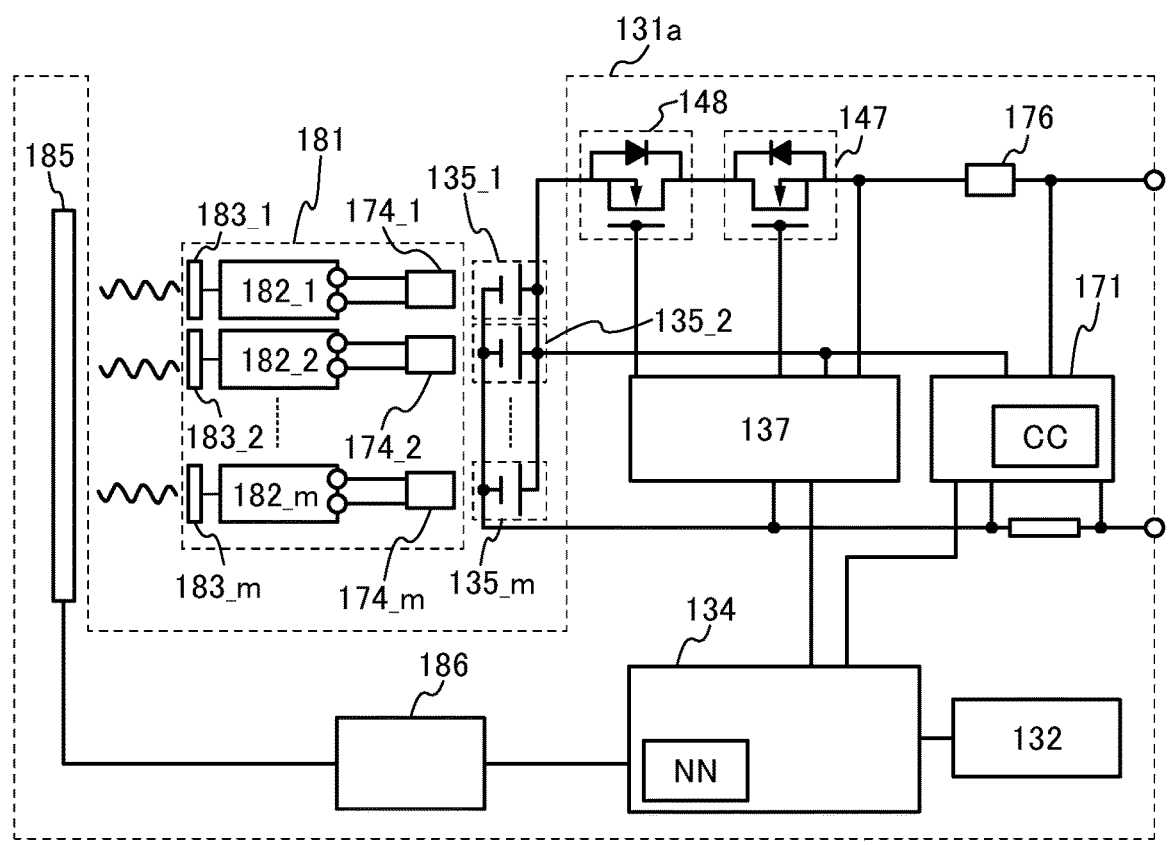
FIG. 9 An example of a power storage system.

FIG. 9 shows an example in which the plurality of storage batteries 135 are electrically connected to each other in parallel in the power storage system. The power storage system 130 shown in FIG. 9 includes the plurality of sensor elements 174 (the sensor element 174_1 to the sensor element 174_m) for the respective storage batteries 135, the plurality of circuits 182 (the circuit 182_1 to the circuit 182_m) electrically connected to the respective sensor elements 174, and the plurality of antennas 183 (the antenna 183_1 to the antenna 183_m) electrically connected to the respective circuits 182.

This embodiment can be implemented in appropriate combination with any of the other embodiments.

Embodiment 2

In this embodiment, the storage battery and the sensor chip included in the power storage system of one embodiment of the present invention are described.

<System Using Laminated Storage Battery>

An example in which a laminated storage battery is used as the storage battery 135 is described below. The details of the laminated storage battery will be described later. Note that the laminated storage battery is sometimes referred to as a laminated cell, a stacked-layer laminated cell, or the like.

When the laminated storage battery has flexibility and is used in an electronic device at least part of which is flexible, the storage battery can be bent as the electronic device is bent.

FIG. 10(A) shows an example in which the laminated storage battery is used as the storage battery 135. FIG. 10(A) shows a top surface of the storage battery 135. FIG. 10(B) shows a cross section corresponding to the dashed-dotted line X1-X2 in the top surface of the storage battery 135 shown in FIG. 10(A), and FIG. 10(C) shows a cross section corresponding to the dashed-double dotted line Y1-Y2 shown in FIG. 10(A). The storage battery 135 includes an exterior body 509 made of a sheet covered with an insulating surface. The storage battery 135 preferably includes a positive electrode lead electrode 510 and a negative electrode lead electrode 511. The positive electrode lead electrode 510 supplies electricity to a positive electrode and is electrically connected to a current collector included in the positive electrode, for example. The negative electrode lead electrode 511 supplies electricity to a negative electrode and is electrically connected to a current collector included in the negative electrode, for example. In the top view of the storage battery 135, the sheets included in the exterior body are stacked, and the stacked sheets are sealed in a sealing region 509a in a peripheral portion.

The sensor chip 181 is provided to be in contact with the surface of the exterior body 509 included in the storage battery 135. The sensor chip 181 includes the sensor element 174, the circuit 182, and the antenna 183. In the example shown in FIG. 10(A), the circuit 182 and the sensor element 174 overlap with each other, and the sensor element 174 is provided over the surface of the circuit 182 on the exterior body 509 side. Although FIG. 10(A) shows an example in which the antenna 183 and the sensor element 174 do not overlap with each other, they may overlap with each other.

The sensor chip 181 is provided over the exterior body 509. For example, the sensor chip 181 includes, as the sensor element 174, one or more sensor elements selected from a strain sensor, a temperature sensor, a gas sensor, and the like.

The power storage system of one embodiment of the present invention including a strain sensor can sense an increase in the internal pressure of the storage battery 135, for example. For another example, expansion of the exterior body 509 due to gas generation in the storage battery 135 can be sensed. The strain sensor is preferably provided in the vicinity of a region that is especially easily expanded in the exterior body 509. In FIG. 10(A), for example, the sensor element 174 is provided in the vicinity of the sealing region 509a. e.g., in the vicinity of a boundary with the inside of the sealing region 509a.

A driving potential (e.g., a high potential and a ground potential) is supplied to the sensor element 174. The potential supplied to the sensor element 174 may double as the potential of the positive electrode or the negative electrode of the storage battery 135. For example, the ground potential supplied to the sensor element 174 may double as the potential of the negative electrode of the storage battery 135. In that case, although not illustrated, the negative electrode lead electrode 511 is electrically connected to an electrode for supplying the potential of the sensor element 174 with the use of a wiring.

Figure 11:
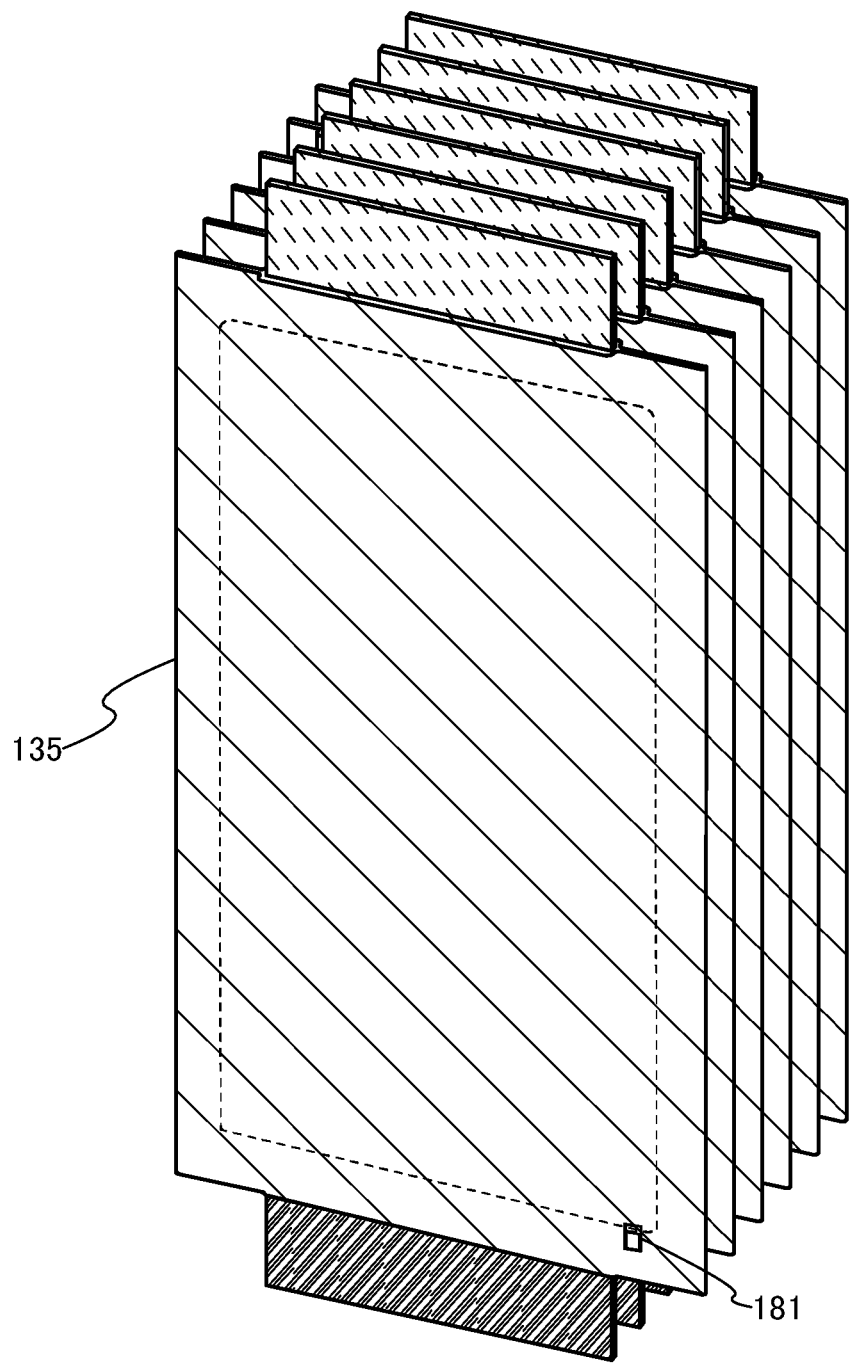
FIG. 11 A perspective view of a plurality of storage batteries and a sensor chip.

FIG. 11 shows an example in which the plurality of storage batteries 135 shown in FIG. 10(A) are stacked.

Figure 12:
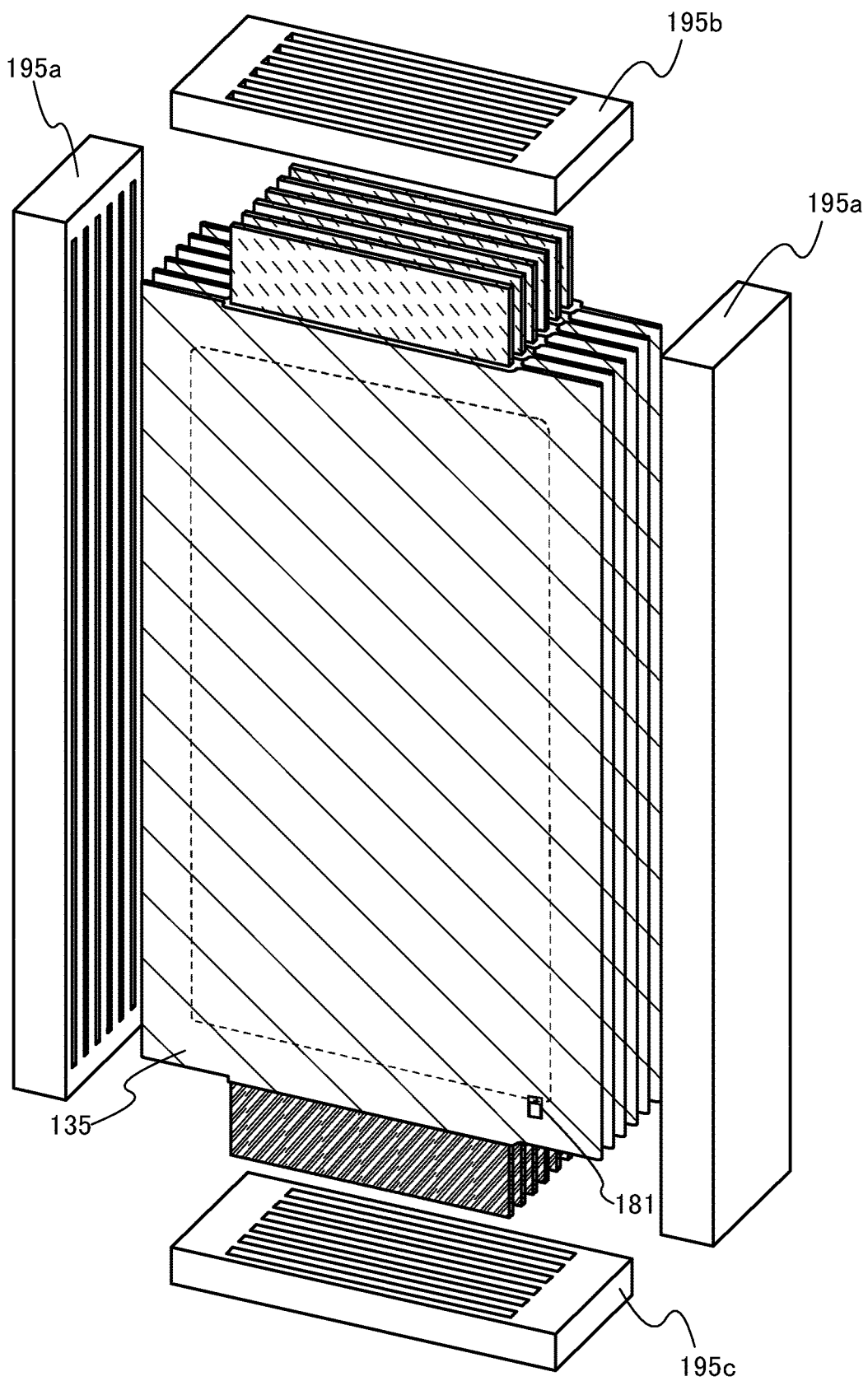
FIG. 12 A perspective view of a plurality of storage batteries, a sensor chip, and housings.
Figure 13:
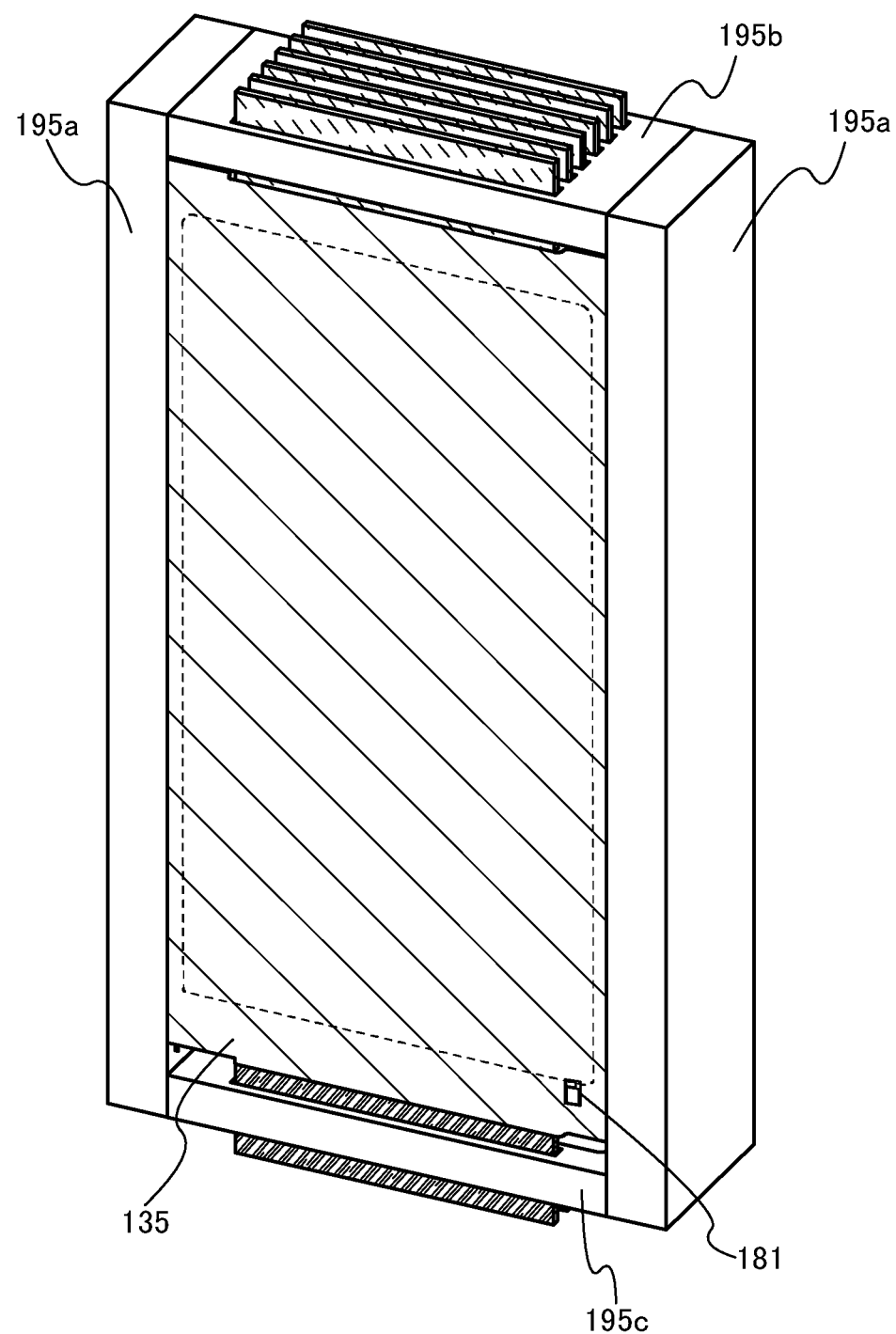
FIG. 13 A perspective view of a sensor chip and a plurality of storage batteries stored in housings.

FIG. 12 shows an example in which the side surfaces of the stack of the plurality of storage batteries 135 are stored in slits provided in a housing 195a and the lead electrodes are made pass through slits provided in a housing 195b and a housing 195c. FIG. 13 shows an example in which the side surfaces and the lead electrodes are stored in the corresponding housings.

Figure 14:
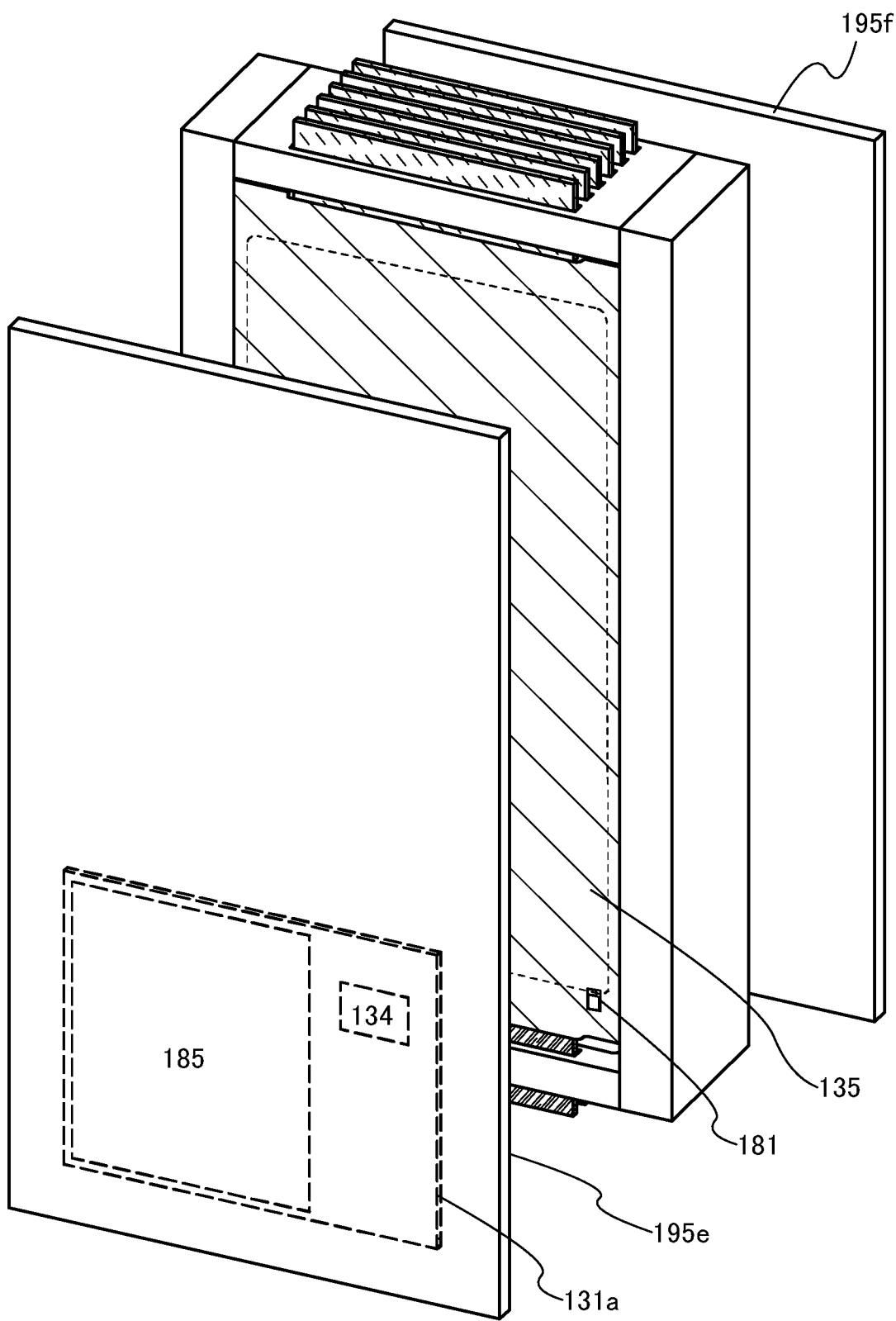
FIG. 14 A perspective view of a plurality of storage batteries, a sensor chip, and housings.

Furthermore, when the storage batteries have flat shapes as shown in FIG. 14, a housing 195e and a housing 195f may be provided such that they face larger surfaces of the stack of the plurality of storage batteries 135. In the example shown in FIG. 14, the control system 131a described in the above embodiment is provided in the housing 195e. FIG. 14 shows an example in which the control circuit 134 and the antenna 185 are provided side by side. Although FIG. 12 to FIG. 14 each show an example in which the antenna 183 and the exterior body 509 overlap with each other, the sensor element 174 may be provided over the exterior body 509 and the antenna 183 may be provided in a region not overlapping with the exterior body 509, e.g., outside the exterior body 509 when seen from above, in each of the storage batteries 135 as will be exemplified later in FIG. 16. Providing the antenna 183 outside the exterior body 509 when seen from above can reduce the influence of blocking by the exterior body 509.

Figure 15A:
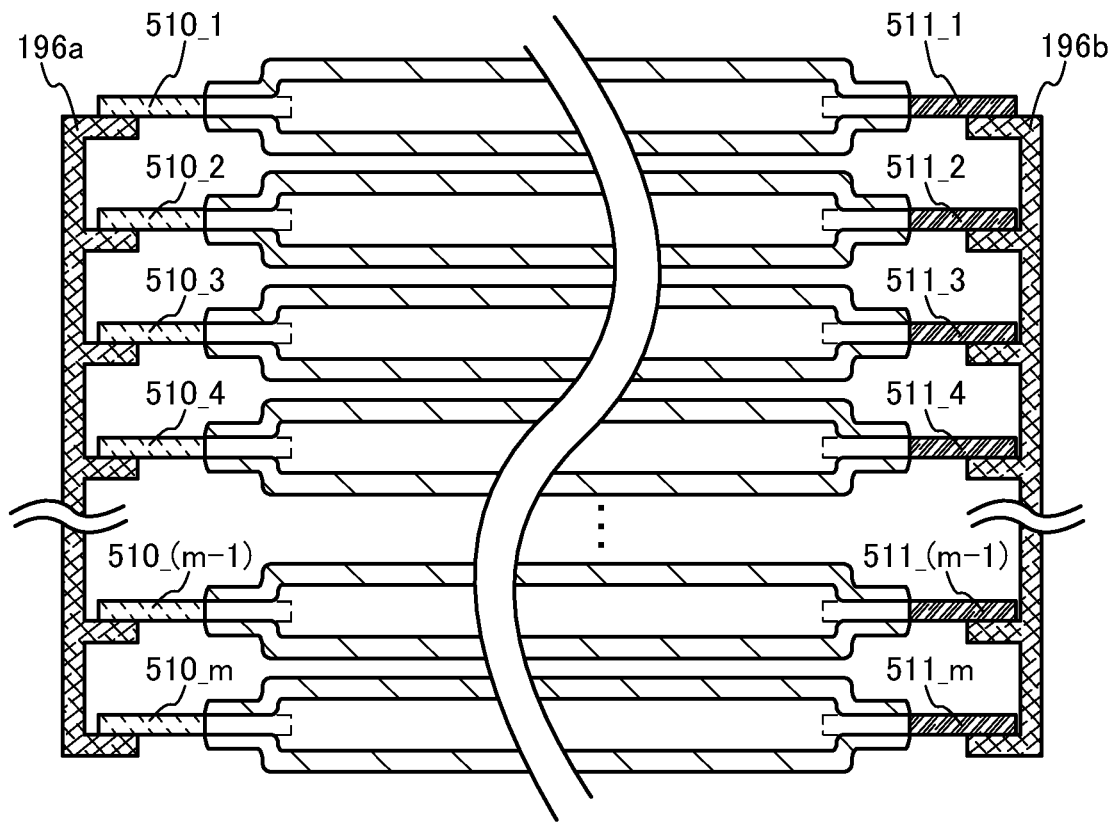
FIG. 15 Cross-sectional views showing connection between a plurality of storage batteries.
Figure 15B:
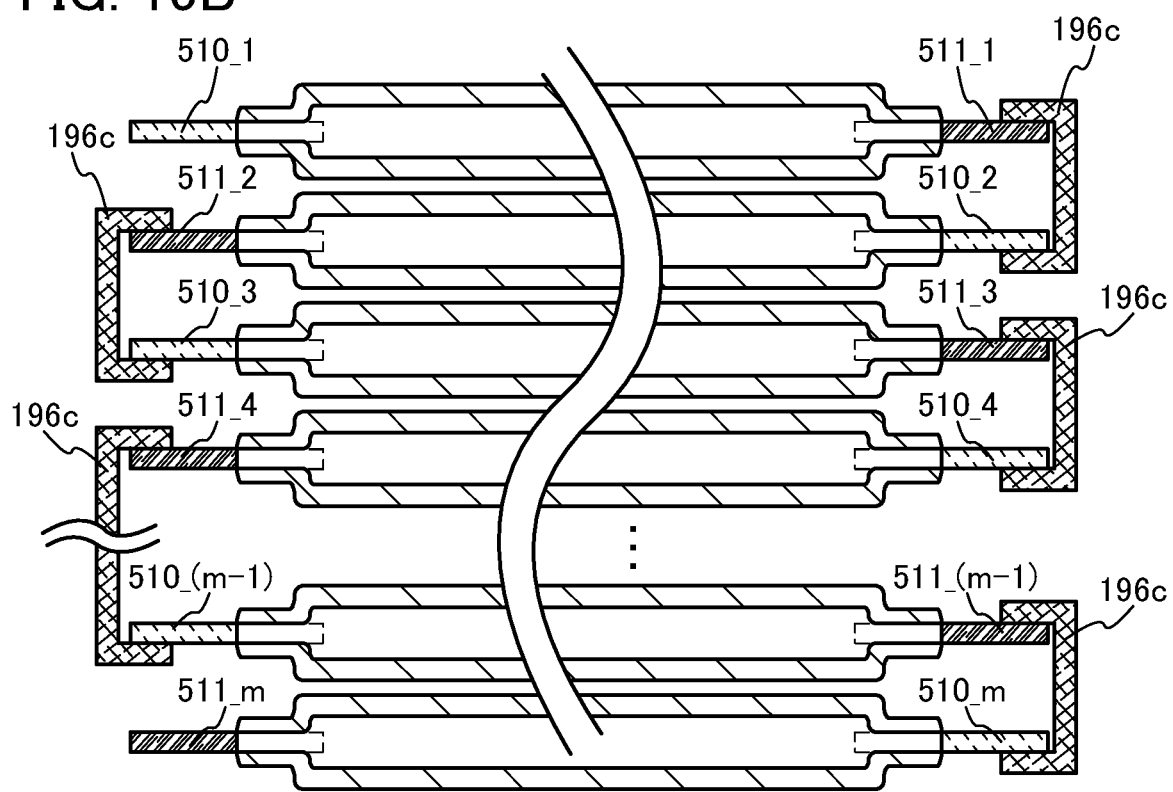

FIG. 15(A) and FIG. 15(B) show cross sections of the stack of the plurality of storage batteries 135 in FIG. 14 and the like. Note that the housing 195b, the housing 195c, and the like are not illustrated for simplicity.

FIG. 15(A) shows an example in which the plurality of storage batteries are electrically connected to each other in parallel. The positive electrode lead electrode 510 included in the k-th storage battery is referred to as a positive electrode lead electrode 510_k (k is an integer greater than or equal to 1 and less than or equal to m), and the negative electrode lead electrode 511 included in the k-th storage battery is referred to as a negative electrode lead electrode 511_k. In FIG. 15(A), the positive electrode lead electrode 510_1 to the positive electrode lead electrode 510_m are electrically connected to each other through a conductive plate 196a. The negative electrode lead electrode 511_1 to the negative electrode lead electrode 511m are electrically connected to each other through a conductive plate 196b.

FIG. 15(B) shows an example in which the plurality of storage batteries are electrically connected to each other in series. In FIG. 15(B), the positive electrode lead electrodes 510 and the negative electrode lead electrodes 511 of the adjacent storage batteries are alternately stacked, the positive electrode lead electrode 510 and the negative electrode lead electrode 511 of the adjacent storage batteries 135 are electrically connected to each other through a conductor 196c, and the storage battery 135_1 to the storage battery 135_m are electrically connected to each other in series.

Although FIG. 10(A) shows an example in which the positive electrode lead electrode 510 and the negative electrode lead electrode 511 are provided on the opposite sides in the top surface of the storage battery 135, they may be provided on the same side as shown in FIG. 16(A). FIG. 16(A) shows the top surface of the storage battery 135. FIG. 16(B) shows a cross section corresponding to the dashed-dotted line X1-X2 in the top surface of the storage battery 135 shown in FIG. 16(A), and FIG. 16(C) shows a cross section corresponding to the dashed-double dotted line Y1-Y2 shown in FIG. 16(A).

Figure 17:
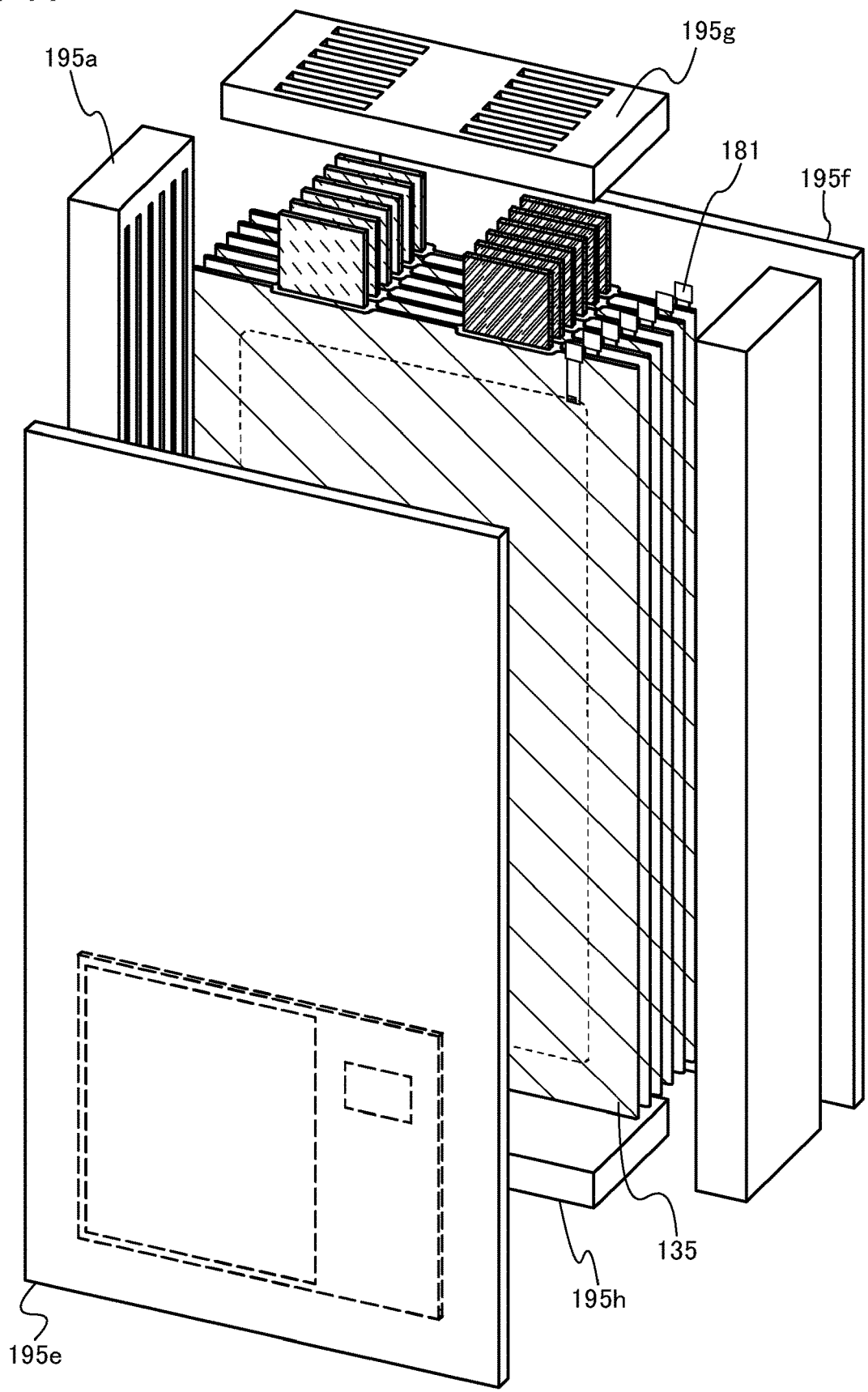
FIG. 17 A perspective view of a plurality of storage batteries, sensor chips, and housings.

FIG. 17 shows an example in which the plurality of storage batteries 135 shown in FIG. 16(A) are stacked, the side surfaces of the stack of the plurality of storage batteries 135 are stored in the slits provided in the housing 195a, the lead electrodes are made pass through slits provided in a housing 195g, and the housing 195e and the housing 195f are provided such that they face the larger surfaces of the stack of the plurality of storage batteries 135. A housing 195h is provided to substantially face the housing 195g.

Figure 18A:
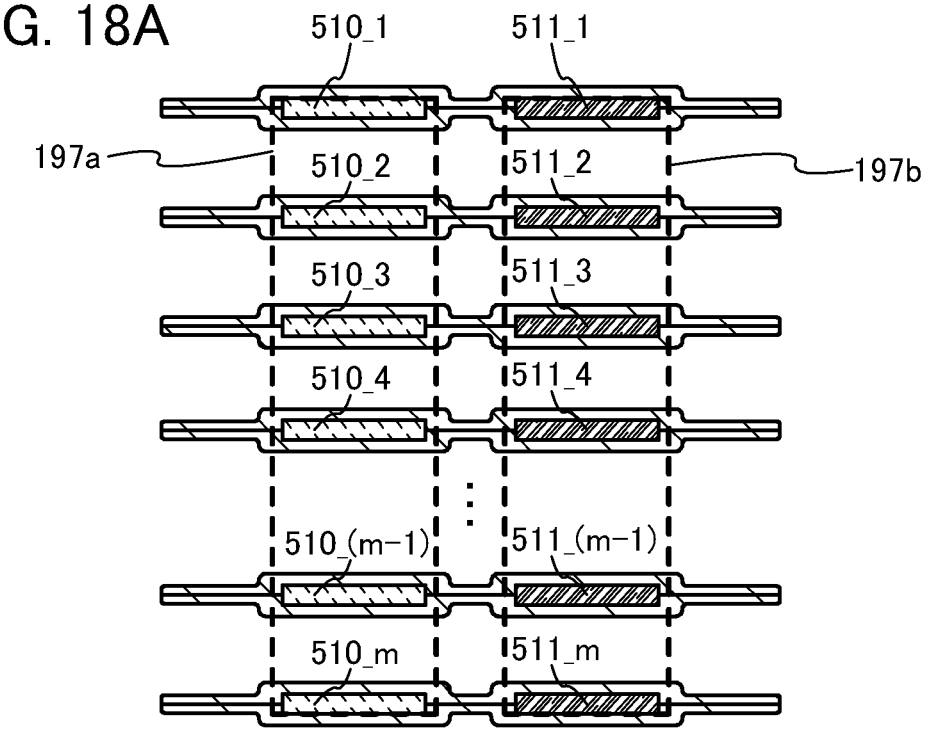
FIG. 18 Cross-sectional views showing connection between a plurality of storage batteries.
Figure 18B:
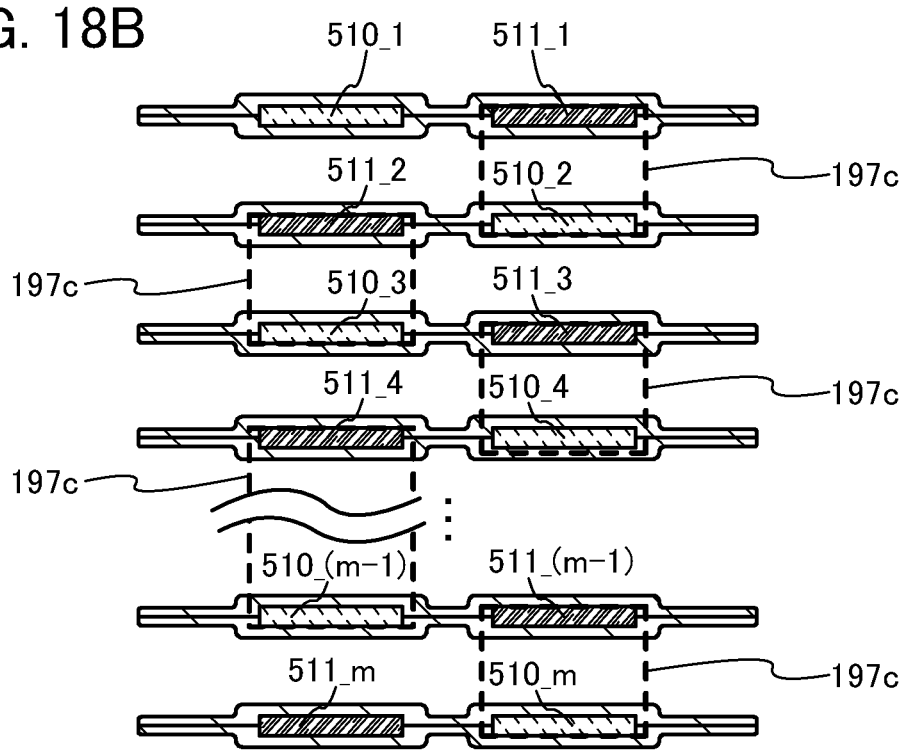

FIG. 18(A) and FIG. 18(B) show cross sections of the stack of the plurality of storage batteries in FIG. 17. FIG. 18(A) shows an example in which the plurality of storage batteries are electrically connected to each other in parallel. In FIG. 18(A), the positive electrode lead electrode 510_1 to the positive electrode lead electrode 510_m are electrically connected to each other through a conductive plate 197a. The negative electrode lead electrode 511_1 to the negative electrode lead electrode 511_m are electrically connected to each other through a conductive plate 197b.

FIG. 18(B) shows an example in which the plurality of storage batteries are electrically connected to each other in series. In FIG. 18(B), the positive electrode lead electrodes 510 and the negative electrode lead electrodes 511 of the adjacent storage batteries are alternately stacked, the positive electrode lead electrode 510 and the negative electrode lead electrode 511 of the adjacent storage batteries 135 are electrically connected to each other through a conductor 197c, and the storage battery 135_1 to the storage battery 135_m are electrically connected to each other in series.

The housing 195a to the housing 195h are formed using an insulating material, for example. Alternatively, the housing 195a to the housing 195h may be formed using a metal material.

[Laminated Storage Battery]

The details of the internal structure of the exterior body of the laminated storage battery will be described below, for example.

Figure 19:
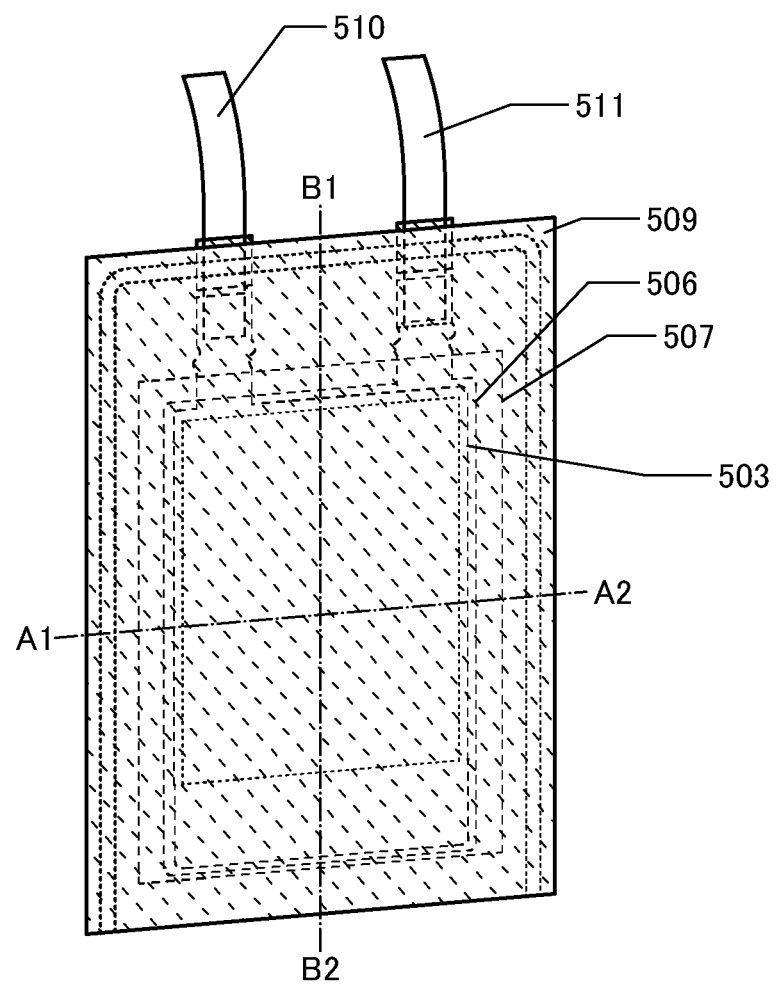
FIG. 19 An example of a storage battery.
Figure 20A:
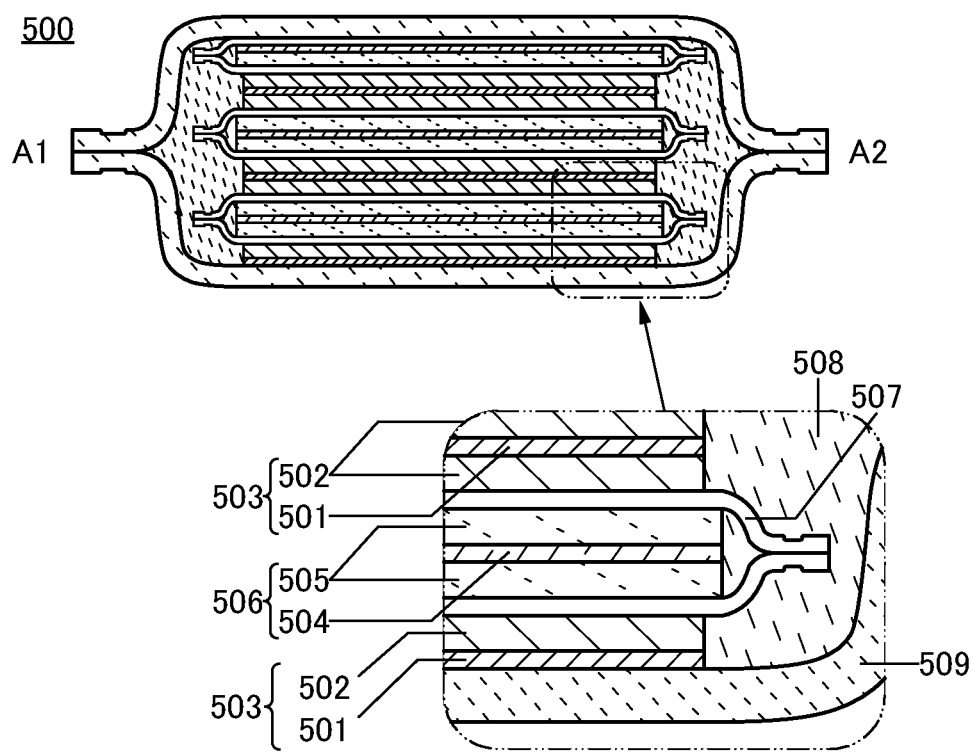
FIG. 20 Cross-sectional views of a storage battery.
Figure 20B:
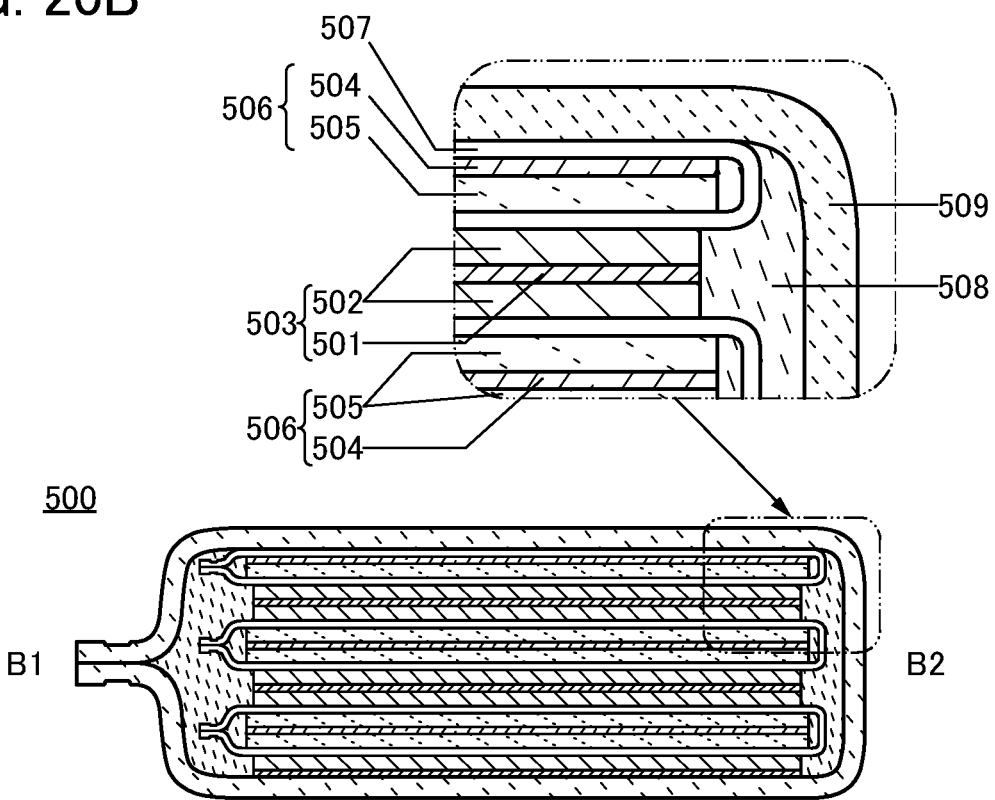

FIG. 19 shows an external view of a storage battery 500 that is a laminated storage battery. FIG. 20(A) and FIG. 20(B) show cross sections indicated by the dashed-dotted line A1-A2 and the dashed-dotted line B1-B2, respectively, in FIG. 19. The storage battery 500 includes a positive electrode 503 including a positive electrode current collector 501 and a positive electrode active material layer 502, a negative electrode 506 including a negative electrode current collector 504 and a negative electrode active material layer 505, a separator 507, an electrolyte solution 508, and the exterior body 509. The separator 507 is provided between the positive electrode 503 and the negative electrode 506 in the exterior body 509. The exterior body 509 is filled with the electrolyte solution 508.

As a solvent of the electrolyte solution 508, an aprotic organic solvent is preferably used; for example, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

When a gelled high-molecular material is used as the solvent of the electrolyte solution, safety against liquid leakage and the like is improved. Furthermore, a secondary battery can be thinner and more lightweight. Typical examples of gelled high-molecular materials include a silicone gel, an acrylic gel, an acrylonitrile gel, a polyethylene oxide-based gel, a polypropylene oxide-based gel, and a gel of a fluorine-based polymer.

The use of one or more kinds of ionic liquids (room temperature molten salts) which have non-flammability and non-volatility as a solvent of the electrolyte solution can prevent a power storage device from exploding or catching fire even when the power storage device internally shorts out or the internal temperature increases owing to overcharging or the like. An ionic liquid is made with a cation and an anion, and contains an organic cation and an anion. Examples of the organic cation used for the electrolyte solution include aliphatic onium cations such as a quaternary ammonium cation, a tertiary sulfonium cation, and a quaternary phosphonium cation, and aromatic cations such as an imidazolium cation and a pyridinium cation. Examples of the anion used for the electrolyte solution include a monovalent amide-based anion, a monovalent methide-based anion, a fluorosulfonate anion, a perfluoroalkylsulfonate anion, a tetrafluoroborate anion, a perfluoroalkylborate anion, a hexafluorophosphate anion, and a perfluoroalkylphosphate anion.

In the case where lithium ions are used as carriers, as an electrolyte dissolved in the above-described solvent, one of lithium salts such as $LiPF_6$, $LiCO_4$, $LiAsF_6$, $LiBF_4$, $LiACl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN(C_2F_5O_2)_2$ can be used, or two or more of these lithium salts can be used in an appropriate combination in an appropriate ratio.

The electrolyte solution used for a power storage device is preferably highly purified and contains a small amount of dust particles and elements other than the constituent elements of the electrolyte solution (hereinafter, also simply referred to as impurities). Specifically, the weight ratio of impurities to the electrolyte solution is less than or equal to 1%, preferably less than or equal to 0.1%, and further preferably less than or equal to 0.01%.

Furthermore, an additive agent such as vinylene carbonate, propane sultone (PS), tert-butylbenzene (TBB), fluoroethylene carbonate (FEC), lithium bis(oxalate)borate (Li-BOB), fluorobenzene, cyclohexylbenzene, or biphenyl may be added to the electrolyte solution. The concentration of the additive agent in the whole solvent is, for example, higher than or equal to 0.1 weight % and lower than or equal to 5 weight %.

Alternatively, a polymer gel electrolyte obtained in such a manner that a polymer is swelled with an electrolyte solution may be used.

Examples of the polymer include a polymer having a polyalkylene oxide structure, such as polyethylene oxide (PEO); PVDF; polyacrylonitrile; and a copolymer containing any of them. For example, PVDF-HFP, which is a copolymer of PVDF and hexafluoropropylene (HFP), can be used. The formed polymer may be porous.

Instead of the electrolyte solution, a solid electrolyte including an inorganic material such as a sulfide-based or oxide-based inorganic material, or a solid electrolyte including a high-molecular material such as a PEO (polyethylene oxide)-based high-molecular material can be used.

When the solid electrolyte is used, a separator and a spacer are not necessary. Furthermore, the battery can be entirely solidified; thus, there is no possibility of liquid leakage and the safety is dramatically improved.

As the separator 507, for example, paper; nonwoven fabric; glass fiber; ceramics; or synthetic fiber using nylon (polyamide), vinylon (polyvinyl alcohol-based fiber), polyester, acrylic, polyolefin, or polyurethane can be used.

The separator 507 is preferably formed to have a bag-like shape to surround one of the positive electrode 503 and the negative electrode 506. For example, the separator 507 is folded in half such that the positive electrode 503 is sandwiched, and sealed in a region outside the region overlapping with the positive electrode 503; thus, the positive electrode 503 can be reliably supported inside the separator 507. Then, the positive electrodes 503 surrounded by the separators 507 and the negative electrodes 506 are alternately stacked and provided in the exterior body 509, whereby the storage battery 500 can be formed.

As the exterior body 509 of the storage battery 500, for example, a film having a three-layer structure can be employed in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided over the metal thin film as the outer surface of the exterior body.

In the above structure, the exterior body 509 of the secondary battery can change its form such that the smallest curvature radius is greater than or equal to 3 mm and less than or equal to 30 mm, preferably greater than or equal to 3 mm and less than or equal to 10 mm. The exterior body of the secondary battery is formed of one or two films; in the case of a secondary battery having a layered structure, a cross-sectional structure of the bent battery is sandwiched between two curves of the film serving as the exterior body.

A conductor sheet such as metal foil can be used as the positive electrode current collector and the negative electrode current collector.

The positive electrode active material layer contains a positive electrode active material. In addition, the positive electrode active material layer preferably contains a binder, a conductive additive, and the like.

As the positive electrode active material, a composite oxide with a layered rock-salt crystal structure or a spinel crystal structure can be used, for example. Alternatively, a polyanionic positive electrode material can be used as the positive electrode active material, for example. Examples of the polyanionic positive electrode material include a material with an olivine crystal structure and a material with a NASICON structure. Alternatively, a positive electrode material containing sulfur can be used as the positive electrode active material, for example.

As the positive electrode active material, various composite oxides can be used. For example, a compound such as $LiFeO_2$, $LiCoO_2$, $LiNi_2$, $LiMn_2O_4$, $Li_2MnO_3$, $V_2O_5$, $Cr_2O_5$, or $MnO_2$ can be used.

As the material with a layered rock-salt crystal structure, for example, a composite oxide represented by $LiMO_2$ can be used. The element M is preferably one or more elements selected from Co and Ni. $LiCoO_2$ is preferable because it has high capacity, stability in the air, and thermal stability to a certain extent, for example. As the element M, one or more elements selected from Al and Mn may be included in addition to one or more elements selected from Co and Ni.

As the material with a spinel crystal structure, for example, a composite oxide represented by $LiM_2O_4$ can be used. It is preferable to contain Mn as the element M. For example, $LiMn_2O_4$ can be used. It is preferable to contain Ni in addition to Mn as the element M because the discharge voltage and the energy density of the secondary battery are improved in some cases. It is preferable to add a small amount of lithium nickel oxide ($LiNiO_2$ or $LiNi_{1-x}MxO_2$ (M=Co, Al, or the like)) to a lithium-containing material with a spinel crystal structure which contains manganese, such as $LiMn_2O_4$, because the characteristics of the secondary battery can be improved.

A layer containing one or more of an oxide and a fluoride may be provided on a surface of the positive electrode active material. The oxide may have a composition different from that of the positive electrode active material. The oxide may have the same composition as the positive electrode active material.

As the polyanionic positive electrode material, for example, a composite oxide containing oxygen, an element X, a metal A, and a metal M can be used. The metal M is one or more of Fe, Mn. Co, Ni, Ti, V, and Nb, the metal A is one or more of Li, Na, and Mg, and the element X is one or more of S, P, Mo, W, As, and Si.

As the material with an olivine crystal structure, for example, a composite material (general formula $LiMPO_4$ (M is one or more of Fe(II), Mn(II), Co(II), and Ni(II))) can be used. Typical examples of the general formula $LiMPO_4$ include lithium compounds such as $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1).

Alternatively, a composite material such as general formula $Li_{(2-j)}MSiO_4$ (M is one or more of Fe(II), Mn(II), Co(II), and Ni(II): 0≤j≤2) can be used. Typical examples of the general formula $Li_{(2-j)}MSiO_4$ include lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ (k+l≤1, 0<k<1, and 0<l<1), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ (m+n+q≤1, 0<m<1, 0<n<1, and 0<q<1), and $Li_{(2-j)}Fe_rNi_sCo_tMnSiO_4$ (r+s+t+u≤1, 0<r<1, 0<s<1, 0<t<1, and 0<u<1).

Still alternatively, a NASICON compound represented by a general formula $A_xM_2(XO_4)_3$ (A=Li, Na, or Mg, M=Fe, Mn, Ti, V, or Nb, X=S, P, Mo, W, As, or Si) can be used. Examples of the NASICON compound include $Fe_2(MnO_4)_3$, $Fe_2(SO_4)_3$, and $Li_3Fe_2(PO_4)_3$. Further alternatively, a compound represented by a general formula $Li_2MPO_4F$, $Li_2MP_2O_7$, or $LiMO_4$ (M=Fe or Mn) can be used as the positive electrode active material.

Further alternatively, a polyanionic positive electrode material containing V can be used.

Further alternatively, a perovskite fluoride such as $NaFeF_3$ and $FeF_3$, a metal chalcogenide (a sulfide, a selenide, or a telluride) such as $TiS_2$ and $MoS_2$, an oxide with an inverse spine crystal structure such as $LiMVO_4$, a vanadium oxide ($V_2O_5$, $V_6O_{13}$, $LiV_3O_8$, or the like), a manganese oxide, an organic sulfur compound, or the like can be used as the positive electrode active material.

Alternatively, a borate-based positive electrode material represented by a general formula $LiMBO_3$ (M is Fe(II), Mn(II), or Co(II)) can be used as the positive electrode active material.

The negative electrode active material layer contains a negative electrode active material. In addition, the negative electrode active material layer preferably contains a binder, a conductive additive, and the like.

As the negative electrode active material, for example, a carbon-based material, an alloy-based material, or the like can be used. As the carbon-based material, graphite, graphitizing carbon (soft carbon), non-graphitizing carbon (hard carbon), a carbon nanotube, graphene, carbon black, and the like can be used. Examples of graphite include artificial graphite and natural graphite. Examples of artificial graphite include meso-carbon microbeads (MCMB), coke-based artificial graphite, and pitch-based artificial graphite. As artificial graphite, spherical graphite having a spherical shape can be used. For example, MCMB is preferably used because it may have a spherical shape. Moreover, MCMB is sometimes preferable because it can relatively easily have a small surface area. Examples of natural graphite include flake graphite and spherical natural graphite.

For the negative electrode active material, an element that enables charge-discharge reactions by an alloying reaction and a dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon; in particular, silicon has a high theoretical capacity of 4200 mAh/g. For this reason, silicon is preferably used as the negative electrode active material. Alternatively, a compound containing any of the above elements may be used. Examples of the compound include $SiO$, $Mg_2Si$, $Mg_2Ge$, $SnO$, $SnO_2$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, $InSb$, and $SbSn$. Here, an element that enables charge-discharge reactions by an alloying reaction and a dealloying reaction with lithium, a compound containing the element, and the like may be referred to as an alloy-based material.

Furthermore, the negative electrode active material of one embodiment of the present invention may contain silicon, lithium, and oxygen. For example, silicon and lithium silicon oxide positioned outside the silicon may be contained.

Alternatively, for the negative electrode active material, an oxide such as titanium dioxide ($TiO_2$), lithium titanium oxide ($Li_4Ti_5O_2$), lithium-graphite intercalation compound ($Li_xC_6$), niobium pentoxide ($Nb_2O_5$), tungsten oxide ($WO_2$), or molybdenum oxide ($MoO_2$) can be used.

Alternatively, a material that causes a conversion reaction can be used for the negative electrode active material. For example, a transition metal oxide that does not form an alloy with lithium, such as cobalt oxide (CoO), nickel oxide (NiO), and iron oxide (FeO), may be used for the negative electrode active material. Other examples of the material that causes a conversion reaction include oxides such as $Fe_2O_3$, $CuO$, $Cu_2O$, $RuO_2$, and $Cr_2O_3$, sulfides such as $CoS_{0.89}$, $NiS$, and $CuS$, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$.

Next, a variety of examples of the stack of the positive electrode, the negative electrode, and the separator will be described.

Figure 21A:
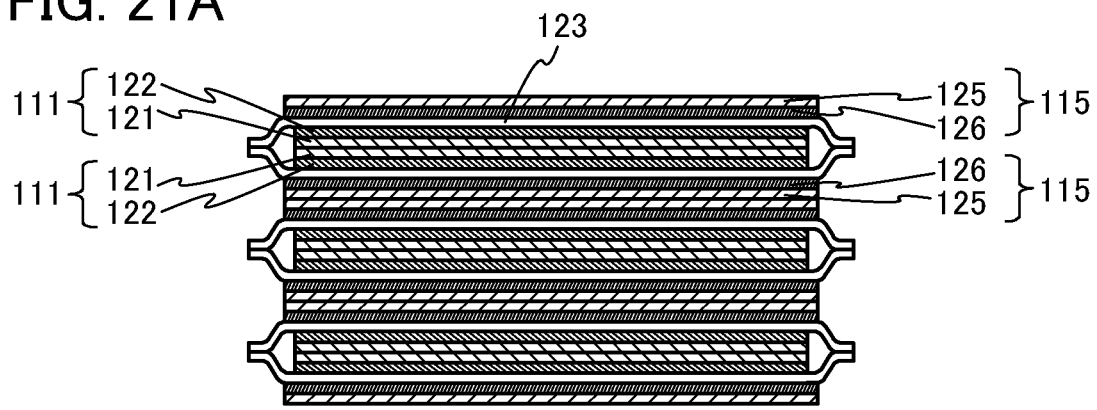
FIG. 21 Diagrams each showing part of a cross section of a storage battery.

FIG. 21(A) shows an example in which six positive electrodes 111 and six negative electrodes 115 are stacked. One surface of a positive electrode current collector 121 included in the positive electrode 111 is provided with a positive electrode active material layer 122. One surface of a negative electrode current collector 125 included in the negative electrode 115 is provided with a negative electrode active material layer 126.

In the structure shown in FIG. 21(A), the positive electrodes 111 and the negative electrodes 115 are stacked such that surfaces of the positive electrodes 111 on each of which the positive electrode active material layer 122 is not provided are in contact with each other and that surfaces of the negative electrodes 115 on each of which the negative electrode active material layer 126 is not provided are in contact with each other With this stacking order, contact surfaces between metals, such as a contact surface between the surfaces of the positive electrodes 111 on each of which the positive electrode active material layer 122 is not provided and a contact surface between the surfaces of the negative electrodes 115 on each of which the negative electrode active material layer 126 is not provided, can be formed. The coefficient of friction of the contact surface between metals can be lower than that of a contact surface between the active material and the separator.

Therefore, when the secondary battery is bent, the surfaces of the positive electrodes 111 on each of which the positive electrode active material layer 122 is not provided slide on each other, and the surfaces of the negative electrodes 115 on each of which the negative electrode active material layer 126 is not provided slide on each other; thus, the stress due to the difference between the inner diameter and the outer diameter of a bent portion can be relieved. Here, the inner diameter of the bent portion refers to the radius of curvature of the inner surface of the bent portion in the exterior body 509 of the storage battery 500 in the case where the storage battery 500 is bent, for example. Therefore, the deterioration of the storage battery 500 can be inhibited. Furthermore, the storage battery 500 can have high reliability.

Figure 21B:
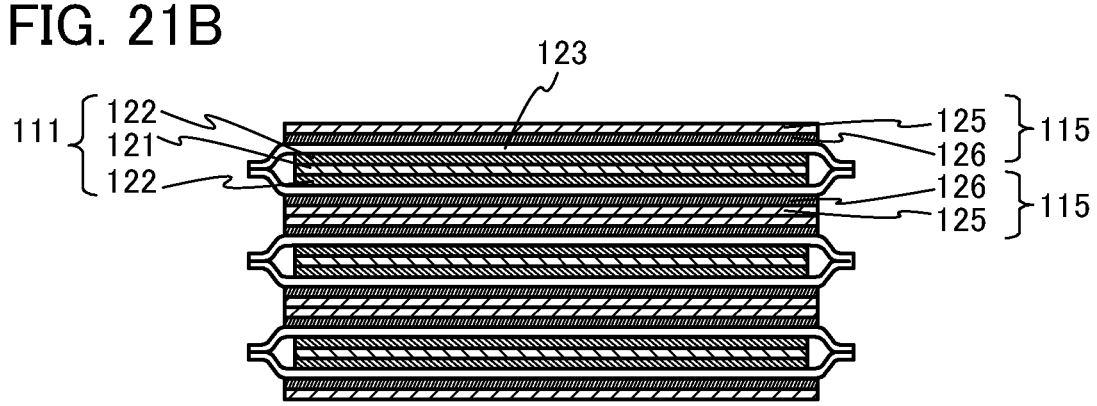

FIG. 21(B) shows an example of a stack of the positive electrodes Ill and the negative electrodes 115, which is different from that in FIG. 21(A). The structure shown in FIG. 21(B) is different from the structure shown in FIG. 21(A) in that the positive electrode active material layers 122 are provided on both surfaces of the positive electrode current collector 121. When the positive electrode active material layers 122 are provided on both surfaces of the positive electrode current collector 121 as shown in FIG. 21(B), the capacity per unit volume of the storage battery 500 can be increased.

Figure 21C:
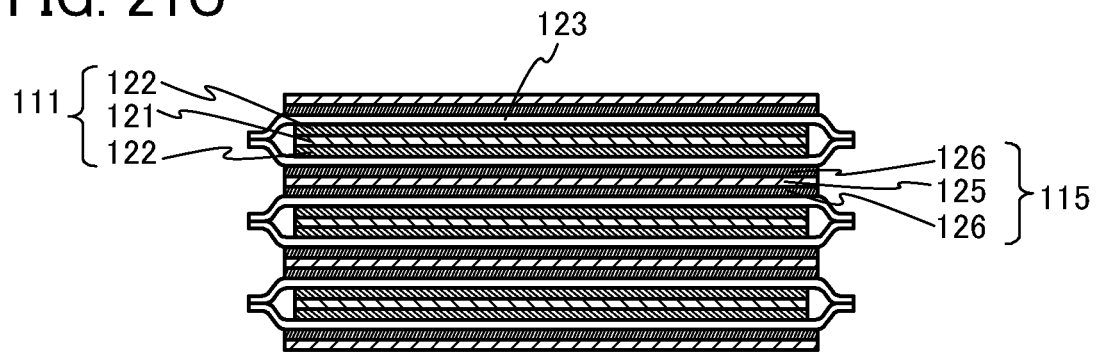

FIG. 21(C) shows an example of a stack of the positive electrodes 111 and the negative electrodes 115, which is different from that in FIG. 21(B). The structure shown in FIG. 21(C) is different from the structure shown in FIG. 21(B) in that the negative electrode active material layers 126 are provided on both surfaces of the negative electrode current collector 125. When the negative electrode active material layers 126 are provided on both surfaces of the negative electrode current collector 125 as shown in FIG. 21(C), the capacity per unit volume of the storage battery 500 can be further increased.

Figure 22A:
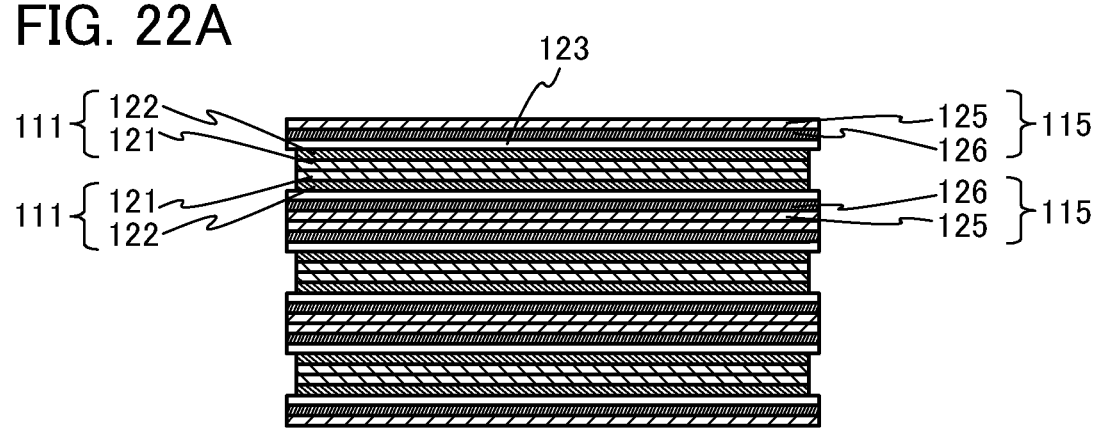
FIG. 22 Diagrams each showing part of a cross section of a storage battery.

In the structures shown in FIG. 21, a bag-like separator 123 surrounds the positive electrodes 111; however, the present invention is not limited thereto. FIG. 22(A) shows an example in which the separator 123 has a structure different from that in FIG. 21(A). The structure shown in FIG. 22(A) is different from the structure shown in FIG. 21(A) in that a sheet-like separator 123 is provided between every pair of the positive electrode active material layer 122 and the negative electrode active material layer 126. In the structure shown in FIG. 22(A), six positive electrodes 111 and six negative electrodes 115 are stacked, and six separators 123 are provided.

Figure 22B:
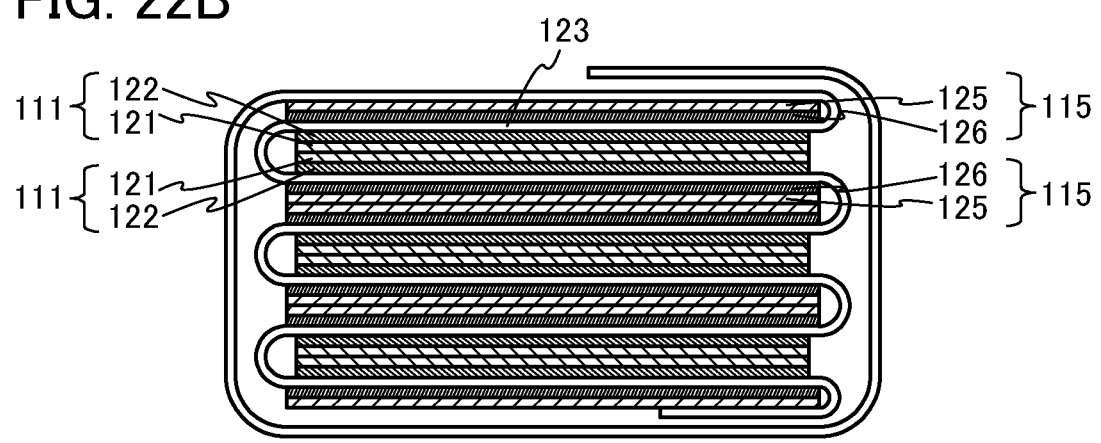

FIG. 22(B) shows an example in which the separator 123 different from that in FIG. 22(A) is provided. The structure shown in FIG. 22(B) is different from the structure shown in FIG. 22(A) in that one sheet of separator 123 is folded more than once to be interposed between every pair of the positive electrode active material layer 122 and the negative electrode active material layer 126. The structure in FIG. 22(B) can be regarded as a structure in which the separators 123 in the respective layers which are shown in FIG. 22(A) are extended and connected together between the layers. In the structure shown in FIG. 22(B), six positive electrodes 111 and six negative electrodes 115 are stacked and the separator 123 is folded at least five times. The separator 123 is not necessarily provided so as to be interposed between every pair of the positive electrode active material layer 122 and the negative electrode active material layer 126, and the plurality of positive electrodes 111 and the plurality of negative electrodes 115 may be bound together by extending the separator 123.

Figure 23A:
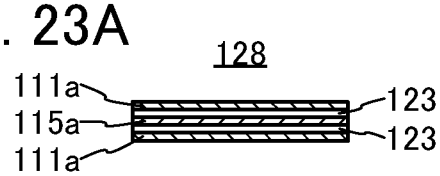
FIG. 23 Diagrams each showing part of a cross section of a storage battery.
Figure 23B:
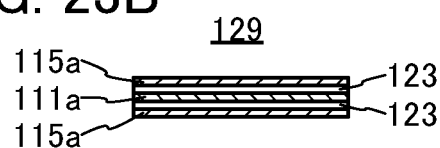
Figure 23C:
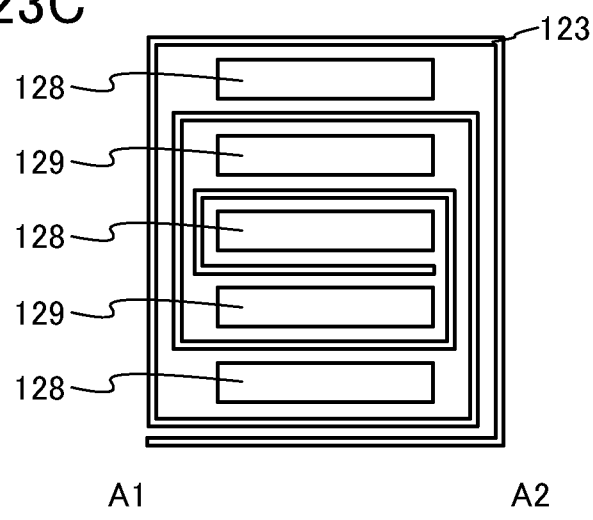

Note that the positive electrode, the negative electrode, and the separator may be stacked as shown in FIG. 23. FIG. 23(A) and FIG. 23(B) are cross-sectional views of a first electrode assembly 128 and a second electrode assembly 129, respectively. FIG. 23(C) is a cross-sectional view along the dashed-dotted line A1-A2 in FIG. 19(A). In FIG. 23(C), the first electrode assembly 128, the second electrode assembly 129, and the separator 123 are selectively shown for the sake of clarity of the drawing.

As shown in FIG. 23(C), the storage battery 500 includes a plurality of first electrode assemblies 128 and a plurality of second electrode assemblies 129.

As shown in FIG. 23(A), in each of the first electrode assemblies 128, a positive electrode 111a including the positive electrode active material layers 122 on both surfaces of the positive electrode current collector 121, the separator 123, a negative electrode 115a including the negative electrode active material layers 126 on both surfaces of the negative electrode current collector 125, the separator 123, and the positive electrode 111a including the positive electrode active material layers 122 on both surfaces of the positive electrode current collector 121 are stacked in this order. As shown in FIG. 23(B), in each of the second electrode assemblies 129, the negative electrode 115a including the negative electrode active material layers 126 on both surfaces of the negative electrode current collector 125, the separator 123, the positive electrode 111a including the positive electrode active material layers 122 on both surfaces of the positive electrode current collector 121, the separator 123, and the negative electrode 115a including the negative electrode active material layers 126 on both surfaces of the negative electrode current collector 125 are stacked in this order.

As shown in FIG. 23(C), the plurality of first electrode assemblies 128 and the plurality of second electrode assemblies 129 are covered with the wound separator 123.

<System Using Storage Battery Stored in Battery Can>

Figure 24A:
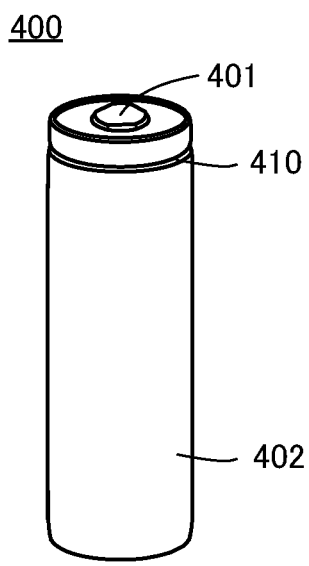
FIG. 24 Diagrams showing a cylindrical storage battery and diagrams showing a module including a storage battery.

Next, an example of a cylindrical storage battery will be described with reference to FIG. 24. As shown in FIG. 24(A), a cylindrical storage battery 400 includes a positive electrode cap (battery lid) 401 on the top surface and a battery can (outer can) 402 on the side surface and bottom surface. The positive electrode cap 401 and the battery can (outer can) 402 are insulated from each other by a gasket (insulating packing) 410.

Figure 24B:
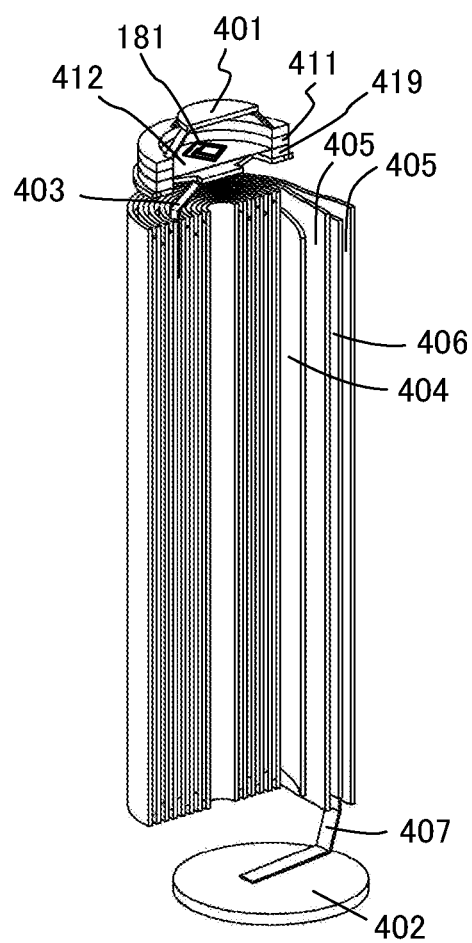

FIG. 24(B) is a diagram schematically showing a cross section of the cylindrical storage battery 400. In order that the internal structure can be described, only the bottom surface is shown as for the battery can 402. Inside the battery can 402 having a hollow cylindrical shape, a battery element in which a strip-like positive electrode 404 and a strip-like negative electrode 406 are wound with a separator 405 located therebetween is provided. For the battery can 402, a metal having a corrosion-resistant property to an electrolyte solution, such as nickel, aluminum, or titanium, an alloy of such a metal, or an alloy of such a metal and another metal (e.g., stainless steel) can be used. The battery can 402 is preferably covered with nickel, aluminum, or the like in order to prevent corrosion due to the electrolyte solution. Furthermore, a nonaqueous electrolyte solution (not illustrated) is injected inside the battery can 402 provided with the battery element. For the nonaqueous electrolyte solution, the positive electrode, the negative electrode, and the separator, refer to the description of the laminated storage battery.

Since the positive electrode and the negative electrode used in the cylindrical storage batten are wound, active materials are preferably formed on both surfaces of the current collectors. A positive electrode terminal (positive electrode current collecting lead) 403 is connected to the positive electrode 404, and a negative electrode terminal (negative electrode current collecting lead) 407 is connected to the negative electrode 406. Both the positive electrode terminal 403 and the negative electrode terminal 407 can be formed using a metal material such as aluminum. The negative electrode terminal 407 is welded to the bottom of the battery can 402. The positive electrode terminal 403 is welded to a conductive plate 419 and is electrically connected to the positive electrode cap 401 through an explosion-proof plate 412 and a PTC (Positive Temperature Coefficient) element 411. The sensor chip 181 is provided over the explosion-proof plate 412. The sensor element 174 included in the sensor chip 181 senses the deformation of the explosion-proof plate 412. The shape of the explosion-proof plate 412 is sometimes changed when the internal pressure increases because of gas generation in the cylindrical storage battery 400, for example. The PTC element 411, which serves as a thermally sensitive resistor whose resistance increases as temperature rises, limits the amount of current by increasing the resistance, in order to prevent abnormal heat generation. Barium titanate ($BaTiO_3$)-based semiconductor ceramic or the like can be used for the PTC element 411. A material containing carbon, such as a material in which conductive carbon is mixed with a polymer such as polyethylene, may also be used for the PTC element 411. Note that the PTC element 411 may be provided in the sensor element 174.

Figure 24C:
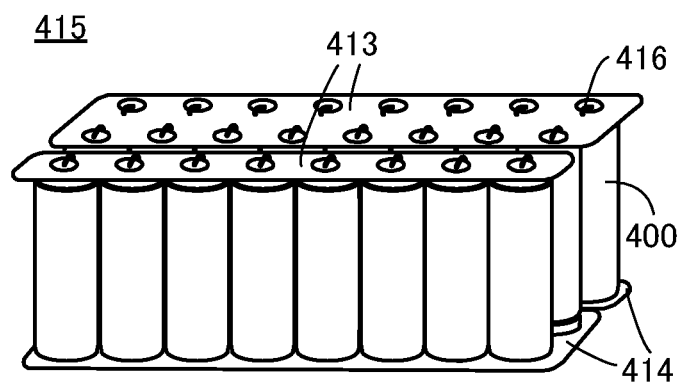

As shown in FIG. 24(C), a plurality of storage batteries 400 may be sandwiched between a conductive plate 413 and a conductive plate 414 to form a module 415. The plurality of storage batteries 400 are electrically connected to the conductive plate 413 and the conductive plate 414 through a wiring 416. The plurality of storage batteries 400 may be connected in parallel, connected in series, or connected in series after being connected in parallel. With the module 415 including the plurality of storage batteries 400, large electric power can be extracted.

Figure 24D:
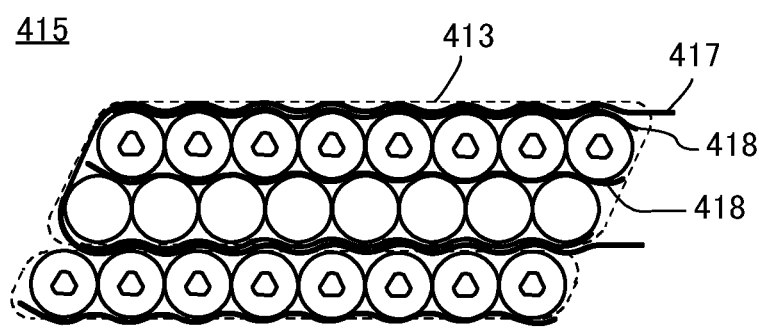

FIG. 24(D) is a top view of the module 415. The conductive plate 413 is shown by a dotted line for clarity of the drawing. As shown in FIG. 24(D), a temperature control device 417 may be provided between the plurality of storage batteries 400. When the storage batteries 400 are overheated, the temperature control device 417 can cool them, and when the storage batteries 400 are cooled too much, the temperature control device 417 can heat them. Thus, the performance of the module 415 is not easily influenced by the outside air temperature. Furthermore, a cushioning material 418 can be provided between the plurality of storage batteries 400 and between the temperature control device 417 and the storage batteries 400. Providing the cushioning material 418 can prevent the storage batteries 400 from being in contact with each other or can prevent the temperature control device 417 from being in contact with the storage batteries 400, which can prevent damage to the battery can 402, the temperature control device 417, and the like.

When the positive electrode active material described in the above embodiment is used in the positive electrode 404, the cylindrical storage battery 400 with high capacity and excellent cycle performance can be obtained.

Although FIG. 24 shows an example in which the storage battery is stored in the cylindrical battery can, the storage battery of one embodiment of the present invention may be stored in a rectangular or coin-type battery can, for example.

This embodiment can be implemented in appropriate combination with any of the other embodiments.

Embodiment 3

In this embodiment, a structure example of a semiconductor device that can be used in the neural network described in the above embodiment is described.

Figure 25A:
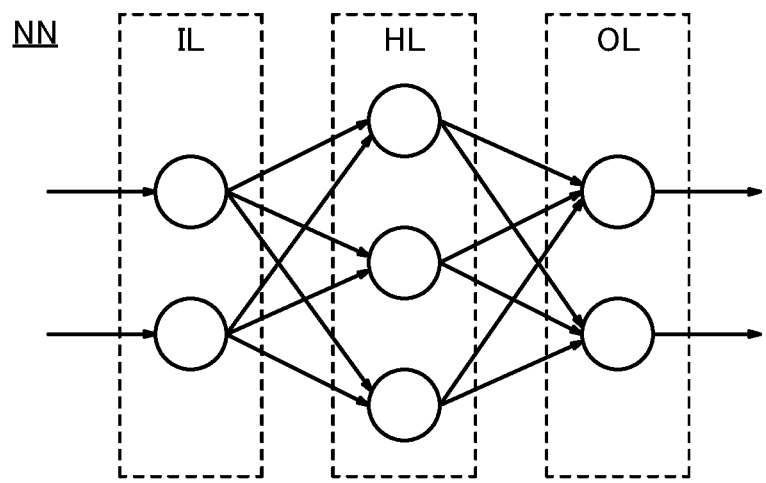
FIG. 25 Diagrams showing a structure example of a neural network.

As shown in FIG. 25(A), the neural network NN can be formed of the input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network), and learning using a deep neural network can also be referred to as deep learning.

Input data is input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 25B:
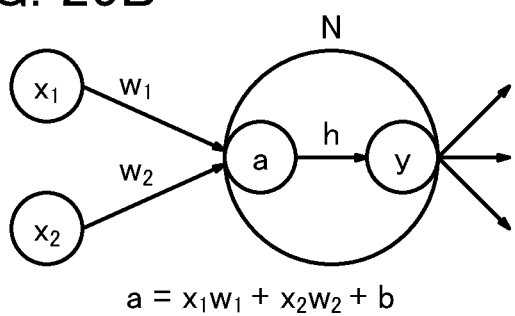

FIG. 25(B) shows an example of an operation with the neurons. Here, a neuron N and two neurons in the previous layer that output signals to the neuron N are shown. An output $x_1$ of the neuron in the previous layer and an output $x_2$ of the neuron in the previous layer are input to the neuron N. Then, in the neuron N, a total sum $x_1w_1+x_2w_2$ of the product of the output $x_1$ and a weight $w_1$ ($x_1w_1$) and the product of the output $x_2$ and a weight $w_2$ ($x_2w_2$) is calculated, and then a bias b is added as necessary, so that a value $a=x_1w_1+x_2w_2+b$ is obtained. Then, the value a is converted with an activation function h, and an output signal $y=h(a)$ is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. In the case where the product-sum operation is performed using hardware, a product-sum operation circuit can be used. Either a digital circuit or an analog circuit may be used as this product-sum operation circuit. When an analog circuit is used as the product-sum operation circuit, the circuit scale of the product-sum operation circuit can be reduced, or higher processing speed and lower power consumption can be achieved owing to reduced frequency of access to a memory.

The product-sum operation circuit may be formed using a transistor including silicon (such as single crystal silicon) in a channel formation region (hereinafter, also referred to as a Si transistor) or may be formed using a transistor including an oxide semiconductor in a channel formation region (hereinafter, also referred to as an OS transistor). An OS transistor is particularly suitable as a transistor included in a memory of the product-sum operation circuit because of its extremely low off-state current. Note that the product-sum operation circuit may be formed using both a Si transistor and an OS transistor. A structure example of a semiconductor device having a function of the product-sum operation circuit is described below.

Structure Example of Semiconductor Device

Figure 26:
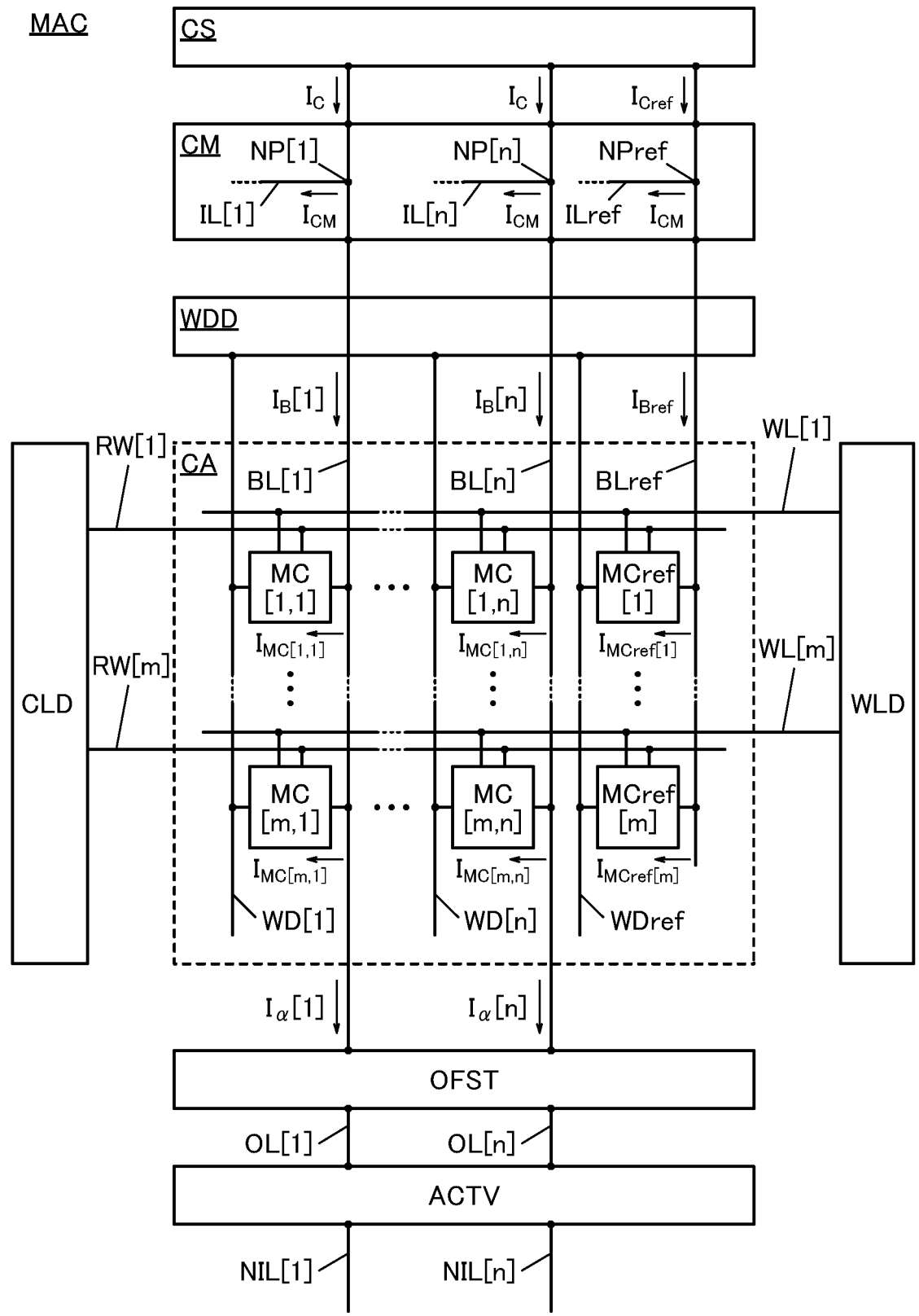
FIG. 26 A diagram showing a structure example of a semiconductor device.

FIG. 26 shows a structure example of a semiconductor device MAC having a function of performing an operation of a neural network. The semiconductor device MAC has a function of performing a product-sum operation of first data corresponding to the connection strength between the neurons (weight) and second data corresponding to input data. Note that the first data and the second data can each be analog data or multilevel digital data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the structure example shown in FIG. 26, the cell array CA includes memory cells MC (MC[1, 1] to MC[m, n]) in m rows and n columns (m and n are integers greater than or equal to 1) and them memory cells MCref (MCref[1] to MCref[m]). The memory cells MC have a function of storing the first data. In addition, the memory cells MCref have a function of storing reference data used for the product-sum operation. Note that the reference data can be analog data or multilevel digital data.

The memory cell MC[i,j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i,j]}$, and a current flowing between the memory cell MCref[i] and the wiring BLref is denoted by $I_{MCref[i]}$.

Figure 27:
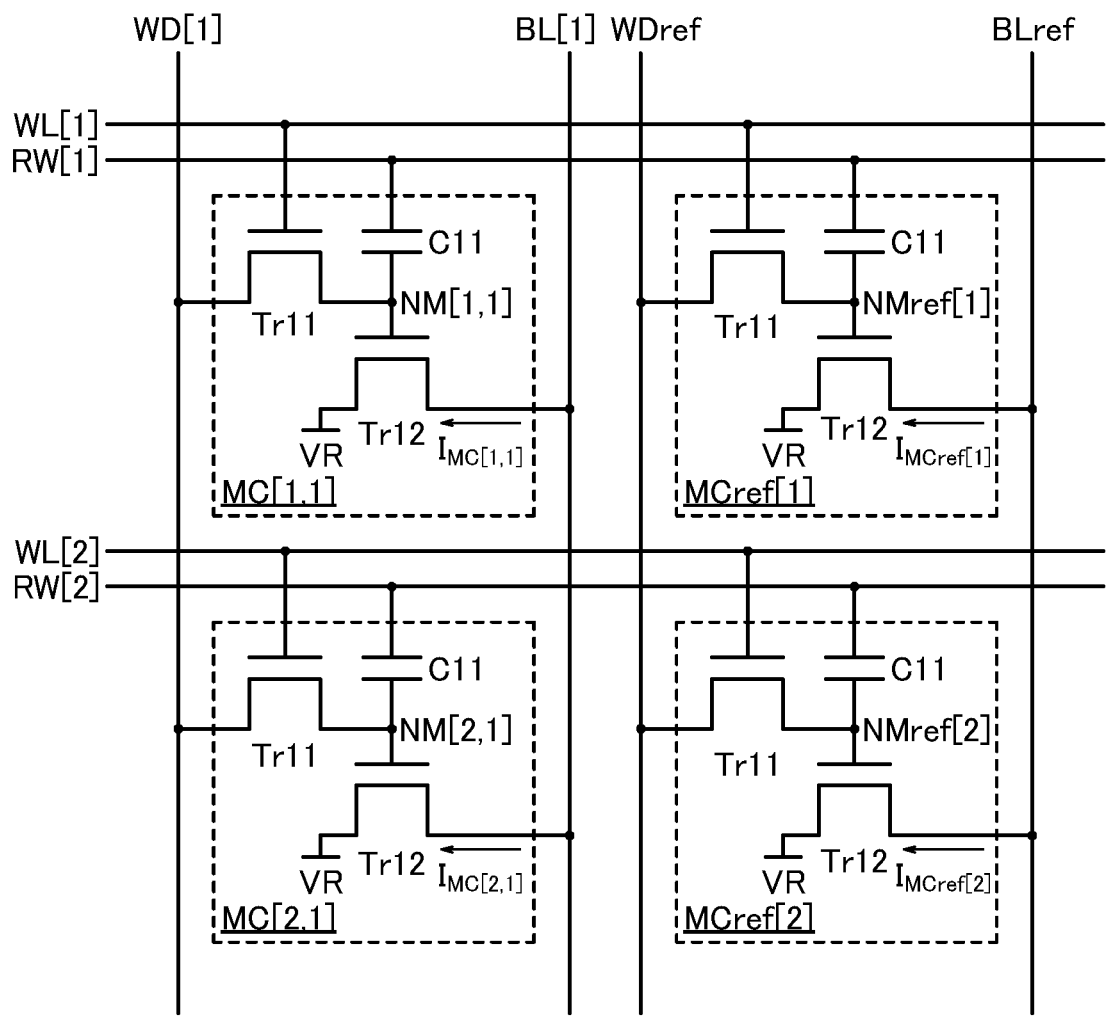
FIG. 27 A diagram showing structure examples of memory cells.

FIG. 27 shows a specific structure example of the memory cells MC and the memory cells MCref. Although the memory cells MC[1, 1] and MC[2, 1] and the memory cells MCref[1] and MCref[2] are shown as typical examples in FIG. 27, similar structures can be used for other memory cells MC and memory cells MCref. The memory cells MC and the memory cells MCref each include transistors Tr11 and Tr12 and a capacitor C11. Here, the case where the transistor Tr11 and the transistor Tr2 are n-channel transistors is described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., aground potential) is supplied from the wiring VR is described as an example.

A node connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a structure similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The node NM and the node NMref function as holding nodes of the memory cell MC and the memory cell MCref, respectively. The first data is held in the node NM and the reference data is held in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding a potential of the node NM or the node NMref, the off-state current of the transistor Tr11 is preferably low. Thus, it is preferable to use an OS transistor, which has an extremely low off-state current, as the transistor Tr11. This can suppress a change in the potential of the node NM or the node NMref, so that the operation accuracy can be increased. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, portions where the wirings IL[1] to IL[n] are connected to the respective wirings BL[1] to BL[n] are referred to as nodes NP[1] to NP[n]. Furthermore, a portion where the wiring ILref is connected to the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example shown in FIG. 26, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cells MCref to the wiring WDref. The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of current flowing from the wirings BL[1] to BL[n] to the offset circuit OFST and/or the amount of change in the current flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 28:
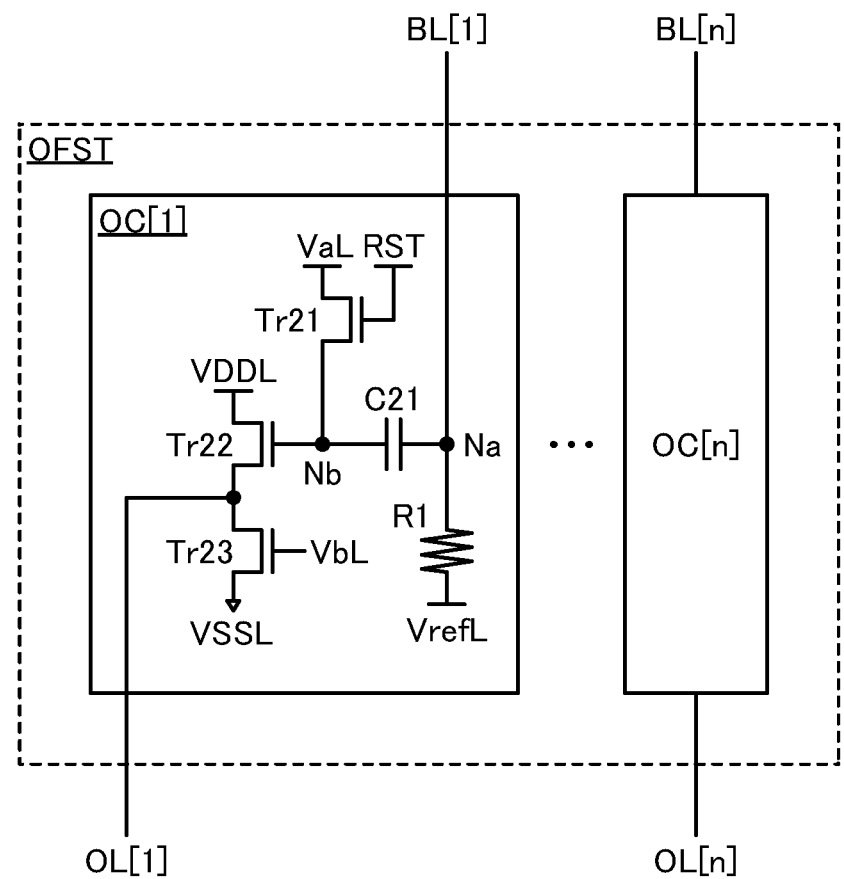
FIG. 28 A diagram showing a structure example of an offset circuit.

FIG. 28 shows a structure example of the offset circuit OFST. The offset circuit OFST shown in FIG. 28 includes circuits OC[1] to OC[n]. The circuits OC[1] to OC[n] each include a transistor Tr21, a transistor Tr22, a transistor Tr23, a capacitor C21, and a resistor R1. Connection relationships of the elements are shown in FIG. 28. Note that a node connected to a first electrode of the capacitor C21 and a first terminal of the resistor R1 is referred to as a node Na. In addition, anode connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power source potential and the potential VSS is a low power source potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] is described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1. At this time, the transistor Tr21 is in anon state, and thus the potential Va is supplied to the node Nb. Then, the transistor Tr21 is brought into an off state.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb changes because of capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. When the threshold voltage of the transistor Tr22 is $V_{th}$, a potential $Va+V_{Na}-V_{th}$ is output from the wiring OL[1]. Here, when $Va=V_{th}$, a potential $\Delta V_{Na}$ can be output from the wiring OL[1].

The potential $\Delta V_{Na}$ is determined by the amount of change from the first current to the second current, the resistance value of the resistor R1, and the potential Vref. Here, since the resistance value of the resistor R1 and the potential Vref are known, the amount of change in the current flowing to the wiring BL can be found from the potential $\Delta V_{Na}$.

A signal corresponding to the amount of current and/or the amount of change in the current detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with a predefined activation function. As the activation function, a sigmoid function, a tan h function, a softmax function, a ReLU function, a threshold function, or the like can be used, for example. The signal converted by the activation function circuit ACTV is output as output data to the wirings NIL[1] to NIL[n].

Operation Example of Semiconductor Device

The product-sum operation of the first data and the second data can be performed with the above semiconductor device MAC. An operation example of the semiconductor device MAC at the time of performing the product-sum operation is described below.

Figure 29:
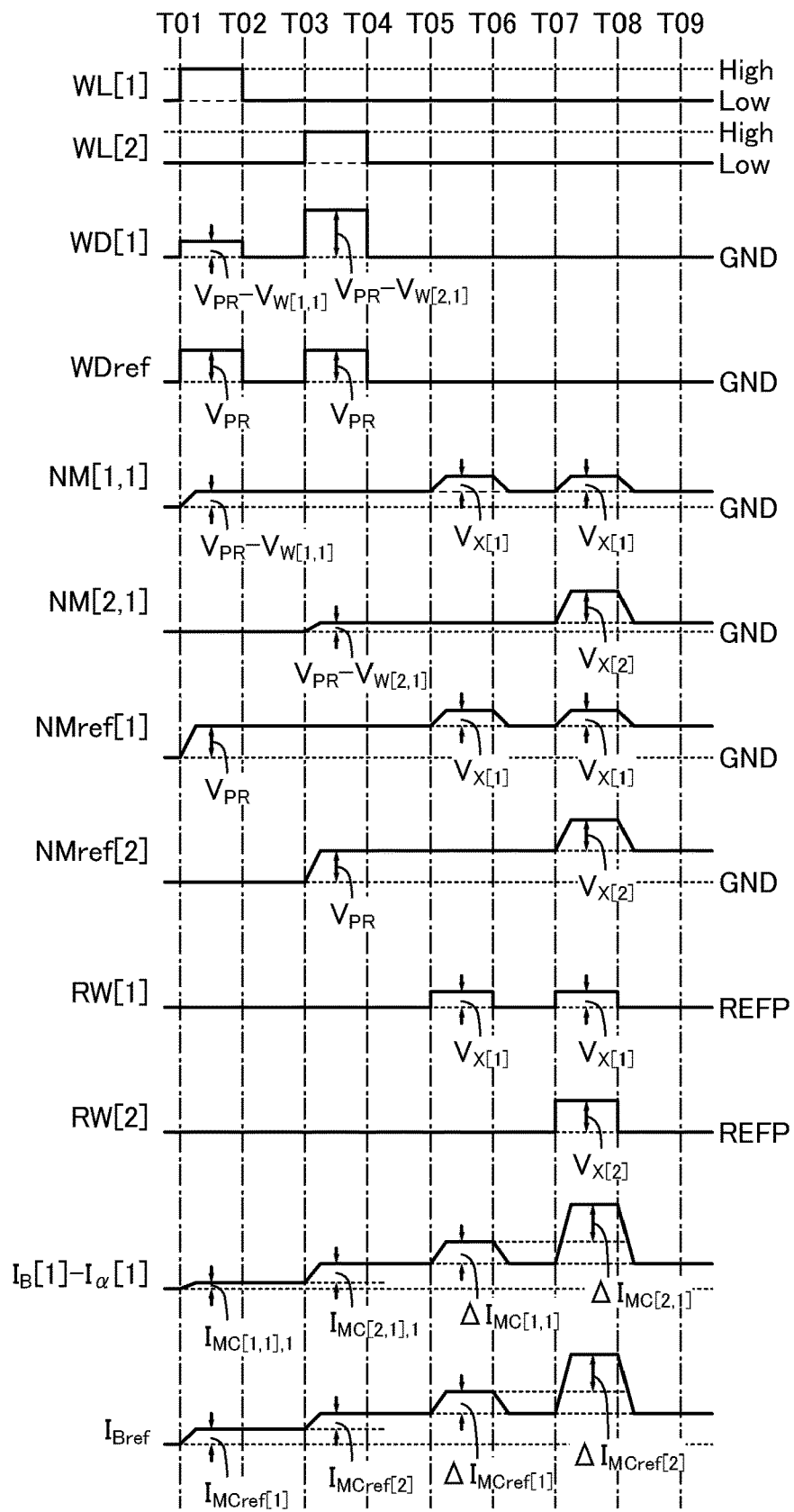
FIG. 29 A timing chart.

FIG. 29 shows a timing chart of the operation example of the semiconductor device MAC. FIG. 29 shows changes in the potentials of the wiring WL[1], the wiring WL[2], the wiring WD[1], and the wiring WDref, the node NM[1, 1], the node NM[2, 1], the node NMref[1], and the node NMref[2], and the wiring RW[1] and the wiring RW[2] in FIG. 27 and changes in the values of the current $I_B[1]-I_\alpha[1]$ and the current $I_{Bref}$. The current $I_B[1]-I_\alpha[1]$ corresponds to a total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] shown in FIG. 27 as a typical example, the other memory cells MC and the other memory cells MCref can also be operated in a similar manner.

[Storage of First Data]

First, from Time T01 to Time T02, the potential of the wiring WL[1] becomes a high level, the potential of the wiring WD[1] becomes a potential greater than a ground potential (GND) by $V_{PR}-V_{W[1,1]}$, and the potential of the wiring WDref becomes a potential greater than the ground potential by $V_{PR}$. The potentials of the wiring RW[1] and the wiring RW[2] become reference potentials (REFP). Note that the potential $V_{W[1,\ 1]}$ is the potential corresponding to the first data stored in the memory cell MC[1, 1]. The potential $V_{PR}$ is the potential corresponding to the reference data. Thus, the transistors Tr11 included in the memory cell MC[1, 1] and the memory cell MCref[1] are turned on, and the potential of the node NM[1, 1] and the potential of the node NMref[1] become $V_{PR}-V_{W[1,\ 1]}$ and $V_{PR}$, respectively.

In this case, a current $I_{MC[1,1],0}$ flowing from the wiring BL[1] to the transistor Tr12 in the memory cell MC[1, 1] can be expressed by the formula shown below. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1,1],0}=k(V_{PR}-V_{W[1,1]}-V_{th})^2 \quad (E1)$$

Furthermore, a current $I_{MCref[1],\ 0}$ flowing from the wiring BLref to the transistor Tr12 in the memory cell MCref[1] can be expressed by the formula shown below.

$$I_{MCref[1],0}=k(V_{PR}-V_{th})^2 \quad (E2)$$

Next, from Time T02 to Time T03, the potential of the wiring WL[1] becomes a low level. Consequently, the transistors Tr11 included in the memory cell MC[1, 1] and the memory cell MCref[1] are turned off, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, from Time T03 to Time T04, the potential of the wiring WL[2] becomes the high level, the potential of the wiring WD[1] becomes a potential greater than the ground potential by $V_{PR}-V_{W[2,\ 1]}$, and the potential of the wiring WDref becomes a potential greater than the ground potential by $V_{PR}$. Note that the potential $V_{W[2,\ 1]}$ is a potential corresponding to the first data stored in the memory cell MC[2, 1]. Thus, the transistors Tr11 included in the memory cell MC[2, 1] and the memory cell MCref[2] are turned on, and the potentials of the node NM[2, 1] and the node NMref[2] become $V_{PR}-V_{W[2,1]}$ and $V_{PR}$, respectively.

Here, a current $I_{MC[2,\ 1],\ 0}$ flowing from the wiring BL[1] to the transistor Tr12 in the memory cell MC[2, 1] can be expressed by the formula shown below.

$$I_{MC[2,1],0}=k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by the formula shown below.

$$I_{MCref[2],0}=k(V_{PR}-V_{th})^2 \quad (E4)$$

Next, from Time T04 to Time T05, the potential of the wiring WL[2] becomes the low level. Consequently, the transistors Tr11 included in the memory cell MC[2, 1] and the memory cell MCref[2] are turned off, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. A current is supplied from the current source circuit CS to the wiring BLref. The current flowing through the wiring BLref is discharged to the current mirror circuit CM and the memory cells MCref[1] and MCref[2]. The formula shown below holds where $I_{Cref}$ is the current supplied from the current source circuit CS to the wiring BLref and $I_{CM, 0}$ is the current discharged from the wiring BLref to the current mirror circuit CM.

$$I_{Cref}-I_{CM,0}=I_{MCref[1],0}+I_{MCref[2],0} \quad (E5)$$

A current is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{C, 0}$ is the current supplied from the current source circuit CS to the wiring BL[1] and $I_{\alpha, 0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, from Time T05 to Time T06, the potential of the wiring RW[ ] becomes a potential greater than the reference potential by $V_{X[1]}$. At this time, the potential $V_{X[1]}$ is supplied to the capacitors C11 in the memory cell MC[1, 1] and the memory cell MCref[1], so that the potentials of the gates of the transistors Tr12 increase owing to capacitive coupling. Note that the potential $V_{X[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell structure. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_X$ can be determined in consideration of the capacitive coupling coefficient.

When the potential $V_{X[1]}$ is supplied to the capacitors C11 in the memory cell MC[1, 1] and the memory cell MCref[1], the potentials of the node NM[1, 1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to Time T06 can be expressed by the formula shown below.

$$I_{MC[1,1],1}=k(V_{PR}-V_{W[1,1]}+V_{X[1]}-V_{th})^2 \quad (E7)$$

That is, when the potential $V_{X[1]}$ is supplied to the wiring RW[1], the current flowing from the wiring BL[1] to the transistor Tr12 in the memory cell MC[1, 1] increases by $\Delta I_{MC[1, 1]}=I_{MC[1, 1],1}-I_{MC[1,1], 0}$.

A current $I_{MCref[1], 1}$ flowing from the wiring BLref to the transistor Tr12 in the memory cell MCref[1] from Time T05 to Time T06 can be expressed by the formula shown below.

$$I_{MCref[1],1}=k(V_{PR}+V_{X[1]}-V_{th})^2 \quad (E8)$$

That is, when the potential $V_{X[1]}$ is supplied to the wiring RW[1], the current flowing from the wiring BLref to the transistor Tr12 in the memory cell MCref[1] increases by $\Delta I_{MCref}[1]=I_{MCref[1], 1}-I_{MCref[1], 0}$.

Furthermore, currents flowing through the wiring BL[1] and the wiring BLref are considered. A current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 1}$ is the current discharged from the wiring BLref to the current mirror circuit CM.

$$I_{Cref}-I_{CM,1}=I_{MCref[1],1}+I_{MCref[2],1} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 1}$ is the current flowing from the wiring BL[1] to the offset circuit OFST.

$$I_C-I_{CM,1}=I_{MC[1,1],1}+I_{MC[2,1],1}+I_{\alpha,1} \quad (E10)$$

In addition, from the formula (E1) to the formula (E10), a difference between the current $I_{\alpha, 0}$ and the current $I_{\alpha,1}$ (differential current $\Delta I_\alpha$) can be expressed by the formula shown below.

$$\Delta I_\alpha=I_{\alpha,1}-I_{\alpha,0}=2kV_{W[1,1]}V_{X[1]} \quad (E11)$$

Thus, the differential current $\Delta I_\alpha$ is a value corresponding to the product of the potentials $V_{W[1, 1]}$ and $V_{X[1]}$.

After that, from Time T06 to Time T07, the potential of the wiring RW[1] becomes the reference potential, and the potentials of the node NM[1, 1] and the node NMref[1] become similar to the potentials thereof from Time T04 to Time T05.

Next, from Time T07 to Time T08, the potential of the wiring RW[1] becomes the potential greater than the reference potential by $V_{X[1]}$, and the potential of the wiring RW[2] becomes a potential greater than the reference potential by $V_{X[2]}$. Accordingly, the potential $V_{X[1]}$ is supplied to the capacitors C11 in the memory cell MC[1, 1] and the memory cell MCref[1], and the potentials of the node NM[1,1] and the node NMref[1] each increase by $V_{X[1]}$ due to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ due to capacitive coupling.

Here, the current $I_{MC[2,1], 1}$ flowing from the wiring BL[1] to the transistor Tr12 in the memory cell MC[2, 1] from Time T07 to Time T08 can be expressed by the formula shown below.

$$I_{MC[2,1],1}=k(V_{PR}-V_{W[2,1]}+V_{X[2]}-V_{th})^2 \quad (E12)$$

That is, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = I_{MC[2, 1], 1} - I_{MC[2,1], 0}$.

Here, a current $I_{MCref[2], 1}$ flowing from the wiring BLref to the transistor Tr12 in the memory cell MCref[2] from Time T07 to Time T08 can be expressed by the formula shown below.

$$I_{MCref[2],1} = k(V_{PR} + V_{X[2]} - V_{th})^2 \quad (E13)$$

That is, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ is supplied from the current source circuit CS to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 2}$ is the current flowing from the wiring BL[1] to the offset circuit OFST.

$$I_C - I_{CM,2} = I_{MC[1,1]} + I_{MC[2,1],1} + I_{\alpha,2} \quad (E15)$$

In addition, from the formula (E1) to the formula (E8) and the formula (E12) to the formula (E15), a difference between the current $I_{\alpha, 0}$ and the current $I_{\alpha, 2}$ (differential current $\Delta I_\alpha$) can be expressed by the formula shown below.

$$\Delta I_\alpha = I_{\alpha,2} - I_{\alpha,0} = 2k(V_{W[1,1]} V_{X[1]} + V_{W[2,1]} V_{X[2]}) \quad (E16)$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, from Time T08 to Time T09, the potentials of the wirings RW[1] and RW[2] become the reference potential, and the potentials of the nodes NM[1, 1] and NM[2, 1] and the nodes NMref[1] and NMref[2] become similar to the potentials thereof from Time T04 to Time T05.

As represented by the formula (E11) and the formula (E16), the differential current $\Delta I_\alpha$ input to the offset circuit OFST can be calculated from the formula including a product term of the potential $V_W$ corresponding to the first data (weight) and the potential $V_X$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be freely set. In the case where the number m of rows of the memory cells MC and the memory cells MCref is a given number i, the differential current $\Delta I_\alpha$ can be expressed by the formula shown below.

$$\Delta I_\alpha = 2k \Sigma_i V_{W[1,1]} V_{X[i]} \quad (E17)$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the structure of the memory cells MC and the memory cells MCref in FIG. 27 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL shown in FIG. 25(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation of the neural network can be performed using the semiconductor device MAC as described above. Furthermore, the memory cells MC and the memory cells MCref shown in FIG. 27 are used for the cell array CA, which can provide an integrated circuit with improved operation accuracy, lower power consumption, or a reduced circuit scale.

This embodiment can be combined with the description of the other embodiments as appropriate.

Embodiment 4

In this embodiment, an OS transistor of one embodiment of the present invention and a nonvolatile memory using the OS transistor are described.

An OS transistor will be described below.

A channel formation region of an OS transistor preferably includes a metal oxide. The metal oxide included in the channel formation region preferably contains indium (In). When the metal oxide included in the channel formation region is a metal oxide containing indium, the carrier mobility (electron mobility) of the OS transistor increases. The metal oxide included in the channel formation region is preferably an oxide semiconductor containing an element M. The element M is preferably aluminum (Al), gallium (Ga), tin (Sn), or the like. Other elements that can be used as the element M are boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that a plurality of the above-described elements may be used in combination as the element M. The element M is an element having high bonding energy with oxygen, for example. The element M is an element having higher bonding energy with oxygen than indium, for example. The metal oxide included in the channel formation region is preferably a metal oxide containing zinc (Zn). The metal oxide containing zinc is easily crystallized in some cases.

The metal oxide included in the channel formation region is not limited to a metal oxide containing indium. The semiconductor layer may be a metal oxide that does not contain indium and contains zinc, a metal oxide that contains gallium, or a metal oxide that contains tin, e.g., zinc tin oxide or gallium tin oxide.

<NOSRAM>

Figure 30A:
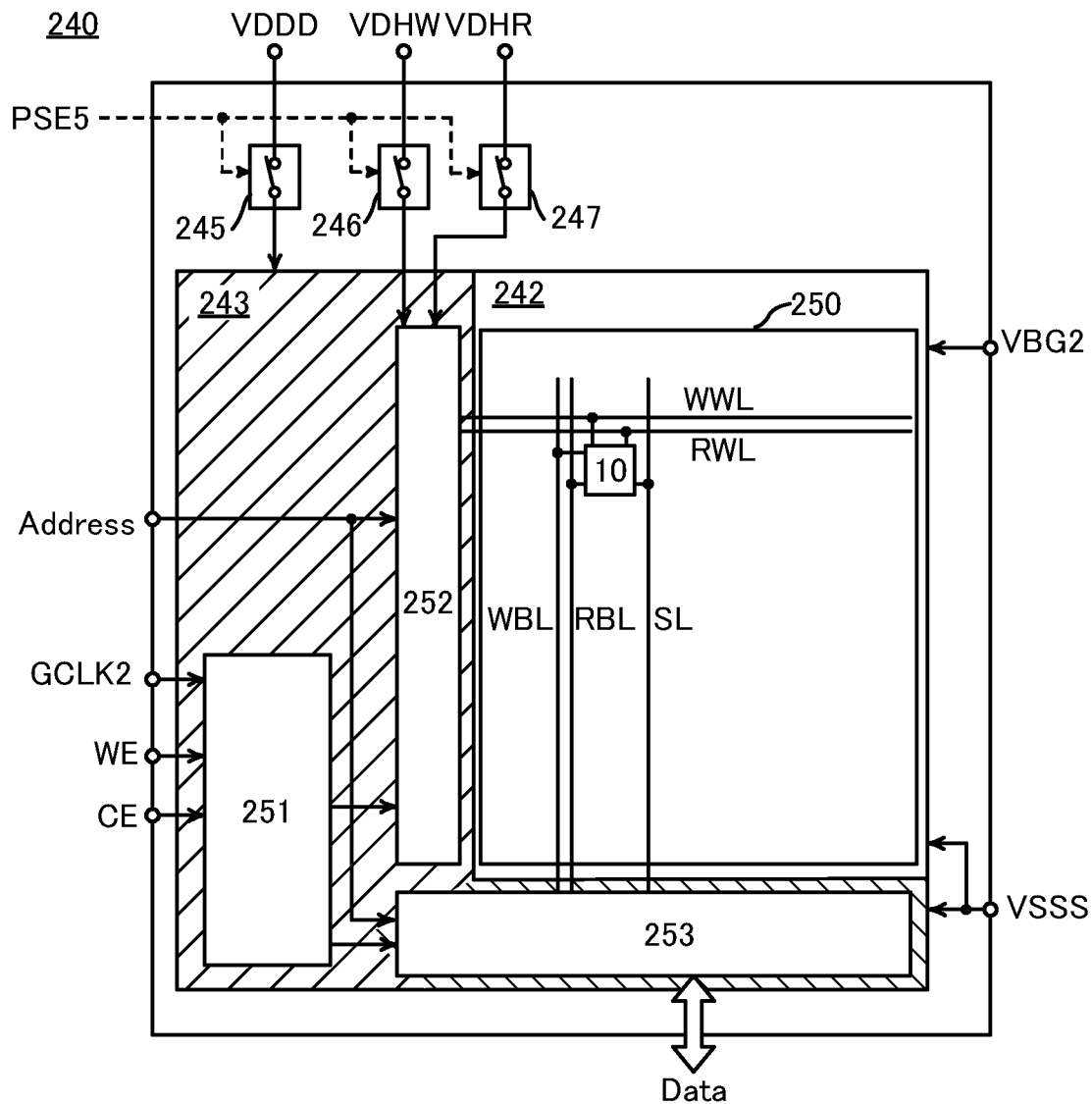
FIG. 30 A functional block diagram showing a structure example of a NOSRAM and a circuit diagram showing a structure example of a memory cell.

FIG. 30(A) is a block diagram showing a structure example of a NOSRAM. A NOSRAM 240 includes power domains 242 and 243 and power switches 245 to 247. A memory cell array 250 is provided in the power domain 242, and a peripheral circuit of the NOSRAM 240 is provided in the power domain 243. The peripheral circuit includes a control circuit 251, a row circuit 252, and a column circuit 253.

Voltages VDDD, VSSS, VDHW, VDHR, and VBG2, a clock signal GCLK2, an address signal (Address), and signals CE, WE, and PSE5 are input to the NOSRAM 240 from the outside. The signals CE and WE are a chip enable signal and a write enable signal, respectively. The signal PSE5 controls the on/off of the power switches 245 to 247. The power switches 245 to 247 control the input of the voltages VDDD, VDHW, and VDHR respectively, to the power domain 243.

Note that the voltages, signals, and the like input to the NOSRAM 240 are selected as appropriate in accordance with the circuit structure and the operation method of the NOSRAM 240. For example, in the NOSRAM 240, a power domain in which power gating is not performed may be provided and a power gating control circuit that generates the signal PSE5 may be provided.

The memory cell array 250 includes a memory cell 10, a write word line WWL, a read word line RWL, a write bit line WBL, a read bit line RBL, and a source line SL.

Figure 30B:
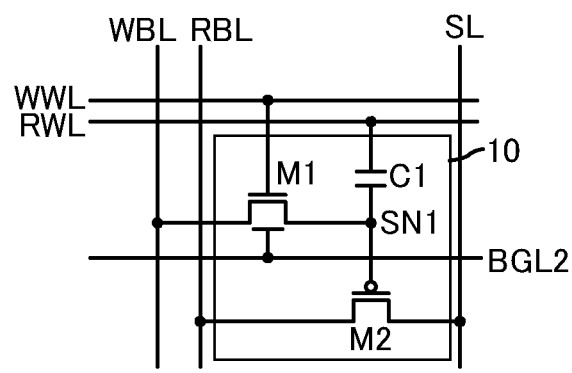

As shown in FIG. 30(B), the memory cell 10 is a 2T1C (two transistors and one capacitor) gain cell and includes a node SN1, transistors M1 and M2, and a capacitor C1. The transistor M1 is an OS transistor having aback gate and serving as a write transistor. The back gate of the transistor M1 is electrically connected to a wiring BGL2 that supplies a voltage VBG2. The transistor M2 is a p-channel Si transistor serving as a read transistor. The capacitor C1 is a storage capacitor that holds the voltage of the node SN1.

The voltages VDDD and VSSS represent data "1" and "0", respectively. Note that high-level voltages of the write word lines WWL and RWL are VDHW and VDHR, respectively.

Figure 31A:
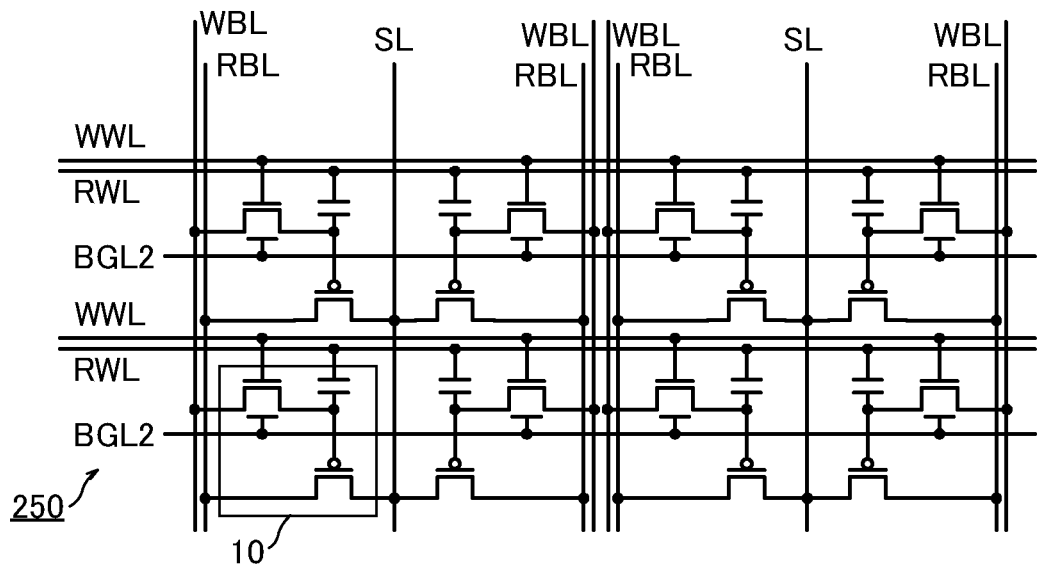
FIG. 31 A circuit diagram showing a structure example of a memory cell array and circuit diagrams each showing a structure example of a memory cell.

FIG. 31(A) shows a structure example of the memory cell array 250. In the memory cell array 250 shown in FIG. 31(A), one source line is supplied to the adjacent two rows.

The memory cell 10 does not have a limit on the number of times of rewriting in principle, can perform data rewriting with low energy, and does not consume power in holding data. Since the transistor M1 is an OS transistor with an extremely low off-state current, the memory cell 10 can hold data for a longtime. Thus, a cache memory device including the NOSRAM 240 can be a low-power nonvolatile memory device.

Figure 31B:
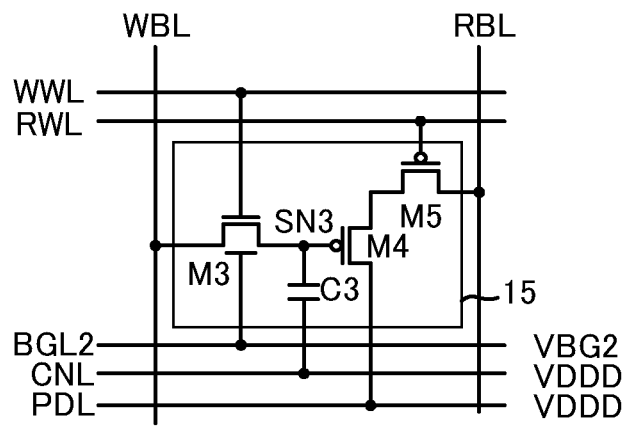
Figure 31C:
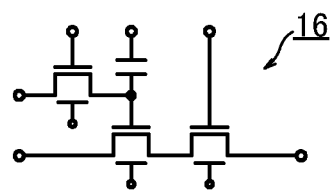

The circuit structure of the memory cell 10 is not limited to the circuit structure shown in FIG. 30(B). For example, the read transistor M2 may be an OS transistor having a back gate or an n-channel Si transistor. Alternatively, the memory cell 10 may be a 3T gain cell. For example, FIG. 31(B) and FIG. 31(C) show examples of a 3T gain cell. A memory cell 15 shown in FIG. 31(B) includes transistors M3 to M5, a capacitor C3, and anode SN3. The transistors M3 to M5 are a write transistor, a read transistor, and a selection transistor, respectively. The transistor M3 is an OS transistor having a back gate, and the transistors M4 and M5 are p-channel Si transistors. The transistors M4 and M5 may be n-channel Si transistors or OS transistors each having a back gate. In a memory cell 16 shown in FIG. 31(C), three transistors are OS transistors each having a back gate.

The node SN3 is a holding node. One electrode of the capacitor C3 is electrically connected to the node SN3 and has a function of holding the voltage of the node SN3. The other electrode of the capacitor C3 is electrically connected to a wiring CNL. The capacitor C3 may be omitted intentionally, and the storage capacitor may be formed using gate capacitance of the transistor M4, or the like. A wiring PDL is an alternative to the source line SL and a fixed voltage (e.g., the voltage VDDD) is input. The voltage VDDD is also input to the wiring CNL, for example.

The control circuit 251 has a function of controlling the entire operation of the NOSRAM 240. For example, the control circuit 251 performs logical operation of the signals CE and WE and determines whether access from the outside is write access or read access.

The row circuit 252 has a function of selecting the write word line WWL and the read word line RWL in the row specified by the address signal. The column circuit 253 has a function of writing data to the write bit line WBL in the column specified by the address signal and a function of reading data (Data) from the read bit line RBL in that column.

This embodiment can be implemented in appropriate combination with any of the other embodiments.

Embodiment 5

In this embodiment, examples of vehicles each including the power storage system of one embodiment of the present invention are described. Examples of vehicles include an automobile, a motorcycle, and a bicycle.

The use of power storage systems in vehicles enables production of next-generation clean energy vehicles such as hybrid electric vehicles (HEVs), electric vehicles (EVs), and plug-in hybrid electric vehicles (PHEVs).

Figure 32A:
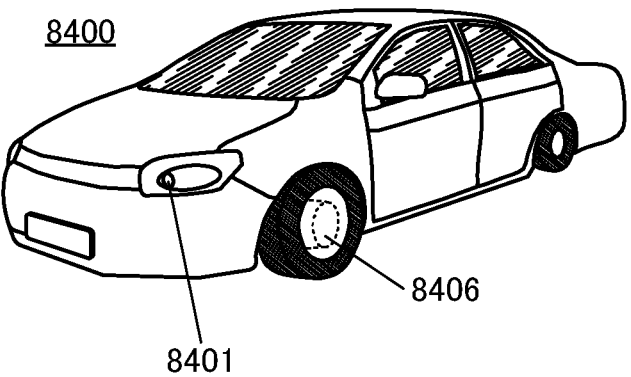
FIG. 32 Examples of vehicles.

FIG. 32 shows examples of vehicles using the power storage system of one embodiment of the present invention. An automobile 8400 shown in FIG. 32(A) is an electric vehicle that runs on an electric motor as a power source. Alternatively, the automobile 8400 is a hybrid electric vehicle capable of driving using either an electric motor or an engine as a power source, as appropriate. The use of one embodiment of the present invention can achieve a high-mileage vehicle. The automobile 8400 includes a power storage system. The power storage system is used not only for driving an electric motor 8406, but also for supplying electric power to a light-emitting device such as a headlight 8401 or a room light (not illustrated).

The power storage system can supply electric power to a display device of a speedometer, a tachometer, or the like included in the automobile 8400. Furthermore, the power storage system can supply electric power to a navigation system or the like included in the automobile 8400. The power storage system of one embodiment of the present invention can be used for both the automobile 8400 operated by a driver and the automobile 8400 that can automatically run without operation by a driver (what is called an autonomous car or a driverless car).

Figure 32B:
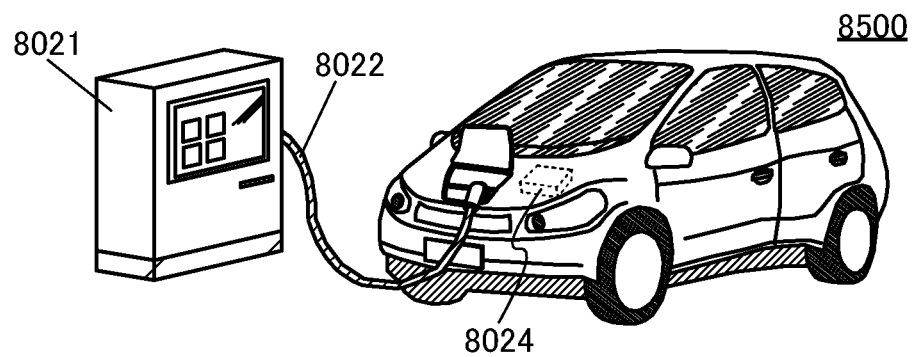

An automobile 8500 shown in FIG. 32(B) can be charged when the power storage system included in the automobile 8500 is supplied with electric power from external charging equipment by a plug-in system, a contactless power feeding system, or the like. FIG. 32(B) shows the state in which a power storage system 8024 included in the automobile 8500 is charged with a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. With the use of a plug-in technique, the power storage system 8024 included in the automobile 8500 can be charged by being supplied with electric power from the outside, for example. The charging can be performed by converting AC electric power into DC electric power through a converter such as an AC-DC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven. In addition, the contactless power feeding system may be utilized to perform transmission and reception of electric power between vehicles. A solar cell may be provided in the exterior of the vehicle to charge the power storage system when the vehicle stops or moves. To supply electric power in such a contactless manner, an electromagnetic induction method or a magnetic resonance method can be used.

Figure 32C:
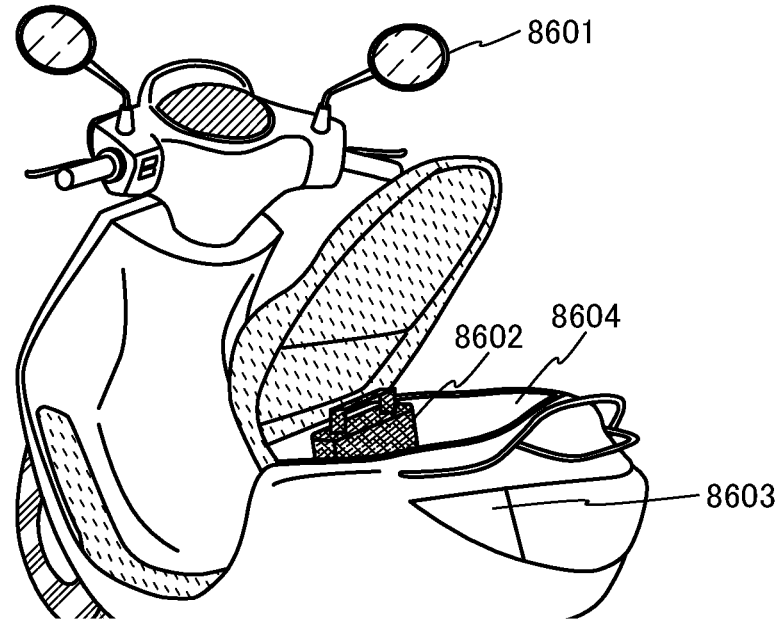

FIG. 32(C) is an example of a motorcycle using the power storage system of one embodiment of the present invention. A motor scooter 8600 shown in FIG. 32(C) includes a power storage system 8602, side mirrors 8601, and direction indicators 8603. The power storage system 8602 can supply electricity to the direction indicators 8603.

In the motor scooter 8600 shown in FIG. 32(C), the power storage system 8602 can be stored in an under-seat storage unit 8604. The power storage system 8602 can be stored in the under-seat storage unit 8604 even with a small size.

Figure 33A:
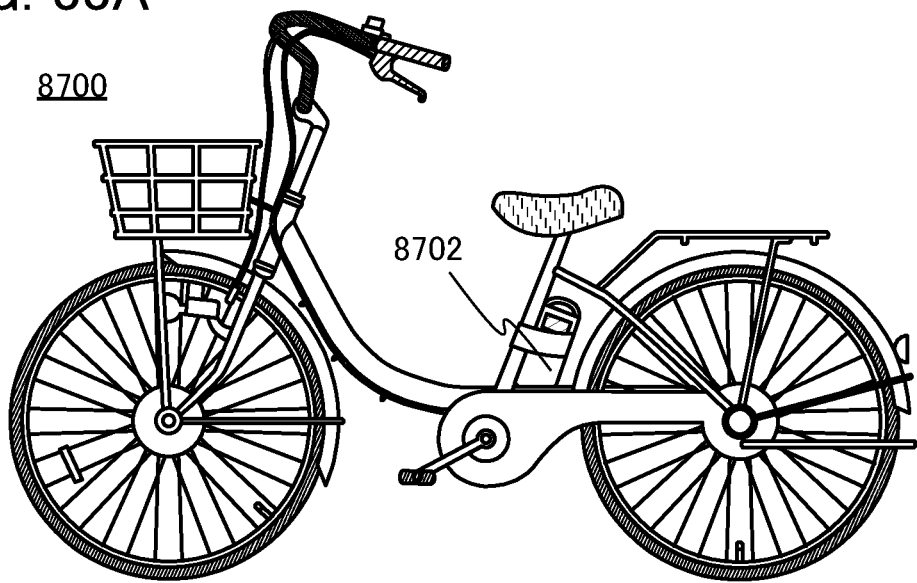
FIG. 33 An example of a vehicle.

FIG. 33(A) is an example of an electric bicycle using the power storage system of one embodiment of the present invention. The power storage system of one embodiment of the present invention can be used for an electric bicycle 8700 shown in FIG. 33(A). The power storage system of one embodiment of the present invention includes a plurality of storage batteries, a protective circuit, and a neural network, for example.

Figure 33B:
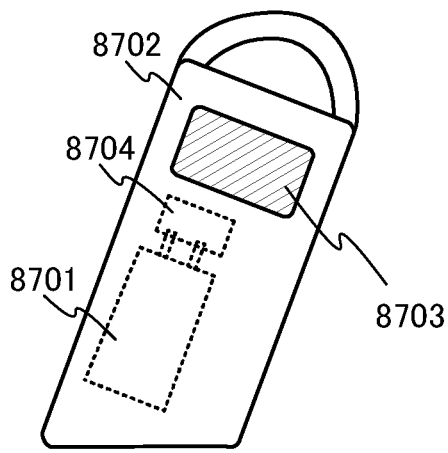

The electric bicycle 8700 includes a power storage system 8702. The power storage system 8702 can supply electricity to a motor that assists a rider. The power storage system 8702 is portable, and FIG. 33(B) shows the state in which the power storage system 8702 is detached from the bicycle. The power storage system 8702 incorporates a plurality of storage batteries 8701 included in the power storage system of one embodiment of the present invention, and the remaining battery level and the like can be displayed on a display portion 8703. The power storage system 8702 also includes a control system 8704 of one embodiment of the present invention. The control system 8704 is electrically connected to a positive electrode and a negative electrode of the storage battery 8701. The control system described in the above embodiment can be used as the control system 8704.

This embodiment can be combined with the description of the other embodiments as appropriate.

Embodiment 6

In this embodiment, examples of electronic devices each including the power storage system described in the above embodiments are described.

Figure 34A:
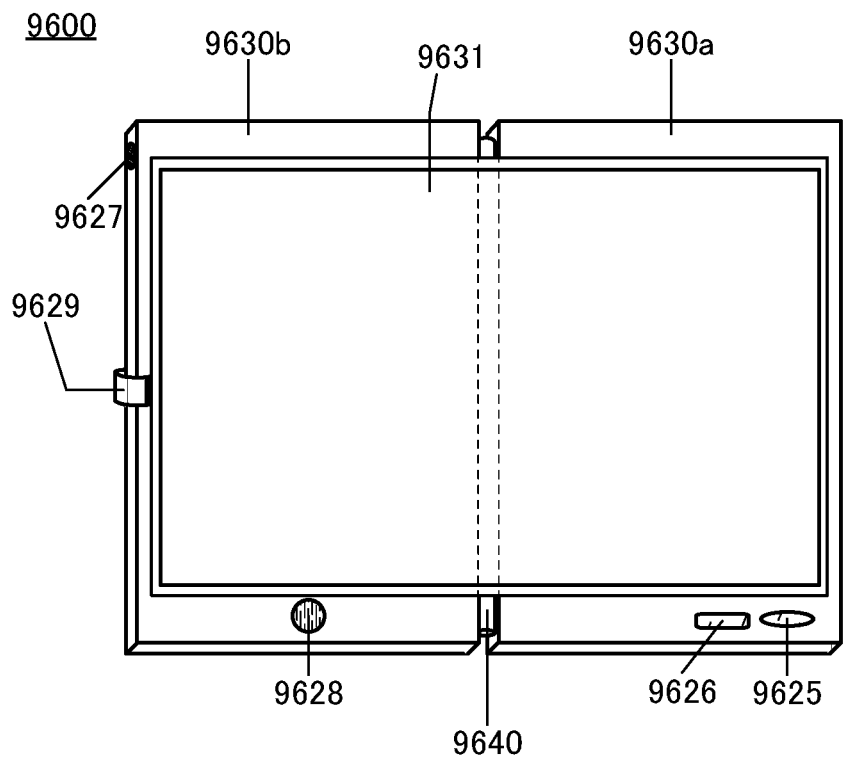
FIG. 34 Examples of an electronic device.
Figure 34B:
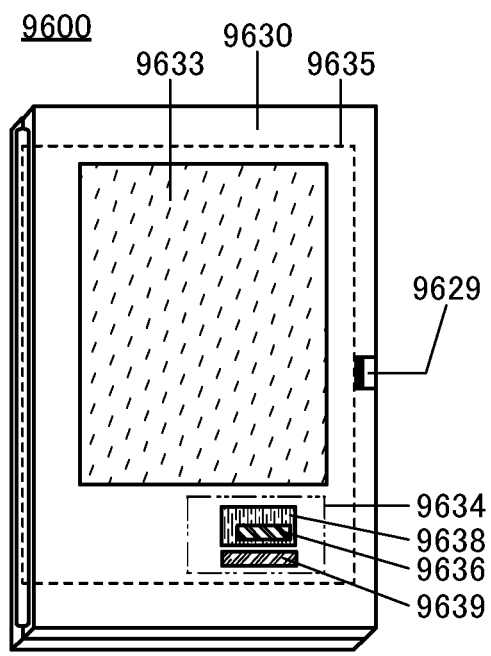

FIG. 34(A) and FIG. 34(B) show an example of a double-foldable tablet terminal. A tablet terminal 9600 shown in FIG. 34(A) and FIG. 34(B) includes a housing 9630a, a housing 9630b, a movable portion 9640 connecting the housing 9630a and the housing 9630b, a display portion 9631, a display mode changing switch 9626, a power switch 9627, a power saving mode changing switch 9625, a fastener 9629, and an operation switch 9628. The use of a flexible panel for the display portion 9631 achieves a tablet terminal with a larger display portion. FIG. 34(A) shows the tablet terminal 9600 that is opened, and FIG. 34(B) shows the tablet terminal 9600 that is closed.

The tablet terminal 9600 includes a power storage unit 9635 inside the housing 9630a and the housing 9630b. The power storage unit 9635 is provided across the housing 9630a and the housing 9630b, passing through the movable portion 9640.

Part of the display portion 9631 can be a touch panel region and data can be input when a displayed operation key is touched. When a position where a keyboard display switching button is displayed on the touch panel is touched with a finger, a stylus, or the like, keyboard buttons can be displayed on the display portion 9631.

The display mode changing switch 9626 can switch the display between a portrait mode and a landscape mode, and between monochrome display and color display, for example. The power saving mode changing switch 9625 can control display luminance in accordance with the amount of external light in use, which is measured with an optical sensor incorporated in the tablet terminal 900. Another detection device including a sensor for detecting inclination, such as a gyroscope sensor or an acceleration sensor, may be incorporated in the tablet terminal, in addition to the optical sensor.

The tablet terminal 9600 in FIG. 34(B) is in a closed state and includes a housing 9630, a solar cell 9633, and the power storage system of one embodiment of the present invention. The power storage system includes a control system 9634 and the power storage unit 9635. The control system 9634 includes a protective circuit 9639 and a charging and discharging control circuit 9638 including a DC-DC converter 9636. The control system described in the above embodiment can be used as the control system 9634. The charging and discharging control circuit 9638 includes the control circuit 134 described in the above embodiment, for example.

The tablet terminal 9600 can be folded in half and thus can be folded such that the housing 9630a and the housing 9630b overlap with each other when not in use. The display portion 9631 can be protected owing to the folding, which increases the durability of the tablet terminal 9600.

The tablet terminal shown in FIG. 34(A) and FIG. 34(B) can also have a function of displaying various kinds of data (a still image, a moving image, a text image, and the like), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, can supply electric power to a touch panel, a display portion, an image signal processor, and the like. Note that the solar cell 9633 can be provided on one or both surfaces of the housing 9630 and the power storage unit 9635 can be charged efficiently.

Figure 34C:
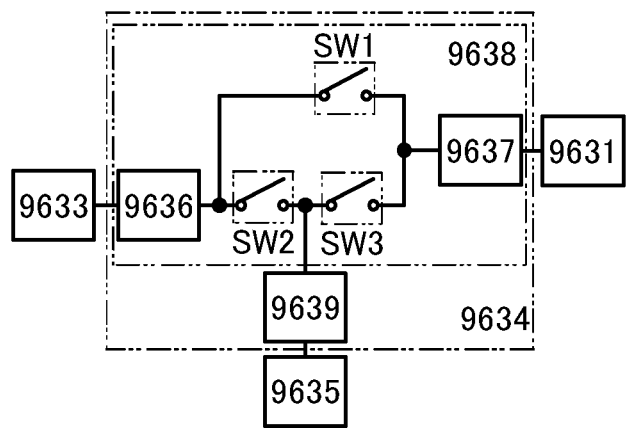

The structure and operation of the control system 9634 shown in FIG. 34(B) will be described with reference to a block diagram in FIG. 34(C). FIG. 34(C) shows the solar cell 9633, the power storage unit 9635, the DC-DC converter 9636, a converter 9637, switches SW1 to SW3, and the display portion 9631, the DC-DC converter 9636, the converter 9637, and the switches SW1 to SW3 correspond to the charging and discharging control circuit 9638 shown in FIG. 34(B), and the charging and discharging control circuit 9638 and the protective circuit 9639 correspond to the control system 9634.

First, an example of the operation in the case where power is generated by the solar cell 9633 using external light is described. The voltage of electric power generated by the solar cell 9633 is raised or lowered by the DC-DC converter 9636 to a voltage for charging the power storage unit 9635. When the electric power from the solar cell 9633 is used for the operation of the display portion 9631, the switch SW1 is turned on and the voltage of the electric power is raised or lowered by the converter 9637 to a voltage needed for the display portion 9631. When display on the display portion 9631 is not performed, SW is turned off and SW2 is turned on, so that the power storage unit 9635 can be charged.

Note that the solar cell 9633 is described as an example of a power generation means; however, one embodiment of the present invention is not limited to this example. The power storage unit 9635 may be charged using another power generation means such as a piezoelectric element or a thermoelectric conversion element (Peltier element). For example, the power storage unit 9635 may be charged with a non-contact power transmission module that transmits and receives electric power wirelessly (without contact), or with a combination of other charging means.

Figure 35:
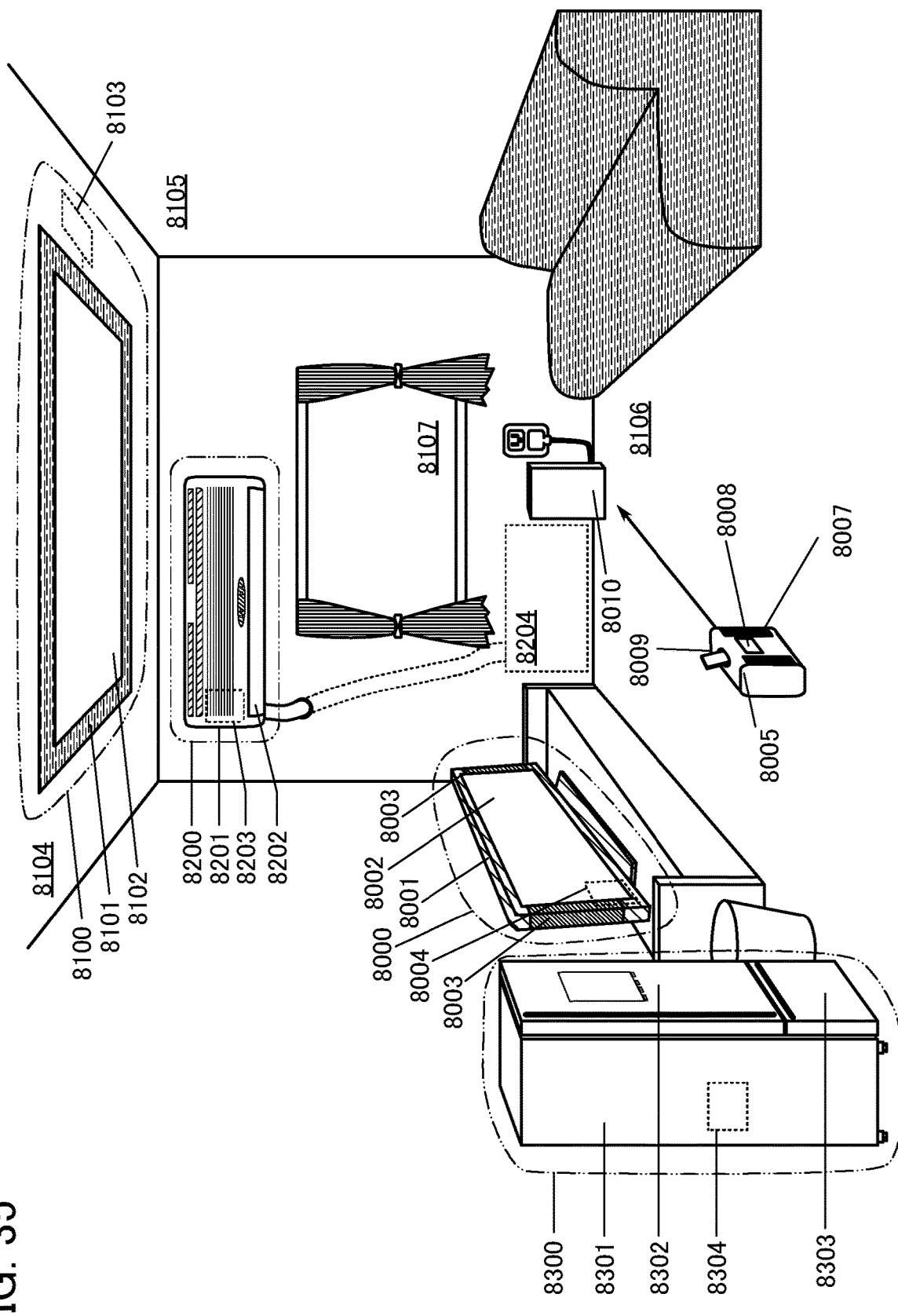
FIG. 35 Application examples of a power storage system.

FIG. 35 shows other examples of electronic devices. In FIG. 35, a display device 8000 is an example of an electronic device including the power storage system of one embodiment of the present invention. Specifically, the display device 8000 corresponds to a display device for TV broadcast reception and includes a housing 8001, a display portion 8002, speaker portions 8003, a secondary battery 8004, and the like. The power storage system of one embodiment of the present invention is provided in the housing 8001. The display device 8000 can receive electric power from a commercial power source, or use electric power stored in the secondary battery 8004.

A semiconductor display device such as a liquid crystal display device, a light-emitting device in which a light-emitting element such as an organic EL element is provided in each pixel, an electrophoretic display device, a DMD (Digital Micromirror Device), a PDP (Plasma Display Panel), or an FED (Field Emission Display) can be used for the display portion 8002.

An audio input device 8005 also uses a secondary battery. The audio input device 8005 includes the power storage system described in the above embodiments. The audio input device 8005 includes a microphone and a plurality of sensors (an optical sensor, a temperature sensor, a humidity sensor, a pressure sensor, an illuminance sensor, a motion sensor, and the like), in addition to wireless communication elements. In accordance with an instruction spoken by a user, another device can be operated; for example, powering of the display device 8000 can be controlled or the amount of light of a lighting device 8100 can be controlled. The audio input device 8005 is capable of audio operation of a peripheral device and replaces a manual remote controller.

The audio input device 8005 includes a wheel or a mechanical transfer means and is configured to be capable of, while listening to an instruction precisely with the incorporated microphone by moving in the direction in which speaking by a user can be heard, displaying the content on a display portion 8008 or performing a touch input operation on the display portion 8008.

The audio input device 8005 can also function as a charging doc of a portable information terminal 8009 such as a smartphone. Electric power can be transmitted and received with a wire or wirelessly between the portable information terminal 8009 and the audio input device 8005. The portable information terminal 8009 does not particularly need to be carried indoors, and a load on the secondary battery and degradation thereof are desirably avoided while a necessary capacity is ensured; thus, control or maintenance of the secondary battery or the like is desirably performed by the audio input device 8005. Since the audio input device 8005 includes a speaker 8007 and the microphone, hands-free conversation is possible even while the portable information terminal 8009 is charged. When the capacity of the secondary battery of the audio input device 8005 decreases, the audio input device 8005 moves in the direction indicated by the arrow and is charged by wireless charging from a charging module 8010 connected to an external power source.

The audio input device 8005 may be put on a stand. The audio input device 8005 may be provided with a wheel or a mechanical transfer means to move to a desired position. Alternatively, a stand or a wheel is not provided and the audio input device 8005 may be fixed to a desired position, for example, on the floor.

Note that the display device includes, in its category, all of information display devices for personal computers, advertisement displays, and the like other than TV broadcast reception.

In FIG. 35, the installation lighting device 8100 is an example of an electronic device using a secondary battery 8103 controlled by a microprocessor controlling charging (including an APS). Specifically, the lighting device 8100 includes a housing 8101, a light source 8102, the secondary battery 8103, and the like. Although FIG. 35 shows the case where the secondary battery 8103 is provided in a roof 8104 on which the housing 8101 and the light source 8102 are installed, the secondary battery 8103 may be provided in the housing 8101. The lighting device 8100 can receive electric power from a commercial power source, or use electric power stored in the secondary battery 8103.

Note that although FIG. 35 shows, as an example, the installation lighting device 8100 provided on the roof 8104, the secondary battery can be used in an installation lighting device provided on, for example, a sidewall 8105, a floor 8106, a window 8107, or the like other than the roof 8104, or can be used in a tabletop lighting device or the like.

As the light source 8102, an artificial light source that emits light artificially by using electric power can be used. Specifically, an incandescent lamp, a discharge lamp such as a fluorescent lamp, and a light-emitting element such as an LED or an organic EL element are given as examples of the artificial light source.

In FIG. 35, an air conditioner including an indoor unit 8200 and an outdoor unit 8204 is an example of an electronic device using a secondary battery 8203. Specifically, the indoor unit 8200 includes a housing 8201, an air outlet 8202, the secondary battery 8203, and the like. Although FIG. 35 shows the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can receive electric power from a commercial power source, or use electric power stored in the secondary battery 8203.

In FIG. 35, an electric refrigerator-freezer 8300 is an example of an electronic device using a secondary battery 8304. Specifically, the electric refrigerator-freezer 8300 includes a housing 8301, a refrigerator door 8302, a freezer door 8303, the secondary battery 8304, and the like. The secondary battery 8304 is provided in the housing 8301 in FIG. 35. The electric refrigerator-freezer 8300 can receive electric power from a commercial power source, or use electric power stored in the secondary battery 8304.

In addition, electric power is stored in the secondary battery in a time period when electronic devices are not used, particularly when the proportion of the amount of electric power that is actually used to the total amount of electric power that can be supplied from a commercial power source (such a proportion is referred to as a usage rate of electric power) is low, whereby an increase in the usage rate of electric power can be reduced in a time period when the electronic devices are used. For example, in the case of the electric refrigerator-freezer 8300, electric power is stored in the secondary battery 8304 in night time when the temperature is low and the refrigerator door 8302 and the freezer door 8303 are not opened or closed. On the other hand, in daytime when the temperature is high and the refrigerator door 8302 and the freezer door 8303 are opened and closed, the secondary battery 8304 is used as an auxiliary power source; thus, the usage rate of electric power in daytime can be reduced.

The secondary battery can be provided in a variety of electronic devices as well as the above-described electronic devices. According to one embodiment of the present invention, the secondary battery can have excellent cycle performance. Thus, the microprocessor controlling charging (including an APS) of one embodiment of the present invention is provided in the electronic device described in this embodiment, whereby an electronic device with a longer lifetime can be obtained. This embodiment can be implemented inappropriate combination with the other embodiments.

FIGS. 36(A) to 36(E) show examples of electronic devices including the power storage system of one embodiment of the present invention. Examples of electronic devices including the power storage system of one embodiment of the present invention include television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines.

Figure 36A:
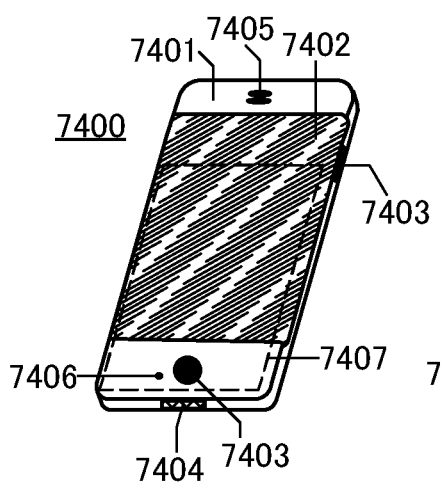
FIG. 36 Examples of electronic devices and application examples of a storage battery.

FIG. 36(A) shows an example of a mobile phone. A mobile phone 7400 is provided with operation buttons 7403, an external connection port 7404, a speaker 7405, a microphone 7406, and the like in addition to a display portion 7402 incorporated in a housing 7401. The mobile phone 7400 includes the power storage system of one embodiment of the present invention. The power storage system of one embodiment of the present invention includes, for example, a storage battery 7407 and the control system described in the above embodiment, and the control system preferably includes a protective circuit, a control circuit, a neural network, and the like.

Figure 36B:
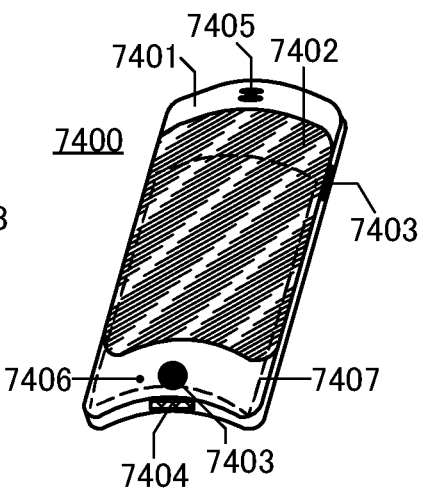
Figure 36C:
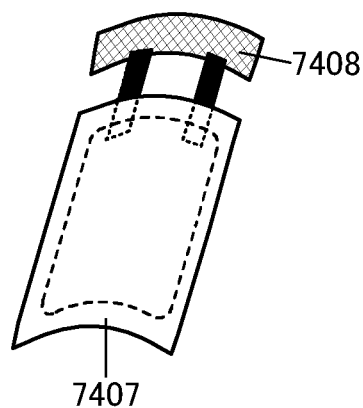

FIG. 36(B) shows the mobile phone 7400 that is bent. When the whole mobile phone 7400 is bent by external force, the storage battery 7407 provided therein may also be bent. In such a case, a flexible storage battery is preferably used as the storage battery 7407. FIG. 36(C) shows the flexible storage battery 7407 that is bent. A control system 7408 is electrically connected to the storage battery 7407. The control system described in the above embodiment can be used as the control system 7408.

A flexible storage battery can also be incorporated along a curved inside/outside wall surface of a house or a building or a curved interior/exterior surface of an automobile.

Figure 36D:
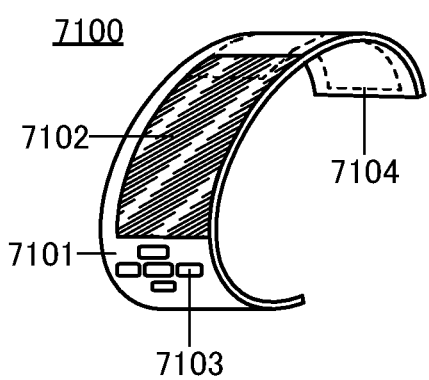

FIG. 36(D) shows an example of a bangle-type display device. A portable display device 7100 includes a housing 7101, a display portion 7102, operation buttons 7103, and the power storage system of one embodiment of the present invention. The power storage system of one embodiment of the present invention includes, for example, a storage battery 7104 and the control system described in the above embodiment, and the control system preferably includes a protective circuit, a control circuit, a neural network, and the like.

Figure 36E:
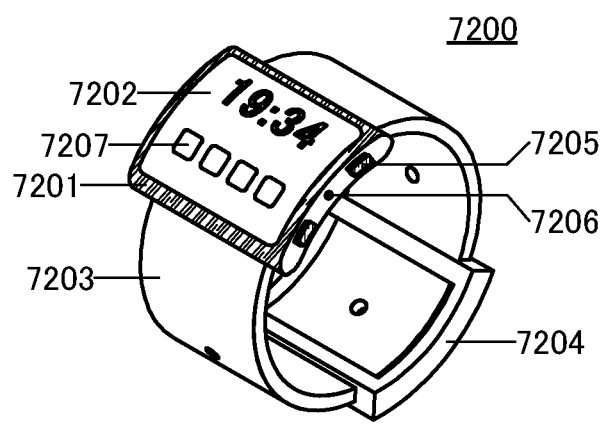

FIG. 36(E) shows an example of a watch-type portable information terminal. A portable information terminal 7200 includes a housing 7201, a display portion 7202, a band 7203, a buckle 7204, an operation button 7205, an input/output terminal 7206, and the like.

The portable information terminal 7200 is capable of executing a variety of applications such as mobile phone calls, e-mailing, viewing and editing texts, music reproduction, Internet communication, and computer games.

The display surface of the display portion 7202 is curved, and images can be displayed on the curved display surface. The display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operation system incorporated in the portable information terminal 7200.

The portable information terminal 7200 can employ near field communication based on an existing communication standard. For example, mutual communication between the portable information terminal and a headset capable of wireless communication can be performed, and thus hands-free calling is possible.

The portable information terminal 7200 includes the input/output terminal 7206, and data can be directly transmitted to and received from another information terminal via a connector. In addition, charging via the input/output terminal 7206 is possible. The charging operation may be performed by wireless power feeding without using the input/output terminal 7206.

The portable information terminal 7200 includes the power storage system of one embodiment of the present invention. The power storage system includes, for example, a storage battery and the control system described in the above embodiment, and the control system preferably includes a protective circuit, a control circuit, a neural network, and the like.

The portable information terminal 7200 preferably includes a sensor. As the sensor, for example, a human body sensor such as a fingerprint sensor, a pulse sensor, or a temperature sensor, a touch sensor, a pressure sensor, an acceleration sensor, or the like is preferably mounted.

This embodiment can be combined with the description of the other embodiments as appropriate.

REFERENCE NUMERALS

IN1: signal, OUT1: signal, S1: control signal, 101: sample-and-hold circuit, 112: transistor, 113: capacitor, 114: buffer circuit, 130: power storage system. 131: control system, 131a: control system, 132: memory, 134: control circuit, 135: storage battery, 135_1: storage battery, 135_2: storage battery, 135_m: storage battery. 137: protective circuit, 147: transistor, 148: transistor, 171: circuit, 174: sensor element, 174_1: sensor element, 174_2: sensor element, 174_m: sensor element, 176: fuse, 180: circuit. 181: sensor chip, 182: circuit, 182_1: circuit, 182_2: circuit, 182_m: circuit, 183: antenna, 183_1: antenna, 183_2: antenna, 183_m: antenna, 185: antenna, 186: circuit. 190: circuit.

The invention claimed is:

1. A power storage system comprising:
a storage battery, a neural network, and a sensor element,
wherein the neural network comprises an input layer, an output layer, and one or a plurality of middle layers provided between the input layer and the output layer,
wherein the neural network is configured to perform an analog operation without analog/digital conversion,
wherein a value corresponding to a first signal output from the sensor element is supplied to the input layer,
wherein the first signal is an analog signal,
wherein the storage battery comprises an exterior body covered with an insulating surface, and
wherein the sensor element comprises a strain sensor and is configured to sense expansion of the exterior body due to gas generation in the storage battery.

2. A power storage system comprising:
a storage battery, a neural network, a first circuit, and a sensor element,
wherein the neural network comprises an input layer, an output layer, and one or a plurality of middle layers provided between the input layer and the output layer,
wherein a first signal output from the sensor element is supplied to the first circuit,
wherein the first signal is an analog signal,
wherein the first circuit is configured to convert the first signal into a digital signal and supply the converted digital signal to the input layer,
wherein the sensor element comprises a region in contact with a surface of the storage battery,
wherein the sensor element is configured to measure one or both of strain and temperature, and
wherein the sensor element starts sensing in response to an analysis result of a change in a current value of the storage battery over time by the neural network.

3. A power storage system comprising:
a storage battery, a neural network, a first circuit, a second circuit, and a sensor element,
wherein the neural network comprises an input layer, an output layer, and one or a plurality of middle layers provided between the input layer and the output layer,
wherein a first signal output from the sensor element is supplied to the first circuit,
wherein the first signal is an analog signal,
wherein the first circuit is configured to convert the first signal into a second signal that is a digital signal,
wherein the first circuit is configured to modulate the second signal and supply the modulated signal to the second circuit through wireless communication,
wherein the second circuit is configured to demodulate the signal supplied from the first circuit through wireless communication and supply the signal to the input layer,
wherein the sensor element comprises a region in contact with a surface of the storage battery,
wherein the sensor element is configured to measure one or both of strain and temperature, and
wherein the sensor element starts sensing in response to an analysis result of a change in a current value of the storage battery over time by the neural network.

4. The power storage system according to claim 1, wherein the sensor element starts sensing in response to a charging voltage of the storage battery.

5. The power storage system according to claim 1, wherein the neural network comprises a first transistor, a capacitor, and a second transistor,
wherein one of a source and a drain of the first transistor is electrically connected to one electrode of the capacitor and a gate of the second transistor,
wherein a channel formation region of the first transistor comprises a metal oxide,
wherein the metal oxide comprises indium and an element M,
wherein the element M is one or more elements selected from aluminum, gallium, tin, boron, silicon, titanium, iron, nickel, germanium, yttrium, zirconium, molybdenum, lanthanum, cerium, neodymium, hafnium, tantalum, and tungsten, and
wherein a potential corresponding to an analog signal is held in the one of the source and the drain of the first transistor.

6. A vehicle comprising the power storage system according to claim 1.

7. An electronic device comprising the power storage system according to claim 1.

8. A power storage system comprising:
a storage battery, a neural network, a first circuit, a second circuit, and a sensor element,
wherein the neural network comprises an input layer, an output layer, and one or a plurality of middle layers provided between the input layer and the output layer,
wherein a measurement value of one or both of strain and temperature is supplied to the first circuit as a first signal,
wherein the first signal is an analog signal,
wherein the first circuit is configured to convert the first signal into a second signal that is a digital signal,
wherein the first circuit is configured to modulate the second signal and supply the modulated signal to the second circuit through wireless communication,
wherein the second circuit is configured to demodulate the signal supplied from the first circuit through wireless communication and supply the signal to the input layer,
wherein the sensor element comprises a region in contact with a surface of the storage battery,
wherein a corrected value of the signal supplied to the input layer is output from the output layer, and wherein the sensor element starts sensing in response to an analysis result of a change in a current value of the storage battery over time by the neural network.

9. The power storage system according to claim 2, wherein the sensor element starts sensing in response to a charging voltage of the storage battery.

10. The power storage system according to claim 2,
wherein the neural network comprises a first transistor, a capacitor, and a second transistor,
wherein one of a source and a drain of the first transistor is electrically connected to one electrode of the capacitor and a gate of the second transistor,
wherein a channel formation region of the first transistor comprises a metal oxide,
wherein the metal oxide comprises indium and an element M,
wherein the element M is one or more elements selected from aluminum, gallium, tin, boron, silicon, titanium, iron, nickel, germanium, yttrium, zirconium, molybdenum, lanthanum, cerium, neodymium, hafnium, tantalum, and tungsten, and
wherein a potential corresponding to an analog signal is held in the one of the source and the drain of the first transistor.

11. A vehicle comprising the power storage system according to claim 2.

12. An electronic device comprising the power storage system according to claim 2.

13. The power storage system according to claim 3,
wherein the sensor element starts sensing in response to a charging voltage of the storage battery.

14. The power storage system according to claim 3,
wherein the neural network comprises a first transistor, a capacitor, and a second transistor,
wherein one of a source and a drain of the first transistor is electrically connected to one electrode of the capacitor and a gate of the second transistor,
wherein a channel formation region of the first transistor comprises a metal oxide,
wherein the metal oxide comprises indium and an element M,
wherein the element M is one or more elements selected from aluminum, gallium, tin, boron, silicon, titanium, iron, nickel, germanium, yttrium, zirconium, molybdenum, lanthanum, cerium, neodymium, hafnium, tantalum, and tungsten, and
wherein a potential corresponding to an analog signal is held in the one of the source and the drain of the first transistor.

15. A vehicle comprising the power storage system according to claim 3.

16. An electronic device comprising the power storage system according to claim 3.

17. The power storage system according to claim 8, wherein a product-sum operation is performed with the neuron.

18. The power storage system according to claim 1, wherein the sensor element comprises a region in contact with a surface of the exterior body.

19. The power storage system according to claim 8, wherein the input layer, the output layer, and the middle layer each comprise at least one neuron.

* * * * *